United States Patent [19]

Yasuda

[11] Patent Number: 5,373,292

[45] Date of Patent: Dec. 13, 1994

[54] INTEGRATION TYPE D-A/A-D CONVERSION APPARATUS CAPABLE OF SHORTENING CONVERSION PROCESSING TIME

[75] Inventor: Akira Yasuda, Kawasaki, Japan

[73] Assignee: Kabushiki Kaisha Toshiba, Kawasaki, Japan

[21] Appl. No.: 98,939

[22] Filed: Jul. 29, 1993

[30] Foreign Application Priority Data

Jul. 29, 1992 [JP] Japan .................................. 4-201708

[51] Int. Cl.⁵ ........................ H03M 1/02; H03M 1/50; H03M 1/82
[52] U.S. Cl. .................................. 341/108; 341/166; 341/164; 341/152
[58] Field of Search ............... 341/108, 166, 167, 168, 341/169, 170, 164, 152

[56] References Cited

U.S. PATENT DOCUMENTS

| | | | |
|---|---|---|---|
| 4,999,632 | 3/1991 | Parks | 341/167 |
| 5,014,058 | 5/1991 | Horn | 341/166 |
| 5,059,981 | 10/1991 | Hauser | 341/164 |
| 5,128,676 | 7/1992 | Ordway | 341/167 |

*Primary Examiner*—Sharon D. Logan
*Attorney, Agent, or Firm*—Oblon, Spivak, McClelland, Maier, & Neustadt

[57] ABSTRACT

An integrating D-A/A-D converter includes a reference value generation circuit for generating at least one reference value relating to voltage or current, a control circuit for carrying out switching between a digital or analog input and the reference value every predetermined time to connect a switched one to thereby control an integral time, and an integration circuit for respectively integrating an analog value corresponding to the digital or analog input and the reference value switched in sequence every predetermined time and delivered through the control circuit to output an integral value for providing a digital or analog output. The control circuit includes a connection element for arbitrarily carrying out switching between the analog value corresponding to the digital or analog input and the reference value to deliver a switched one to the integration circuit, a plurality of clock supply circuits for generating and outputting a plurality of clock signals having periods per unit time which are different from each other and are such that the time length relationship therebetween is indicated by an arbitrary integer ratio, and a time control circuit for controlling the time during which the connection element connects the reference value or the analog value so that an integral value of the integration circuit becomes equal to a value varying with a minimum value being as a unit in dependency upon times corresponding to respective periods of the plurality of clock signals.

20 Claims, 39 Drawing Sheets

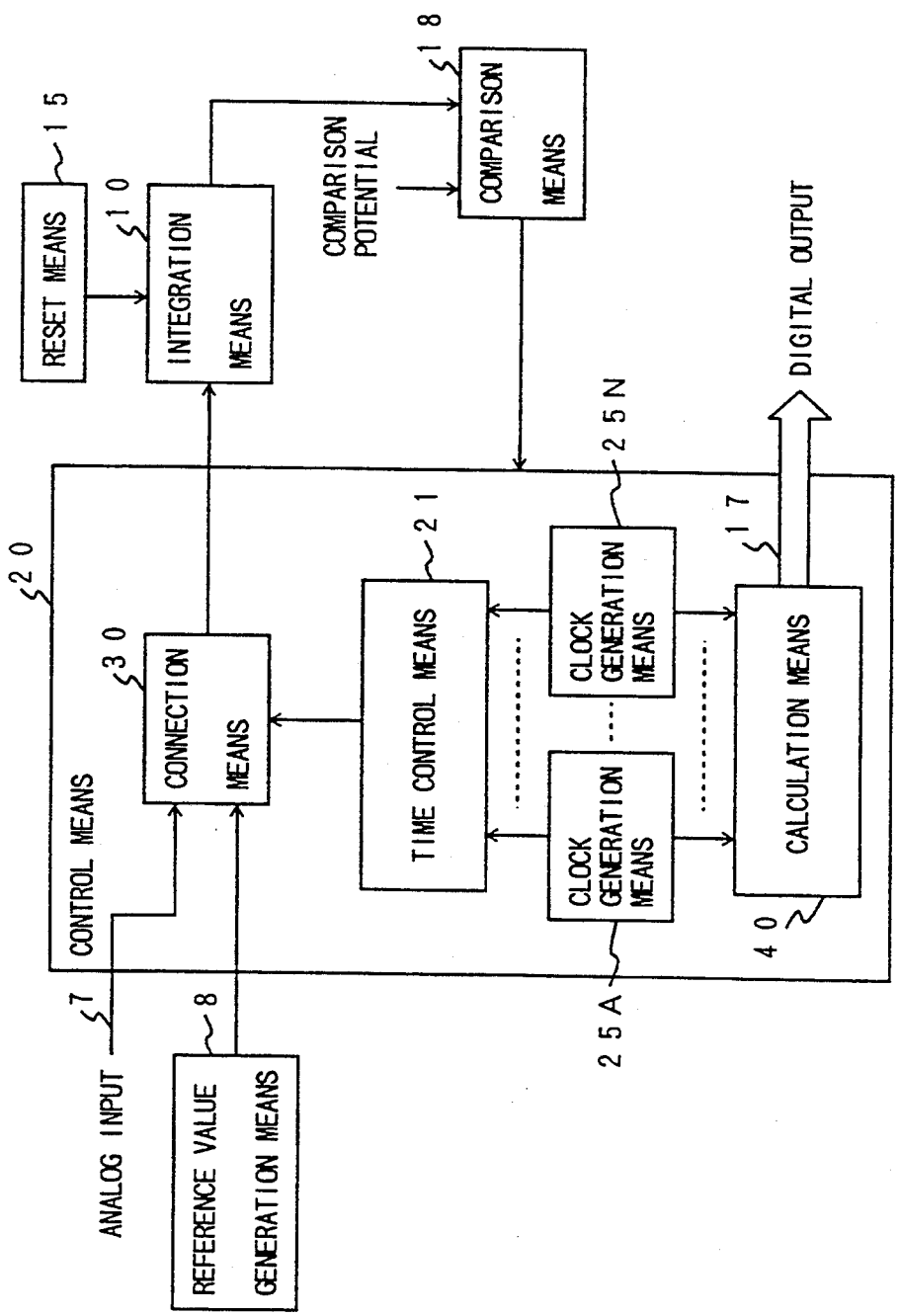
F I G. 9

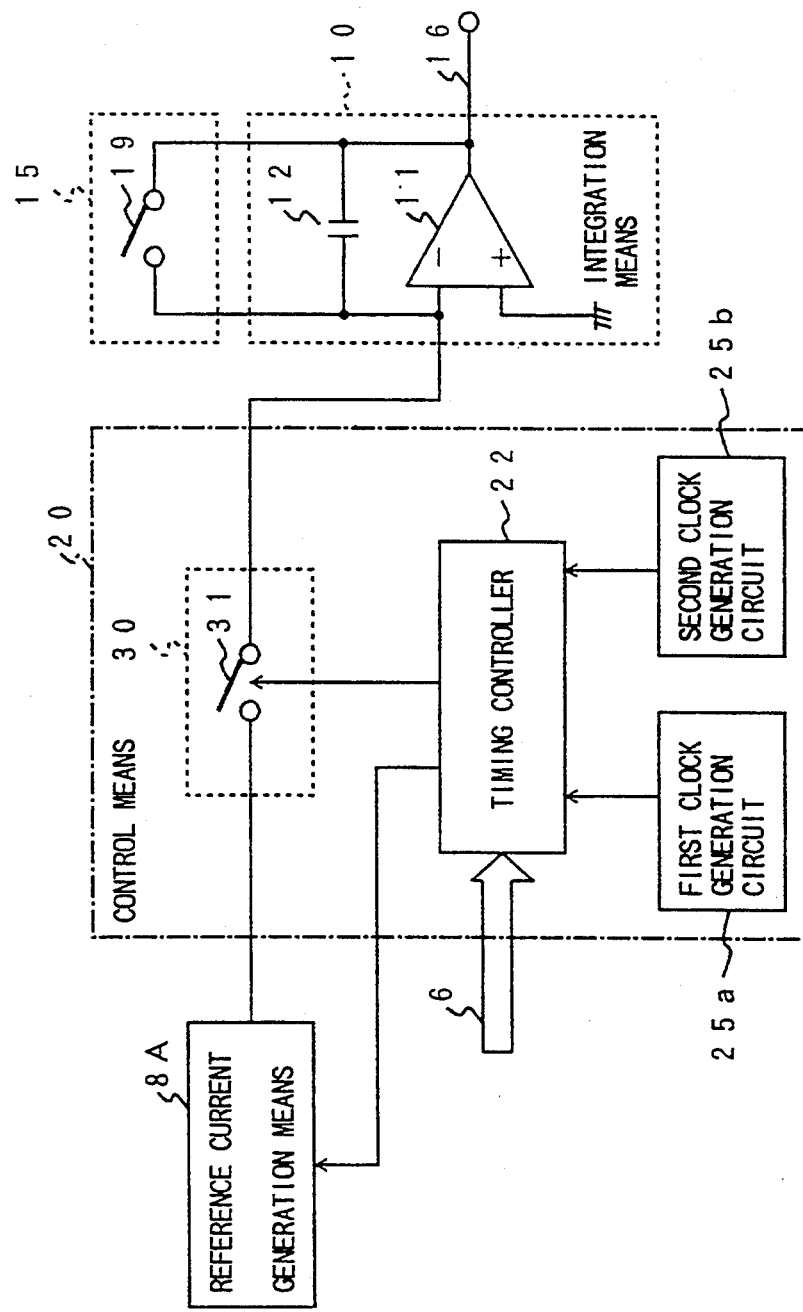
F I G. 11

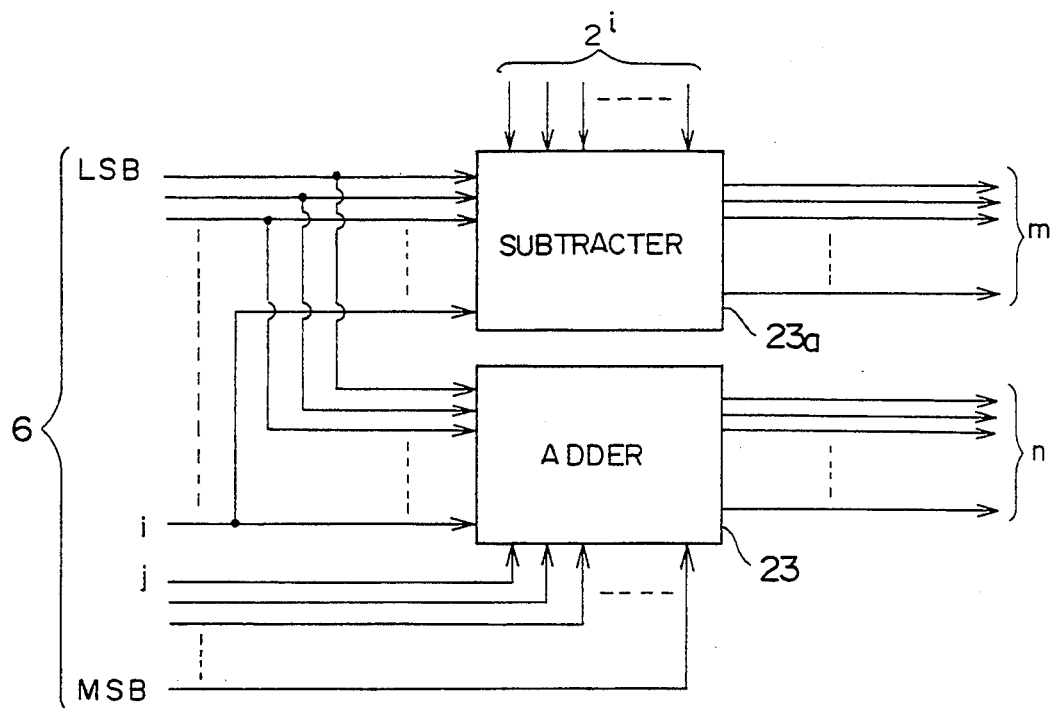
F I G. 22
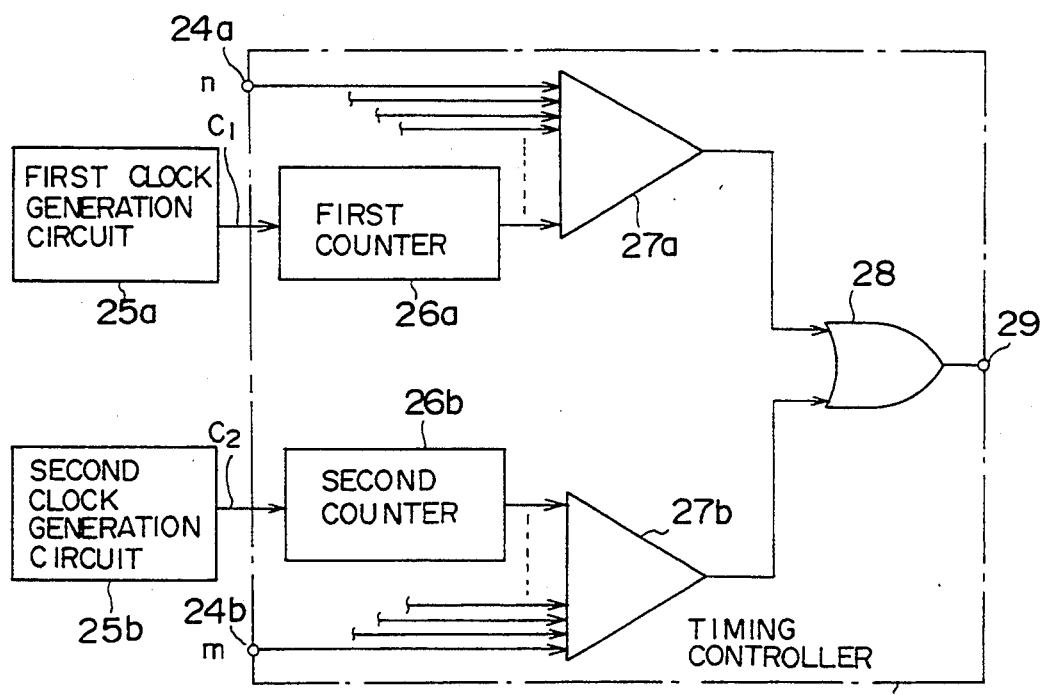
F I G. 23

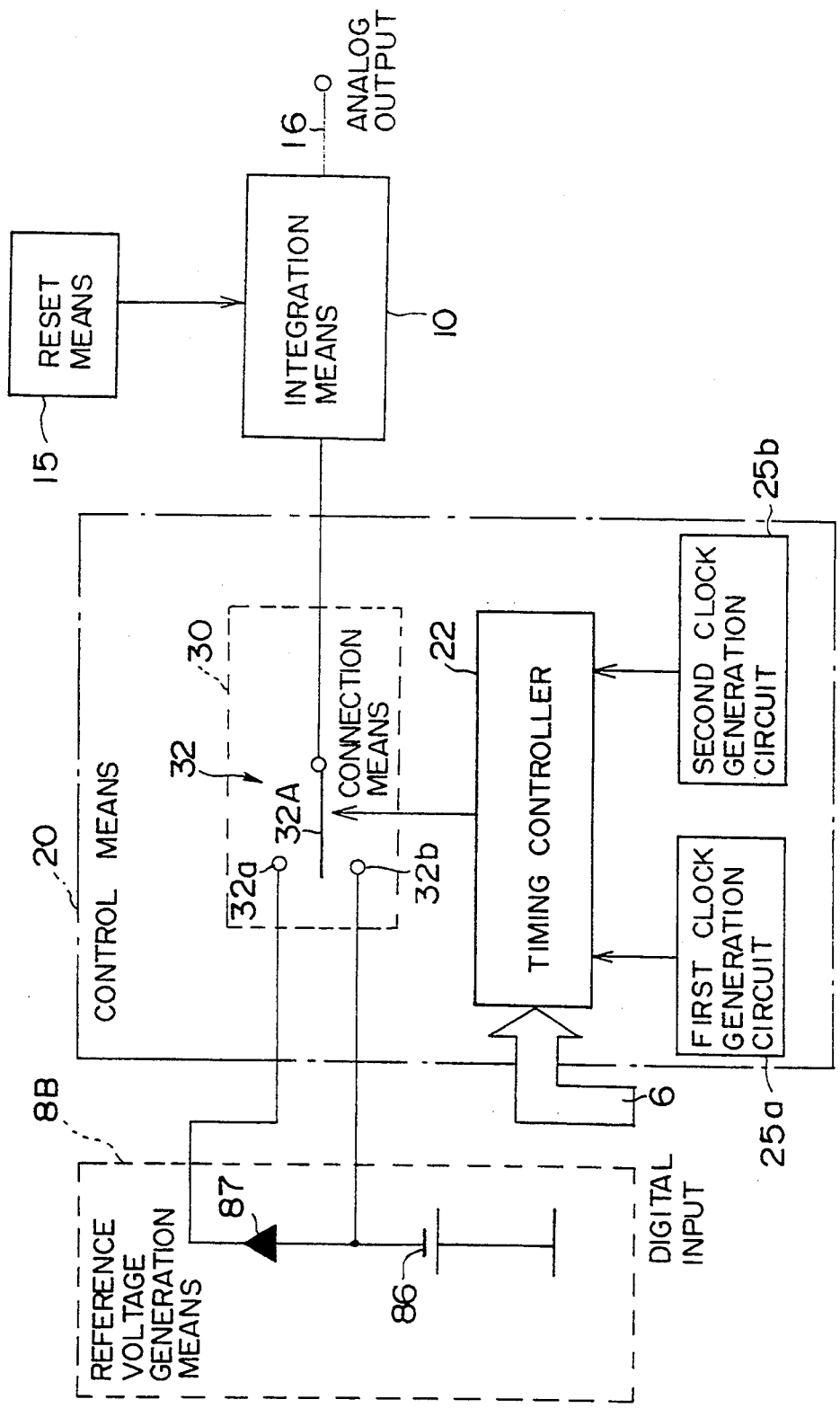
F I G. 26

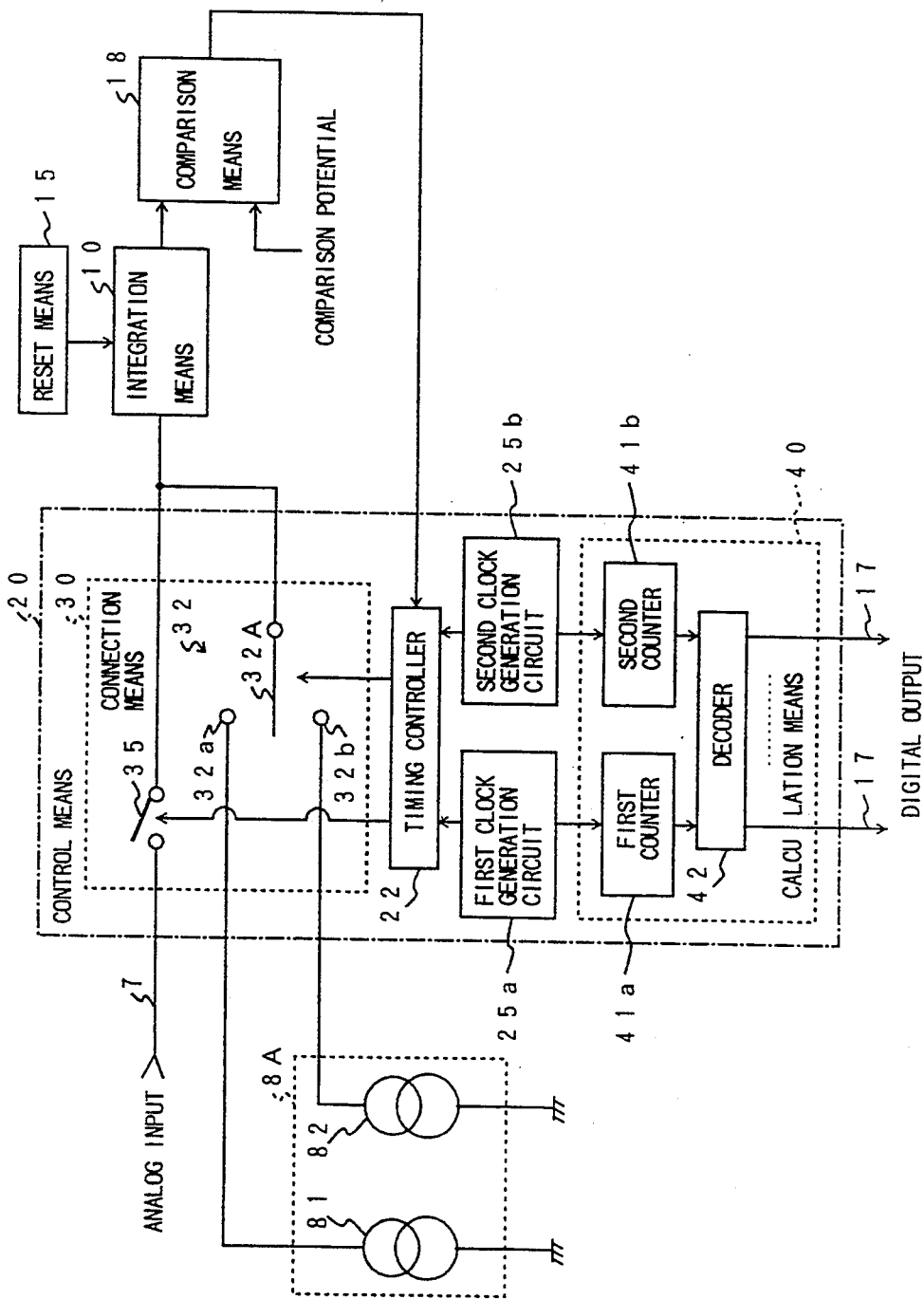
F I G. 32

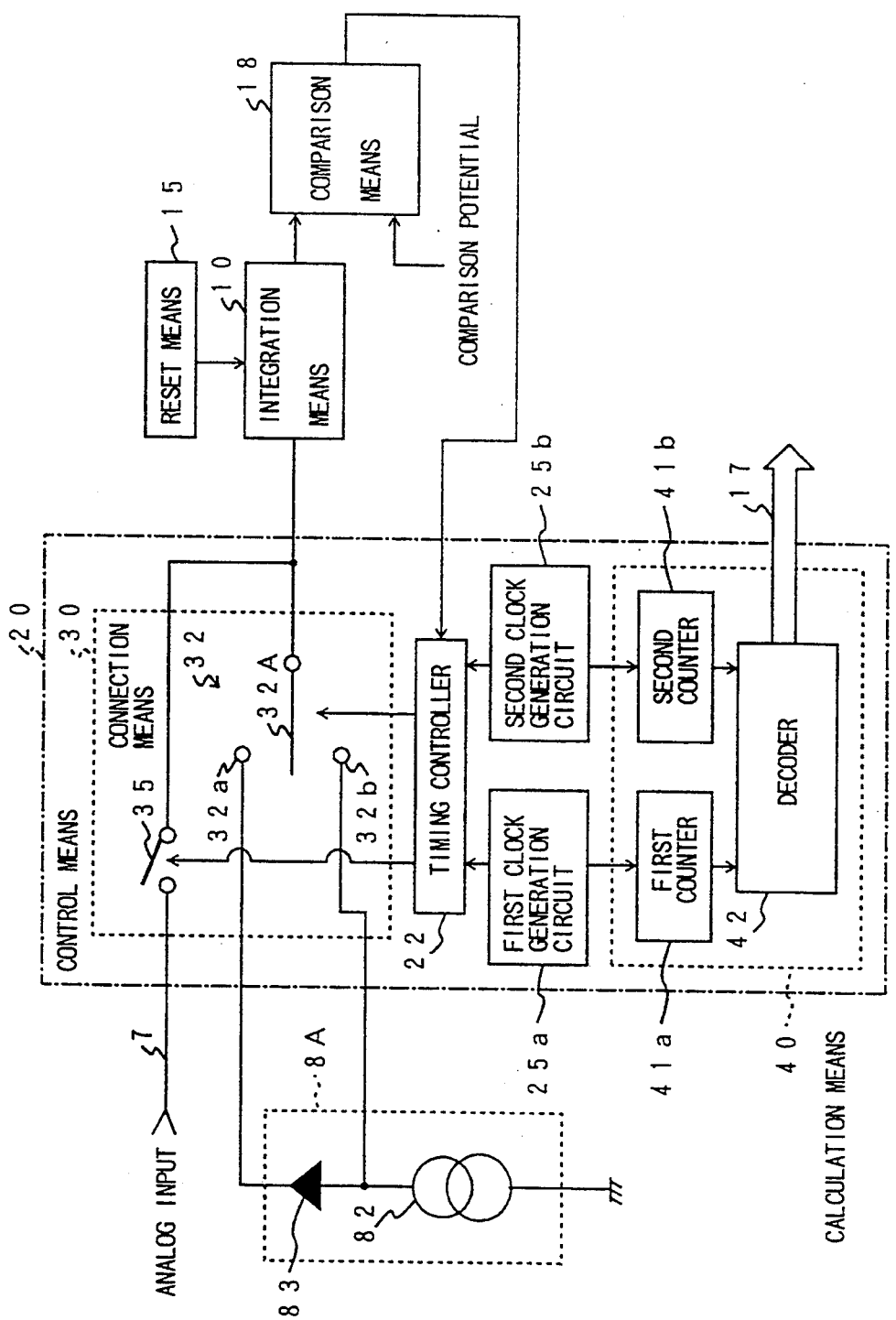
F I G. 34

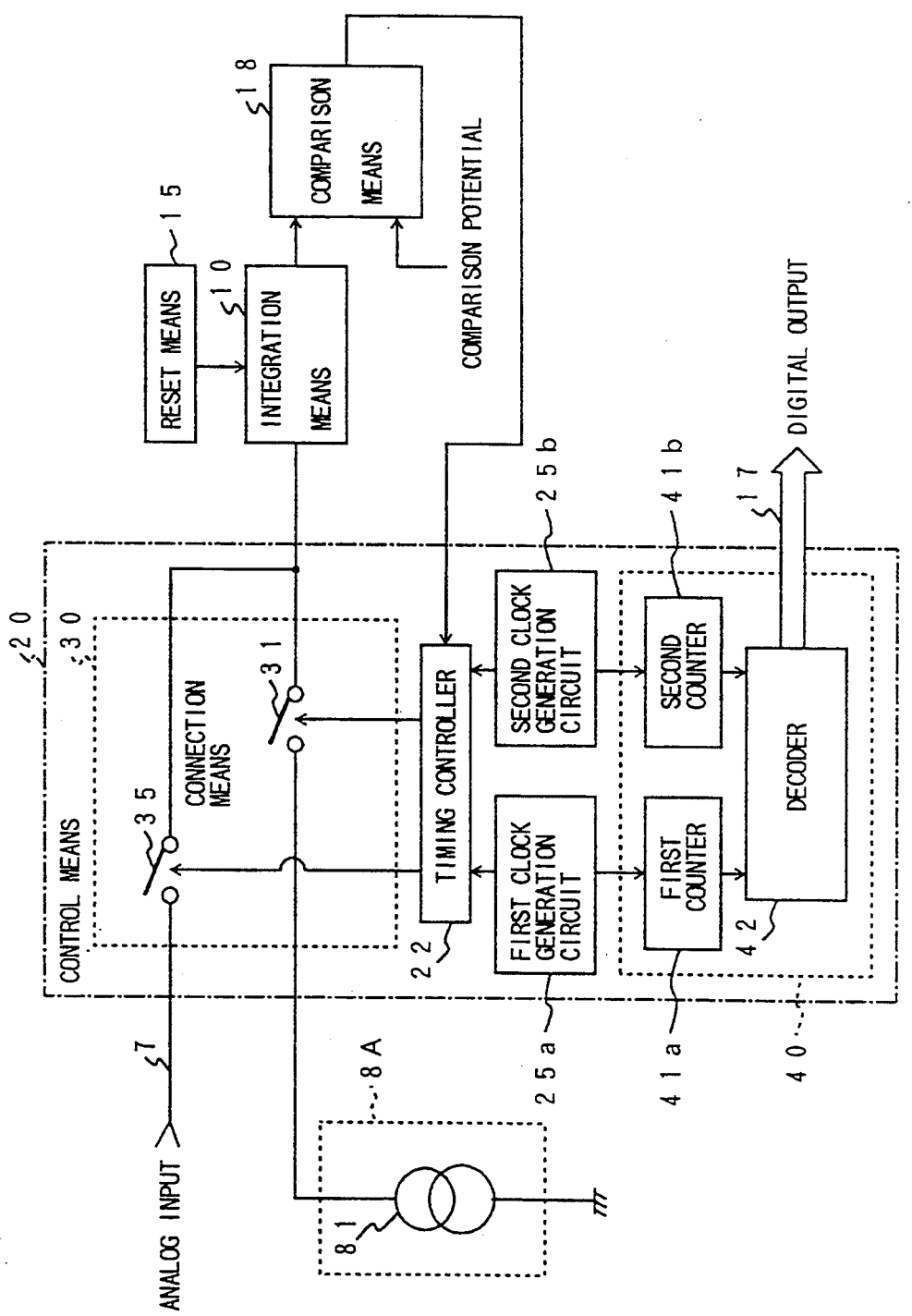
F I G. 35

INTEGRATION TYPE D-A/A-D CONVERSION APPARATUS CAPABLE OF SHORTENING CONVERSION PROCESSING TIME

BACKGROUND OF THE INVENTION

This invention relates to an integrating type digital-analog (D-A)/analog-digital (A-D) converter, and more particularly to an integrating type D-A/A-D converter adapted for controlling an integral time in accordance with a plurality of reference clocks having periods which are different from each other and are such that the time length relationship therebetween is indicated by an arbitrary integer ratio, thereby permitting the conversion processing time to be reduced.

The integrating type D-A/A-D converter is one of high accuracy and effective D-A/A-D converting means in the technical field where the D-A or A-D conversion speed is relatively low.

Initially, explanation will be given with respect to the conventional D-A converter by using FIGS. 1-3. FIG. 1 shows the outline the configuration of a conventional D-A converter of the single slope type. In the figure, the D-A converter comprises a control circuit 1 adapted to receive a plurality of digital input signals to control its integral time, a reference voltage generation circuit 8 for delivering an analog reference voltage $V_{ref}$ synchronous with the digital input by the control circuit 1, an integration circuit 10 for integrating the reference voltage $V_{ref}$ delivered by a predetermined timing, and a reset circuit 15 for clearing an output of the integration circuit 10. The control circuit 1 comprises a timing controller 2, a clock circuit 3 adapted to generate a single clock having a single period to deliver it to the timing controller 2, and a connection circuit 4 comprised of a switch SW₁ provided between the reference voltage generation circuit 8 and the integration circuit 10 and adapted for opening and closing the circuit so as to deliver the reference voltage $V_{ref}$ to the integration circuit 10 in accordance with a timing set by the timing controller 2.

The integration circuit 10 comprises an operational amplifier 11 adapted to input an analog reference voltage delivered only for a time period proportional to a digital input 6 to carry out integrating operation (calculation) to output an arbitrary function as an analog output 16, a capacitor 12 connected in parallel with the operational amplifier 11, and a resistor 13 provided between the connection circuit 4 and the operational amplifier 11. The reset circuit 15 is comprised of a reset switch SW$_R$ for short-circuiting the both ends of the capacitor 12 of the integration circuit 10 to thereby clear an output of the operational amplifier 11.

The operation based on the above-described configuration will now be described. Initially, prior to inputting a digital value 6, an output of the operational amplifier 11 of the integration circuit 10 is in advance cleared by allowing the reset switch SW$_R$ of the reset circuit 15 to be turned ON. Then, the reset switch SW$_R$ is caused to be turned OFF to allow the switch SW₁ of the connection circuit 4 to be turned ON only for a time period proportional to the digital value 6 to be converted to thereby deliver the reference voltage $V_{ref}$ to the operational amplifier 11 to perform an integrating operation, thus making it possible to obtain an analog output 16 proportional to the digital input value 6. To realize this, the timing controller 2 receives the digital input 6 and also receives a clock signal generated by the clock circuit 3 thus to control an ON/OFF time of the switch SW₁ of the connection circuit 4.

The integrating type D-A converter constructed and operated as above is based on the principle to convert the conversion resolution from a digital value to an analog value in correspondence with the integral time. The time required for integrating a digital value per unit is a period of a reference clock, and an integrated value integrated by the period of the reference clock is a unit analog value. Since the period of the reference clock and the unit analog value determine accuracy of the D-A conversion, it is impossible in principle to output an analog value smaller than an integral value integrated by the period of the reference clock.

Moreover, since the integrating type D-A converter allows an integral value obtained by carrying out integration only for a time proportional to a digital input value to be an analog output, it is necessary for carrying out D-A conversion processing at a high speed to shorten (reduce) the period of the reference clock so as to shorten the conversion time.

For example, in D-A converters used in the audio field, there are some D-A converters operative at a sampling frequency of 48 kHz. In the case of applying D-A conversion to a digital input with the accuracy of 16 bits, a reference clock having a frequency of 3.15 GHz is required. However, since it is difficult in practice to generate such a high speed reference clock, it was unable to operate the integrating type D-A converter of this system at a sampling frequency of 48 kHz and with the accuracy of 16 bits of a digital input.

To improve the above-mentioned drawback, a D-A converter of the dual slope type as shown in FIG. 2 has been proposed. In this D-A converter, the reference voltage generation circuit 8 is composed of first and second voltage sources 8a and 8b adapted for outputting first and second reference voltages $V_{ref1}$ and $V_{ref2}$ having different two values, respectively. Further, switch SW₁ constituting the connection circuit 4 of the control circuit 1 includes terminals 4a and 4b for switching between voltage sources 8a and 8b. Other components are similar to those of the D-A converter of the single slope type of FIG. 1.

The dual slope type D-A converter thus constructed operates, in a manner similar to that of the single slope type D-A converter shown in FIG. 1, to first close the reset switch SW$_R$ of the reset circuit 15 to short-circuit the both ends of capacitor 12 to thereby clear an output of the operational amplifier 11. Then, the movable contact of the changeover switch SW₁ of the connection circuit 4 is caused to be operative to close the contact 4a on the first reference voltage source 8a side. Thus, the first reference voltage $V_{ref1}$ is used to carry out a first integration. Then, the movable contact of the changeover switch SW₁ is switched to the contact 4b side on the second reference voltage source 8b side to deliver the second reference voltage $V_{ref2}$ to integration circuit 10. Thus, a second integration is carried out. The relationship between an output voltage $V_0$ of the analog output 16 integrated by the integration circuit 10 and the integration time periods $t_1$ and $t_2$ is shown in FIG. 3. Since gradients for the integration time periods $t_1$ and $t_2$ are different from each other, a D-A converter having two kinds of reference voltages $V_{ref1}$ and $V_{ref2}$ is called a dual slope type D-A converter.

Assuming now that the period of a single reference clock outputted from the clock circuit 3 is $\Delta t$, the time period during which integration is carried out by the first reference voltage $V_{ref1}$ is $t_1$, and the time period during which integration is carried out by the second reference voltage $V_{ref2}$ is $t_2$, the relationship expressed as "$t_1 = n \times \Delta t$" and "$t_2 = m \times \Delta t$" holds. n and m are constants different from each other. Accordingly, when it is assumed that the capacity of the capacitor 12 is C, and the resistance of a resistor 13 is R, an output voltage $V_0$ is calculated by the following formula:

$$V_0 = \frac{1}{R \cdot C} (V_{ref1} \cdot n + V_{ref2} \cdot m) \cdot \Delta t \qquad (1)$$

In the above formula (1), if "$V_{ref1} > V_{ref2}$" holds, an approach is employed to roughly carry out integration by the reference voltage $V_{ref1}$ up to a value close to the target output voltage $V_0$ thereafter to carry out integration by the reference voltage $V_{ref2}$, thereby making it possible to carry out D-A conversion with the integral time being caused to be shorter than that of the single slope type D-A converter.

However, since relative accuracy between different reference voltages $V_{ref1}$ and $V_{ref2}$ is rigorously required for the above-mentioned dual slope type D-A converter, if a relative output voltage between reference voltages is different from a set value, any error would take place between an integral value output voltage $V_0$ calculated by the formula (1) and a target output voltage. Namely, there was the drawback that if the relative accuracy between two reference voltages $V_{ref1}$ and $V_{ref2}$ deteriorated, any error, etc. relating to the differential linearlity of an integral output takes places, thus causing the D-A conversion accuracy to be lowered.

A conventional integrating type A-D converter will now be described.

FIG. 4 shows the outline of the configuration of a dual ramp type A-D converter which is of the conventional typical type. In FIG. 4, the A-D converter includes, similarly to the D-A converter, control circuit 1, reference voltage generation circuit 8, integration circuit 10, and reset circuit 15. Since the A-D converter includes many components common to those of the D-A converter as the fundamental configuration, explanation will be given with different reference numerals being attached only to different components. Connection circuit 4 of the control circuit 1 comprises a switch 14 for carrying out ON/OFF control of supply to the integration circuit 10 of an analog input 7, and a switch 4a for carrying out ON/OFF control of supply to the integration circuit 10 of the reference voltage $V_{ref}$. The control circuit 1 includes clock circuit 3 for delivering a clock having a single period to the timing controller 2, and the clock of this clock circuit 3 is delivered also to a counter 5. An integral output of the integration circuit 10 is delivered to a comparator 18, at which it is compared with a reference potential. Its output is delivered to the counter 5. This counter 5 converts an inputted potential to digital values 17 on the basis of the clock to output it.

The operation of the A-D converter thus constructed will now be described. Similarly to the D-A converter, reset switch $SW_R$ of the reset circuit 15 is closed to short-circuit the both ends of the capacitor 12 to clear an integrated output of the operational amplifier 11. Then, the reset switch $SW_R$ is caused to be turned OFF to allow the switch 14 of the connection circuit 4 to be turned ON on the basis of a signal from the timing controller 2, whereby an input voltage $V_i$ of the analog input 7 is delivered to the integration circuit 10. Thus, the integration circuit 10 starts integration of an input voltage to carry out integration only for a time period set in advance, thereby making it possible to provide a voltage proportional to the input voltage $V_i$ as an output of the integration circuit 10. When the switch 14 of the connection circuit 4 is caused to be turned OFF and the switch 4a is caused to be turned ON, reference voltage $V_{ref}$ delivered from the reference voltage generation circuit 8 is delivered to the integration circuit 10. Thus, the integration circuit 10 integrates the reference voltage $V_{ref}$ in a direction opposite to that of the input voltage $V_i$. At this time, since the reference voltage $V_{ref}$ is fixed, the integration circuit 10 carries out a fixed integrating operation. Its integrated output is indicated by a fixed gradient at all times. Accordingly, a time required until the integrated output of the integration circuit 10 becomes equal to "0" for a second time is measured, thereby making it possible to convert an inputted potential to a digital value. The integrating type A-D converter of this system is the most fundamental, and is called an A-D converter of the dual ramp type because the integrating direction of the input voltage and that of the reference voltage are opposite to each other and combination of two gradients of integrated outputs indicates mountain shape.

Because the dual ramp type A-D converter converts the conversion resolution to time similarly to the single slope type D-A converter, it is necessary to shorten the reference clock period in order to permit high speed A-D conversion to shorten the conversion time. This restricted realization of high speed operation. To solve this, also in the A-D converter, there has been proposed a triple ramp type A-D converter constructed to deliver a plurality of different reference voltages so that an integrated output has three gradients.

The outline of the configuration of the triple ramp type A-D converter is shown in FIG. 5. In FIG. 5, since the configurations of the integration circuit 10, the reset circuit 15 and the comparator 18 are the same as those of respective components in FIG. 4, their explanation will be omitted. The A-D converter of FIG. 5 includes first and second reference voltage sources 8a and 8b for respectively outputting first and second reference voltages $V_{ref1}$ and $V_{ref2}$ similarly to the reference voltage generation circuit 8 of The D-A converter of FIG. 2. The connection circuit 4 includes a switch 14 for delivering an analog input 7 to the integration circuit 10, and a switch $SW_1$ having a movable contact 4A and two fixed contacts 4a and 4b for carrying out switching between first and second reference voltages $V_{ref1}$ and $V_{ref2}$ every predetermined time to deliver a switched voltage to the integration circuit.

The operation of the triple ramp type A-D converter thus constructed will now be described in accordance with FIGS. 5 and 6. Initially, when the switch $SW_R$ of the reset circuit 15 is closed, the both ends of the capacitor 12 are short-circuited, whereby an integrated output of the operational amplifier 11 is cleared. When the switch $SW_R$ is opened and the switch 14 of an analog input is closed with the movable contact 4A of the switch $SW_1$ of the connection circuit 4 being also in an open state, the analog input 7 is delivered to the integration circuit 10, so integration of the analog input voltage is carried out only for an integral time period $t_0$ of FIG. 6. Further, when the switch 14 is opened and the movable contact 4A of the switch $SW_1$ is connected to the fixed contact 4a on the first reference voltage source 8a side, first reference voltage $V_{ref1}$ having a direction opposite to that of the analog input voltage is delivered to the integration circuit 10, so integration is carried out only for a time period indicated by the integration time period $t_1$ in FIG. 6. Then, the movable contact 4A of the switch $SW_1$ is switched to the fixed contact 4b side on the second reference voltage source 8b side, so the second reference voltage $V_{ref2}$ is delivered to the integration circuit 10. Thus, only for the integration time period $t_2$ of FIG. 6, an integrated output having a direction opposite to that of the analog input voltage and a gradient different from that of the first reference voltage is provided by calculation (operation) until it becomes equal to "0". At this time, when it is assumed that "$V_{ref1} > V_{ref2}$" holds, the higher order bits are determined by a time obtained by integrating the first reference voltage $V_{ref1}$, and the lower order bits are determined by a time obtained by integrating the second reference voltage $V_{ref2}$. Accordingly, it is possible to increase the resolution of the integration circuit 10 without increasing the clock frequency.

When it is now assumed as shown in FIG. 6 that the time during which integration of an analog input voltage is carried out is $t_0$, the time during which integration of the first reference voltage $V_{ref1}$ is carried out is $t_1$, the time during which integration of the second reference voltage $V_{ref2}$ is carried out is $t_2$, and the clock period is $\Delta t$, the relationship expressed as "$t_0 = P \times \Delta t$", "$t_1 = n \times \Delta t$", and "$t_2 = m \times \Delta t$" (P, n, m are constants) holds. From this relationship, the input voltage $V_i$ is calculated by the following formula (2):

$$V_i = \frac{1}{P} (V_{ref1} \cdot n + V_{ref2} \cdot m) \qquad (2)$$

Accordingly, also in the A-D converter similarly to the D-A converter, even if a low clock frequency is used, it is possible to obtain a resolution of high accuracy, and to carry out A-D conversion at a high speed.

However, also in the conventional triple ramp type A-D converter constructed and operated as above, there is the problem that when the relative accuracy between first and second reference voltages $V_{ref1}$ and $V_{ref2}$ is deteriorated, the conversion accuracy of the differential linearlity, etc. is lowered.

As stated above, in the conventional D-A/A-D converters, even if a D-A/A-D converter of any type is employed, the D-A/A-D conversion accuracy is restricted by the period of the reference clock. As a result, it was impossible to obtain an analog value smaller than an integral value corresponding to the period of the reference clock as an output of the integration circuit.

Further, in order to cause the D-A/A-D converter to be operative at a high speed, it is necessary to allow the clock frequency to be high. However, because it is impossible to allow the clock frequency to be high without any restriction in practice, there is limitation in reducing the conversion processing time of the converter.

In addition, in the case where the dual slope type D-A converter or the triple ramp type A-D converter is used in order to practically shorten the conversion processing time of the converter, the relative accuracy between plural reference voltages may be deteriorated. As a result, there was also the problem that, e.g., the differential linearlity, etc. may be deteriorated, thus causing the conversion accuracy to be lowered.

SUMMARY OF THE INVENTION

This invention has been made in order to solve the above-described problems, and its object is to provide an integrating type D-A/A-D converter in which a plurality of clock signals having periods which are different from each other and are such that the time length relationship therebetween is indicated by an integer ratio are used to control the integrating operational processing, thereby making it possible to shorten the conversion processing time without lowering the conversion accuracy even if a clock of a relatively low frequency is employed.

To achieve the above-described object, the integrating D-A/A-D converter according to this invention comprises: reference value generation means for generating at least one reference value relating to voltage or current; control means adapted for carrying out switching between a digital or analog input delivered from the external and the reference value to connect a switched one to thereby control the converting operation; and integration means for integrating the digital or analog input and the reference value switched and supplied in sequence by the control means to output an integral value for obtaining a digital or analog output, wherein the control means at least includes: connection means for sequentially carrying out switching between an analog value corresponding to the digital input or the analog input and the reference value to make a connection so as to deliver a switched one to the integration means; a plurality of clock supply means for respectively generating a plurality of clock signals having periods per unit time which are different from each other and such that the time length relationship therebetween can be indicated by an arbitrary integer ratio to output them; and time control means for controlling respective connection times of the connection means so that an integral value outputted from the integration means, having the analog value corresponding to the input and the reference value as an input, becomes equal to a value varying with a minimum value being as a unit, in dependency upon times corresponding to respective periods of the plurality of clock signals delivered from the clock supply means.

As the first aspect, in a D-A converter according to this invention and including the above-mentioned fundamental configuration, the time control means included in the control means receives a digital input from the external to allow the reference value generation means to output an analog value synchronous with the digital input therefrom, and to control the connection means so that the analog value and the reference value are delivered from the reference value generation means to the integration means, in accordance with times corresponding to the periods of respective clock signals in response to a plurality of clock signals having periods which are different from each other and are such that the time length relationship therebetween is indicated by an arbitrary integer ratio delivered from the the plurality of clock generation means.

Further, as the second aspect, in an A-D converter according to this invention and including the above-mentioned fundamental configuration, the control means comprises: connection means supplied with the analog input and the reference value; a plurality of clock generation means for generating a plurality of clock signals having periods which are different from each other and are such that the time length relationship is indicated by an arbitrary integer ratio; time control means for controlling the connection means so that the analog input and the reference value are delivered to the integration means in accordance with times corresponding to periods of respective clock signals in response to the plurality of clock signals having different periods; and calculation means for re-converting an integral voltage of the integration means to a digital output on the basis of the plurality of clock signals having different periods, and the A/D converter further comprises comparison means for carrying out comparison operation by using the integral voltage as one input and a comparison potential as the other input in order to feed the integral voltage that the integration means outputs back to the control means, thus to output its comparison result to the control means.

On the basis of the above-mentioned configuration, the D-A converter according to the first aspect uses the time control means to vary combination of clock signals used in accordance with a digital input delivered from the external to thereby set an integral time required until a target integral value is provided, thus making it possible to carry out conversion to an analog value smaller than an integral value obtained by using a clock signal having a single period.

Further, the A-D converter according to the second aspect varies combination of clock signals used with respect to an analog input and a reference value having an integrating direction different from that of the analog input which are delivered to the connection means to thereby set an integral time required until a target integral value is provided to integrate the integral time with a minimum value being as a unit to thereby carry out conversion to an analog value of the minimum unit, thus making it possible to re-convert this analog value to a digital output with high accuracy by using comparison means and calculation means.

As stated above, the integrating type D-A/A-D converter according to this invention controls an input to the integration means so as to carry out switching between an analog value corresponding to an input and a reference value every predetermined time by a plurality of clock signals having periods per unit time which are different from each other and are such that the time length relationship therebetween is indicated by an arbitrary integer ratio. For this reason, even if a clock signal of a lower frequency is used, D-A/A-D conversion can be made with an accuracy higher than that when a clock signal of a higher frequency is used. Accordingly, according as the clock frequency becomes lower, it is possible to greatly lower the operating frequency of an internal logic circuit. This is profitable also for saving of power consumption.

Further, since a plurality of clock signals having different periods are used as a reference clock without use of a single clock signal, thereby making it possible to carry out integration with a minimum value being as a unit by respective period differences, the D-A/A-D conversion processing time can be shortened.

In addition, since a plurality of clock signals having different periods are used, even in the case where a plurality of reference values are used, deterioration of the relative accuracy and/or deterioration of the differential linearlity can be prevented. Thus, an excellent conversion accuracy can be advantageously provided.

BRIEF DESCRIPTION OF THE DRAWINGS

In the attached drawings:

FIG. 9 is a block diagram showing the fundamental concept of the integrating type A-D converter according to this invention;

FIG. 11 is a block diagram showing the fundamental configuration of a D-A converter according to a first embodiment of this invention;

FIG. 22 is a conceptual view showing an example of the configuration of a timing controller of the D-A converter according to the sixth embodiment;

FIG. 23 is a block diagram showing an actual example of the timing controller in the D-A converter according to the sixth embodiment;

FIG. 26 is a block diagram showing the outline of the configuration of a D-A converter according to a ninth embodiment of this invention;

FIG. 32 is a block diagram showing the outline of the configuration of an A-D converter according to a fourteenth embodiment of this invention;

FIG. 34 is a block diagram showing the outline of the configuration of an A-D converter according to a fifteenth embodiment of this invention;

FIG. 35 is a block diagram showing the outline of the configuration of an A-D converter according to a sixteenth embodiment of this invention;

DETAILED DESCRIPTION OF THE PREFERRED EMBODIMENTS

Preferred embodiments of an integrating type D-A/A-D converter according to this invention will now be described in detail in accordance with the attached drawings.

In this specification, the fundamental concept of a D-A converter will be first described with reference FIGS. 7, 8(a), 8(b) and 8(c), and the fundamental concept of an A-D converter will be then described with reference to to FIGS. 9, 10(a), 10(b) and 10(c). Irrespective of the fact that a converter to which attention should be drawn is either a D-A converter or an A-D converter, the fundamental concept to carry out switching control of the integral time and/or the direction of the integral voltage by using a plurality of clocks having different periods is the same. First to twelfth embodiments explained by using FIGS. 11–29 are concerned with the D-A converter. Among these embodiments, the first to sixth embodiments explained with reference to FIGS. 11–23 use a reference current as a reference value, and the seventh to twelfth embodiments explained with reference to FIGS. 24–29 use a reference voltage as a reference value. On the other hand, thirteen to twenty second embodiments explained by using FIGS. 30–41 are concerned with the A-D converter. Among these embodiments, the thirteenth to seventeenth embodiments explained by using FIGS. 30–36 use a reference current as a reference value similarly to the first and sixth embodiments, and the eighteenth to twenty second embodiments explained by using FIGS. 37–41 use a reference voltage as a reference value similarly to the seventh to twelfth embodiments. It is to be noted that the fifth embodiment of FIG. 19, the eleventh embodiment of FIG. 28, the seventeenth embodiment of FIG. 36 and the twenty second embodiment of FIG. 41 belong to D-A converters or A-D converters of respective types, and are common in that the integration means is comprised of a full differential type operational amplifier.

Figure 1:
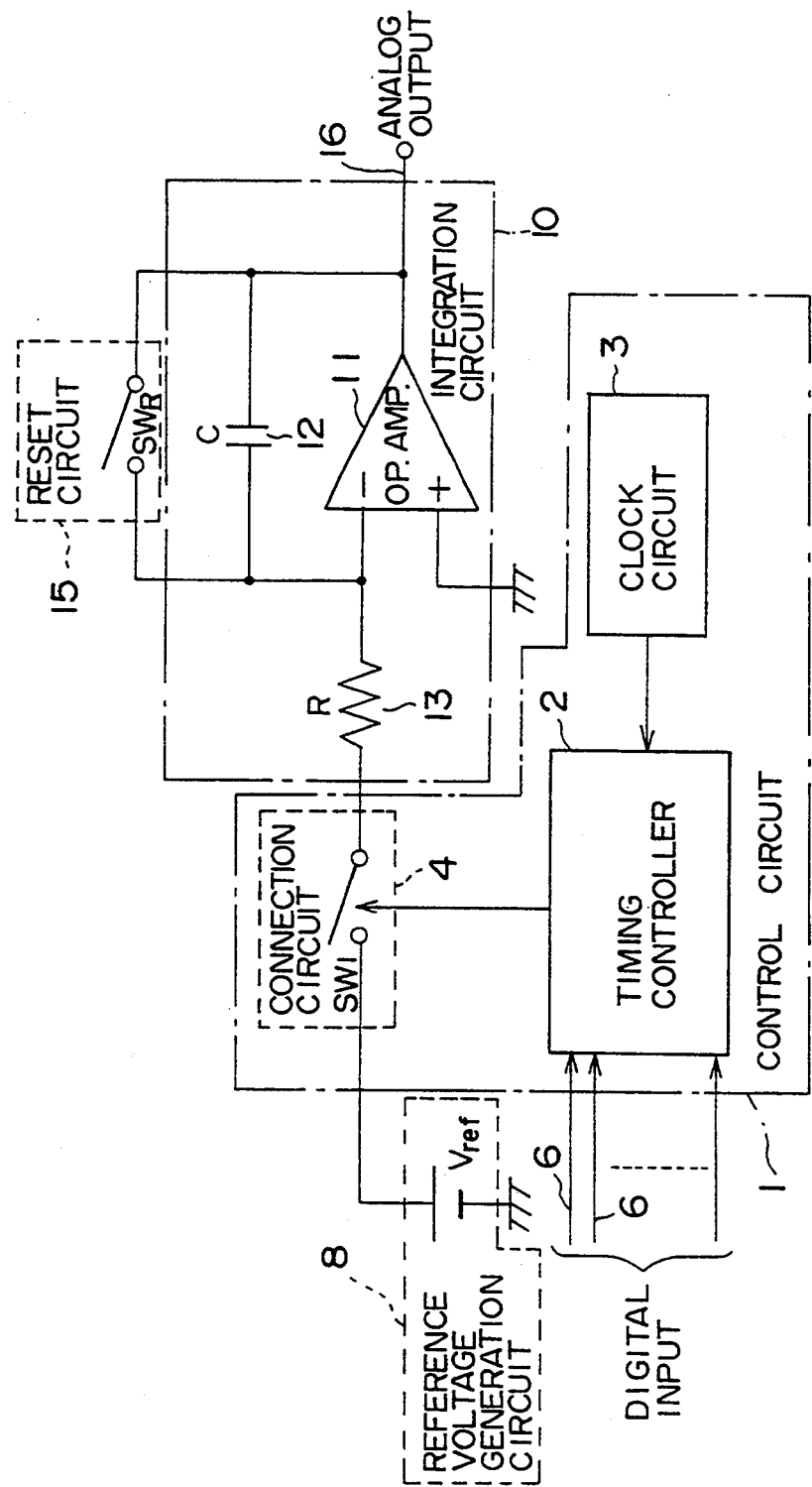
FIG. 1 is a block diagram showing the outline of the configuration of a conventional D-A converter of the single slope type.
Figure 2:
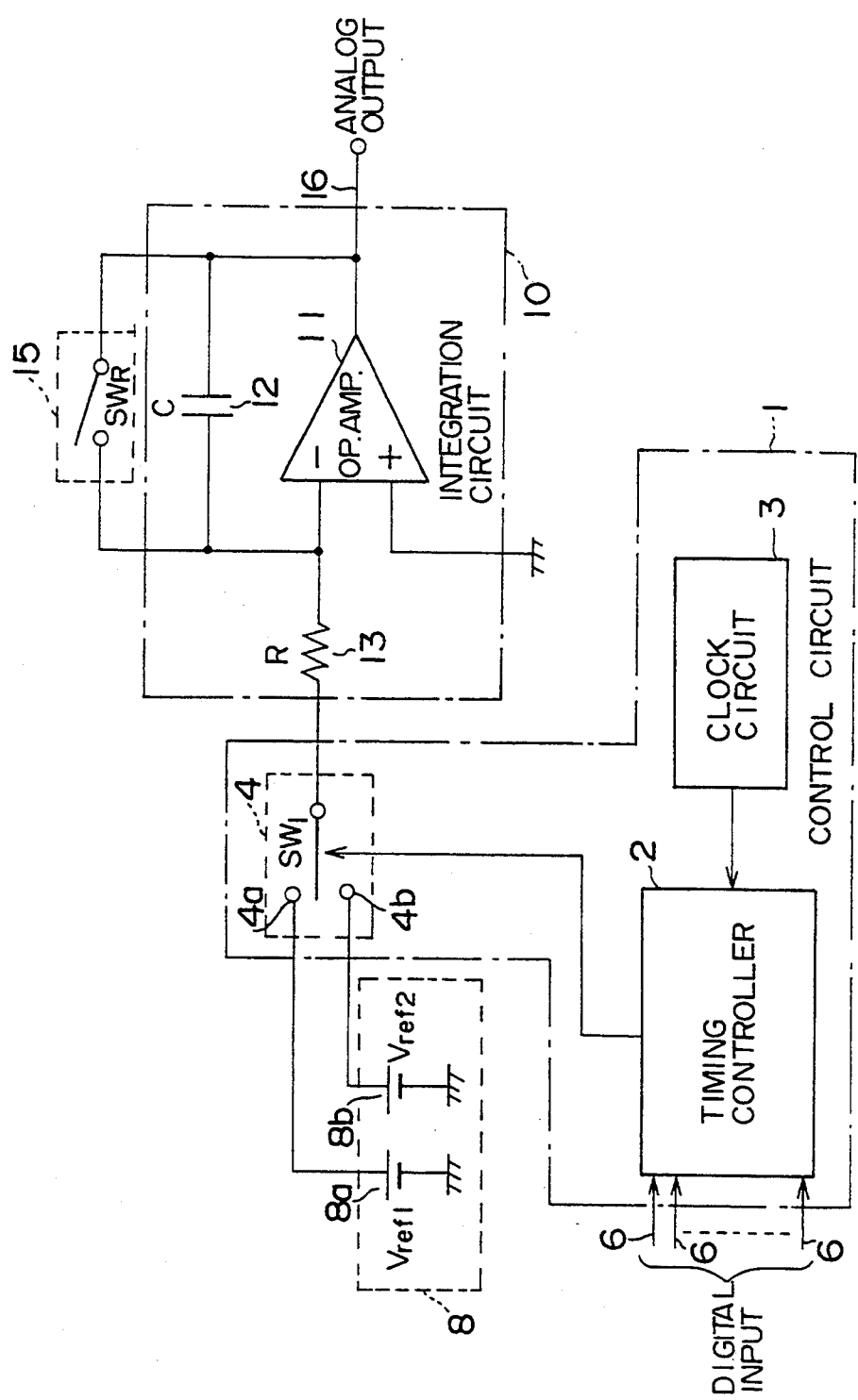
FIG. 2 is a block diagram showing the outline of the configuration of a conventional D-A converter of the dual slope type.
Figure 3:
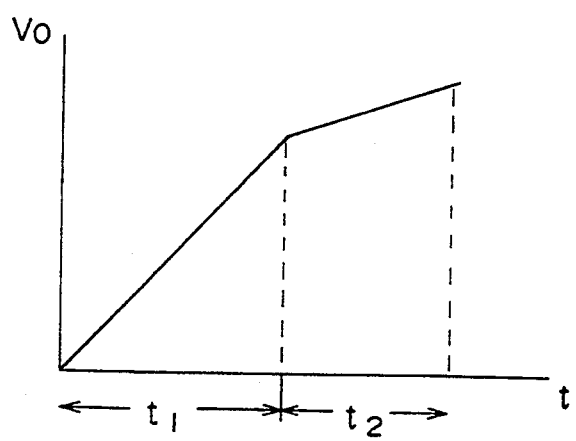
FIG. 3 is a characteristic diagram showing an integral voltage of the D-A converter shown in FIG. 2.
Figure 4:
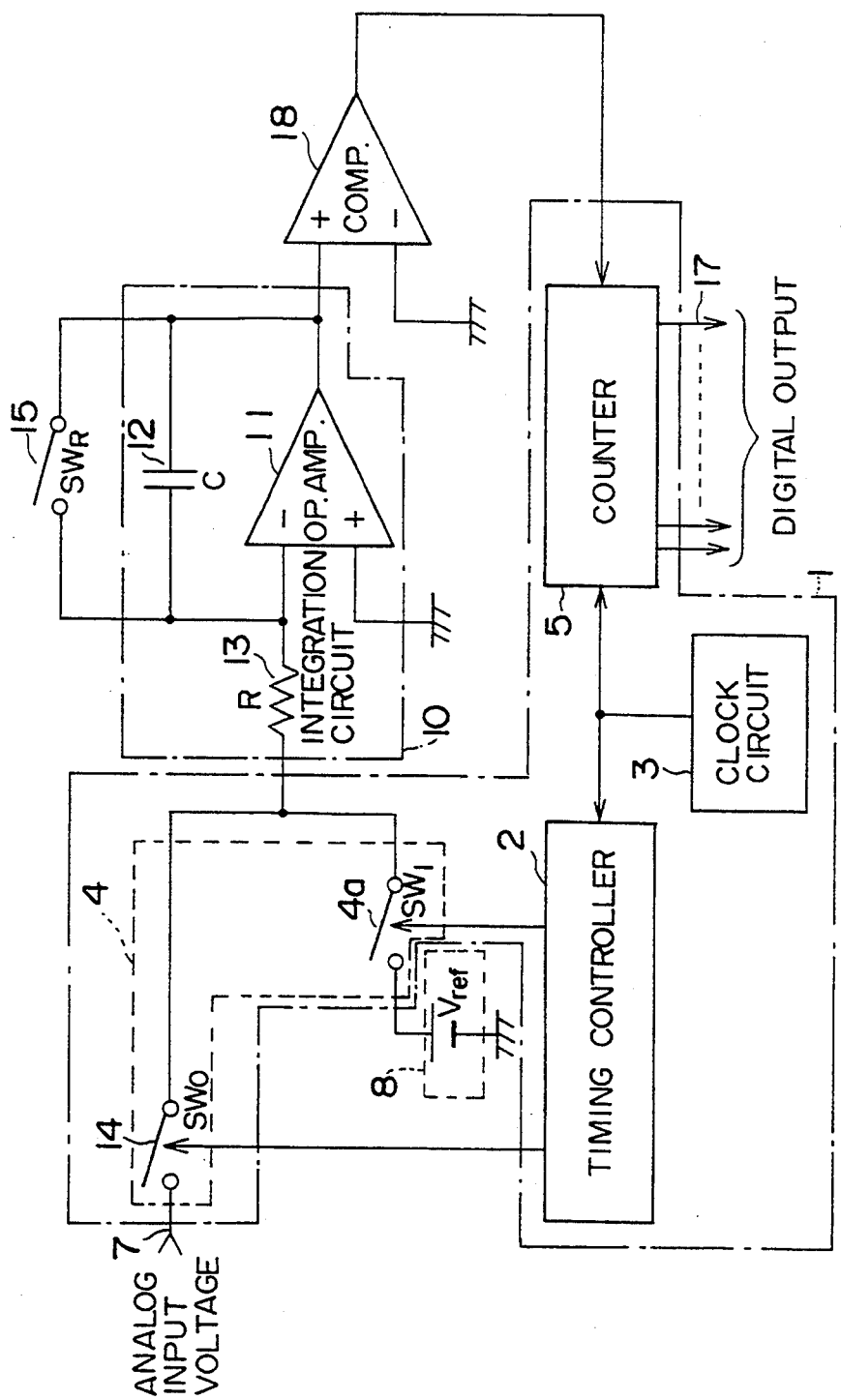
FIG. 4 is a block diagram showing the outline of the configuration of a conventional A-D converter of the dual ramp type.
Figure 5:
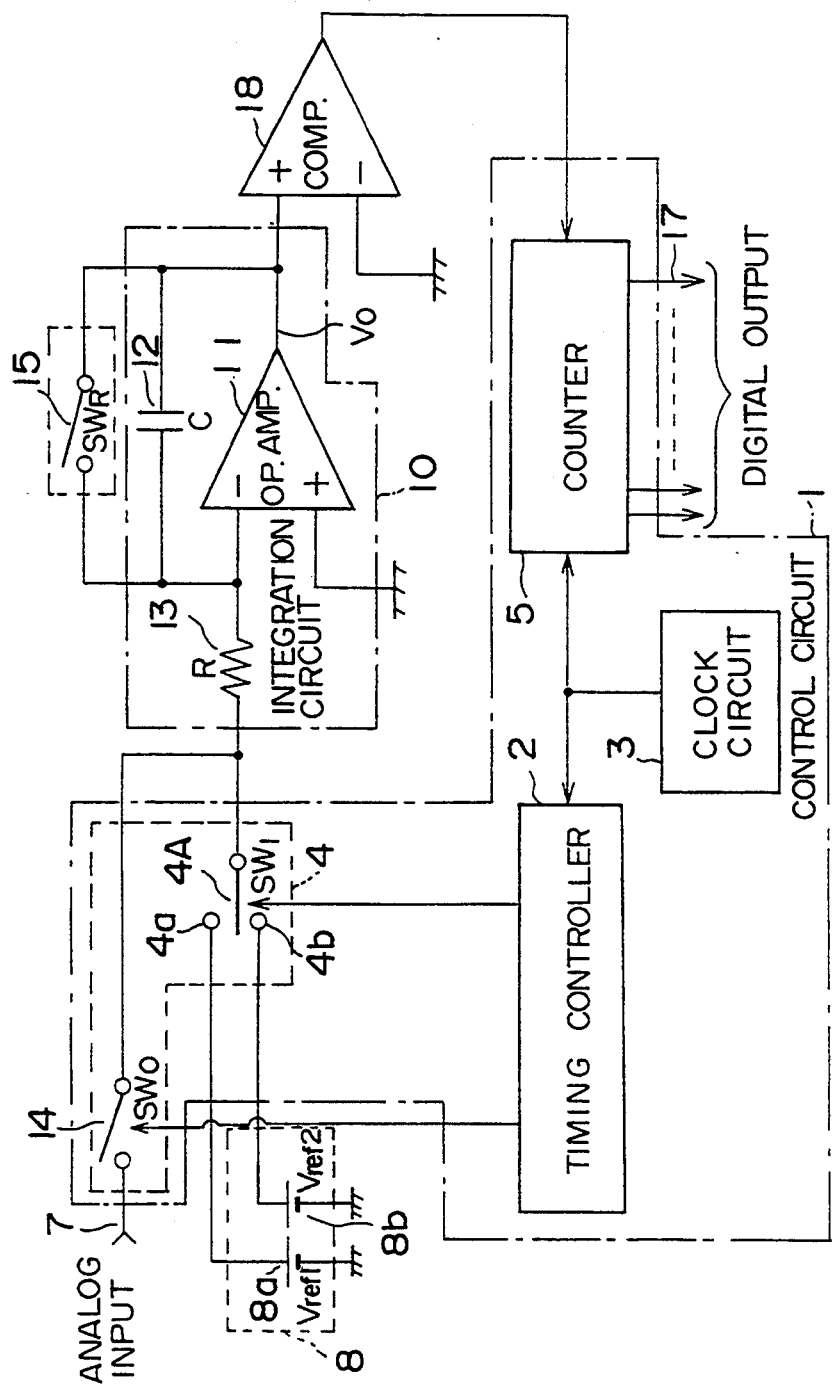
FIG. 5 is a block diagram showing the outline of the configuration of a conventional A-D converter of the triple ramp type.
Figure 6:
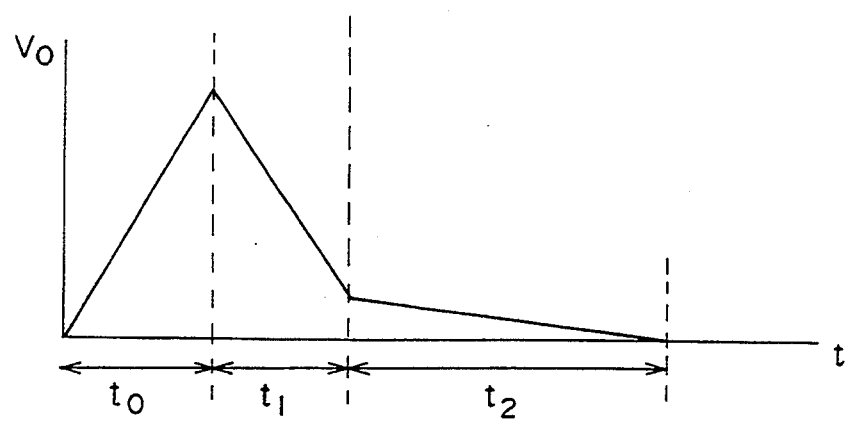
FIG. 6 is a characteristic diagram showing an integral voltage of the A-D converter shown in FIG. 5.
Figure 7:
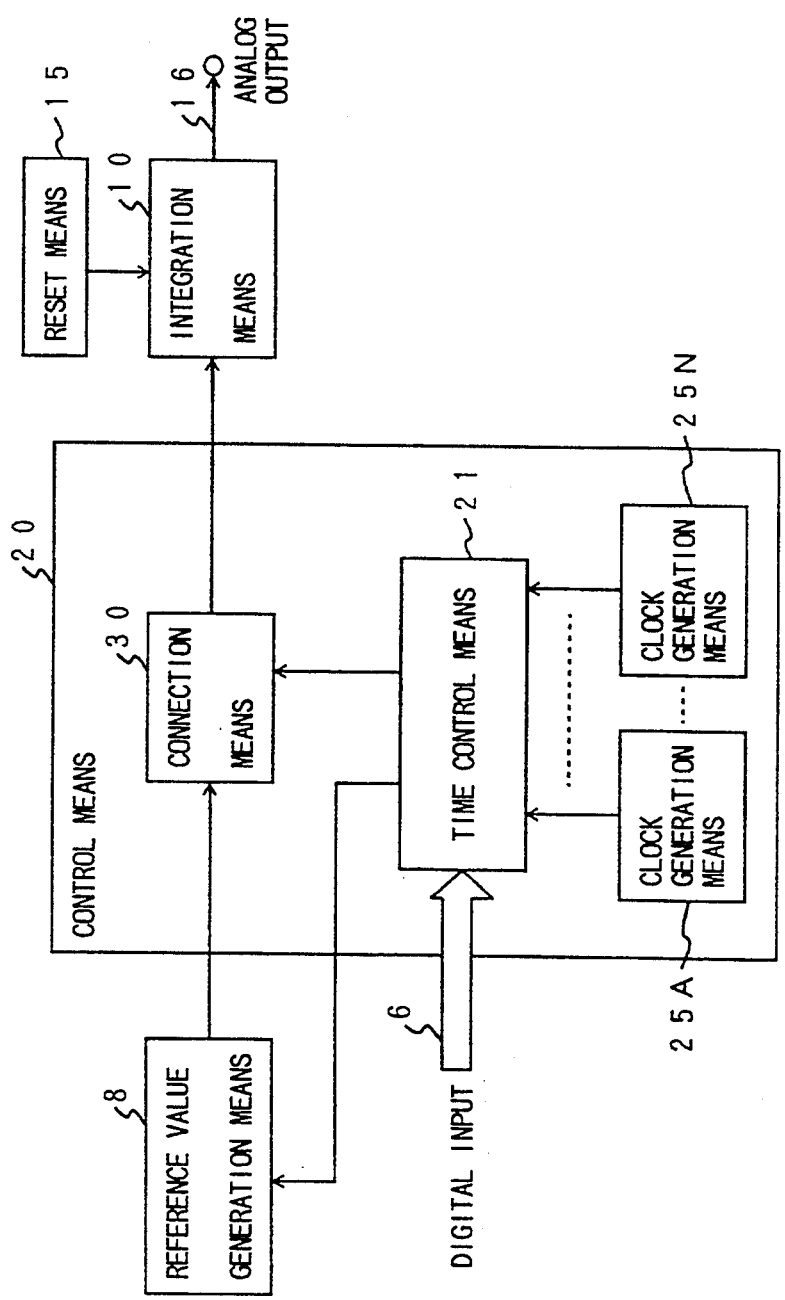
FIG. 7 is a block diagram showing the fundamental concept of an integrating type D-A converter according to this invention.
Figure 8:
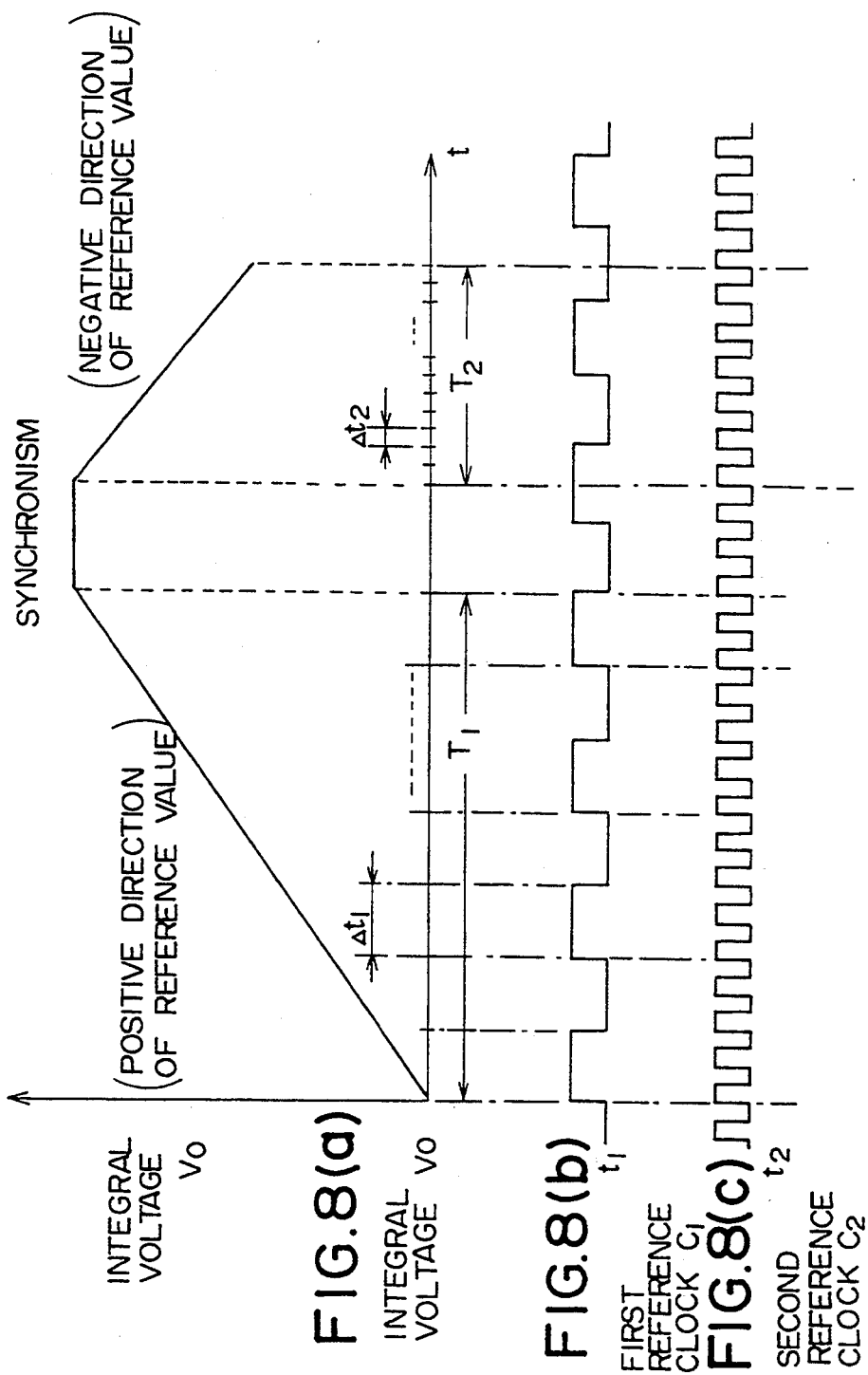
FIGS. 8(a), 8(b) and 8(c) are characteristic diagrams showing an integral voltage, a first clock signal, and a second clock signal of the D-A converter shown in FIG. 7, respectively.

Prior to proceeding with the detailed description of the embodiments, the fundamental concept of the D-A converter will now be described by using FIGS. 7–8(c). In FIG. 7, the D-A converter according to this invention comprises reference value generation means 8 such as a power supply, etc. for generating a reference value comprised of an analog reference current or an analog reference voltage; integration means 10 supplied with the reference value and an analog value corresponding to a digital input 6 from the external to apply integrating operation to these analog values to generate an analog output; reset means 15 for resetting an integral value of the integration means 10; and control means 20 provided between the reference value generation means 8 and the integration means 10 and supplied with the digital input 6, and adapted to control input to the integration means 10 of the analog value corresponding to the digital input 6 and the reference value. This control means 20 comprises time control means 21 adapted so that the digital input 6 is inputted thereto, and adapted to control a supply time of the analog value to the integration means 10; a plurality of clock generation means 25A–25N for generating a plurality of clock signals having periods which are different from each other and are such that the time length relationship therebetween is indicated by an arbitrary integer ratio to output them to the time control means 21; and connection means 30 for switching supply of the analog value from the reference value generation means 8 to the integration means 10 on the basis of a control signal from the time control means 21.

The operation of the D-A converter in accordance with the fundamental concept of this invention constructed above will now be described.

While clock generation means 25A–25N are N number of plural means, the clock signal is assumed to be two clock signals having periods $t_1$ and $t_2$ as shown in FIGS. 8(b) and 8(c) for the brevity of explanation. On this assumption, the integral time T of the integration means 10 can be calculated by the following formula (3):

$$T = n \times t_1 + m \times t_2 \text{ (n and m are an integer)} \quad (3)$$

In the above formula (3), by suitably selecting n and m, it is possible to set the integral time T with the minimum value of "$|p \times t_1 - q \times t_2|$" being as a unit (p and q are an arbitrary integer). Since the integral time T is determined by combination of two clocks respectively having different frequencies $f_1$ and $f_2$, it is possible to output an analog value with the integral value determined by the reference clock having a period of "$|p \times t_1 - q \times t_2|$" being as a minimum unit. At this time, since the first clock frequency $f_1$ and the second clock frequency $f_2$ take a value lower than a frequency determined by $1/|p \times t_1 - q \times t_2|$, it is unnecessary to allow the D-A converter to be operative by a higher reference clock frequency. Namely, since the integral time T is set by using two clocks having different periods, it is possible to hold down the clock frequency to a lower value. Further, since the necessity of a plurality of reference voltages or currents as in the D-A converter of the dual slope type is eliminated, any error resulting from the relative accuracy between reference voltages or currents, etc. does not take place. As stated above, the integrating type D-A converter according to this invention can carry out integrating operation with an analog resolution smaller than the integrated value determined by the period of the reference clock.

Moreover, in the D-A converter based on the fundamental concept thus constructed, the reference value generation means 8 may be constructed as means adapted for generating a reference value serving as a reference current or voltage having one kind and/or two kinds of values in a positive direction and/or a negative direction. In this embodiment, for the brevity of explanation, there is used reference value generation means 8 adapted for outputting two reference values $+I_{ref}$ ($+V_{ref}$), $-I_{ref}$ ($-V_{ref}$) having absolute values equal to each other and directions opposite to each other in polarity, or an open current (voltage).

In this D-A converter, in order to output analog value 16 corresponding to digital input 6, the kind and the length of the reference current (voltage) and the unit time used for integration are determined in dependency upon the value of digital input 6 by time control means 21. The reference current (voltage) determined by the time control means 21 is outputted from the reference value generation means 8. Thus, the connection means 30 connects the reference value generation means 8 and the integration means 10 by the length of a time proportional to a unit time determined in accordance with the reference current (voltage), so an integrating operation is carried out. The analog output 16 is determined by combination of a certain reference value and a time of integration carried out by using this reference value. Further, the integral time (integration time period) is determined by the period of the unit time (reference clock) used and repetition number thereof. As a result, an integral value (analog value) outputted is determined by combination of the kind of a unit time (reference clock) used and a time used (the count number of the reference clock) on the basis of the value of a digital input 6 delivered. Accordingly, the time control means 21 combines a certain reference clock and a time during which the reference clock is used in dependency upon the value of the digital input 6, and controls the connection means 30 by using a plurality of reference clocks to control the integral time of the integration means 10. Thus, the value of a predetermined analog output 16 is determined.

The principle of the D-A conversion in the above-described fundamental concept will now be described. It is assumed that the time control means 21 can generate a plurality of reference clocks on the basis of a plurality of clock signals having different periods which are outputted from clock generation means 25A–25N, and explanation will now be given specifically by taking the example where two kinds of reference clocks are generated.

When it is assumed that a voltage value $V_{in}$ of a certain digital input is decomposed into a linear sum of unit voltages $V_a$ and $V_b$, or is approximated by a linear sum, the voltage value $V_{in}$ has a relationship as indicated by the following formula (4):

$$V_{in} = a \cdot V_a + b \cdot V_b \quad (4)$$

In the above formula, a and b are an arbitrary integer, and the left side and the right side have not only the relationship that they are completely equal but also the relationship that they are nearly equal. When it is now assumed that $V_a$ and $V_b$ correspond to integral values integrated by one units of reference clocks different from each other, a certain digital input $V_{in}$ is shown in FIG. 8(a) as a linear sum of integral values integrated by different reference clocks.

The operation of the D-A conversion will now be described with reference to FIGS. 8(a)–8(c). A change of an integral value in the case where the integration means 10 carries out integration by using the time control means 21 which outputs a control signal including two reference clocks $C_1$ and $C_2$ respectively having periods $t_1$ and $t_2$ indicated by FIGS. 8(b) and 8(c) is shown in FIG. 8(a). The value $V_{in}$ of the digital input 6 is expressed by "$a \cdot V_a + b \cdot V_b$" as indicated by the above-mentioned formula (4), and $V_a$ and $V_b$ correspond to integral values when integration is carried out by different periods of the reference clocks, respectively. In order to generate a certain analog output 16, first reference current or voltage $+I_{ref}$ or $+V_{ref}$ is first used to carry out integration by a time $T_1$ during which the first reference clock $C_1$ is counted a times. In this case, the relationship expressed as "$T_1 = a \cdot t_1$" holds. Then, second reference current or voltage $-I_{ref}$ or $-V_{ref}$ is used to carry out integration by a time $T_2$ during which the second reference clock $C_2$ is counted b times, i.e., "$T_2 = b \cdot t_2$". To realize this, the reference clock is switched by using the time control means 21 to change a reference current or a reference voltage delivered to the integration means 10.

The D-A converter according to this invention has the following difference in the resolution of the D-A conversion when compared to the conventional D-A converter using a single reference clock. In the case of the conventional D-A converter, a minimum integral value (amplitude of an analog value) is determined with the reference clock being as a unit. Accordingly, it was impossible to output an analog value smaller than an integral value integrated by the unit clock. On the contrary, in the case of the D-A converter according to this invention, a plurality of reference clocks having different periods are combined to set an integral time. Accordingly, it is possible to output an analog value smaller than an integral value (amplitude of an analog value) set by the single reference clock.

For example, when it is assumed that frequencies of different two reference clocks $C_1$ and $C_2$ are respectively $f_1$ and $f_2$, the clock periods are respectively $t_1$ and $t_2$, and arbitrary different integers are respectively p and q, the minimum value $\Delta t$ can be calculated by the following formula (5):

$$\Delta t = |p \times t_1 - q \times t_2| \tag{5}$$

For example, in FIGS. 8(b) and 8(c), there is shown the example where the period ratio between the first reference clock $C_1$ and the second reference clock $C_2$ is expressed as $t_1:t_2=4:1$. The minimum value $\Delta t$ in this case can be calculated by the following formula:

$$\Delta t = |t_1 - 3 \times t_2| = |t_1 - 5 \times t_2| = t_2 \tag{6}$$

Accordingly, the resolution of the D-A conversion is determined with an integral value (amplitude of an analog value) determined by a time corresponding to the period $t_2$ being as a unit.

Figure 10:
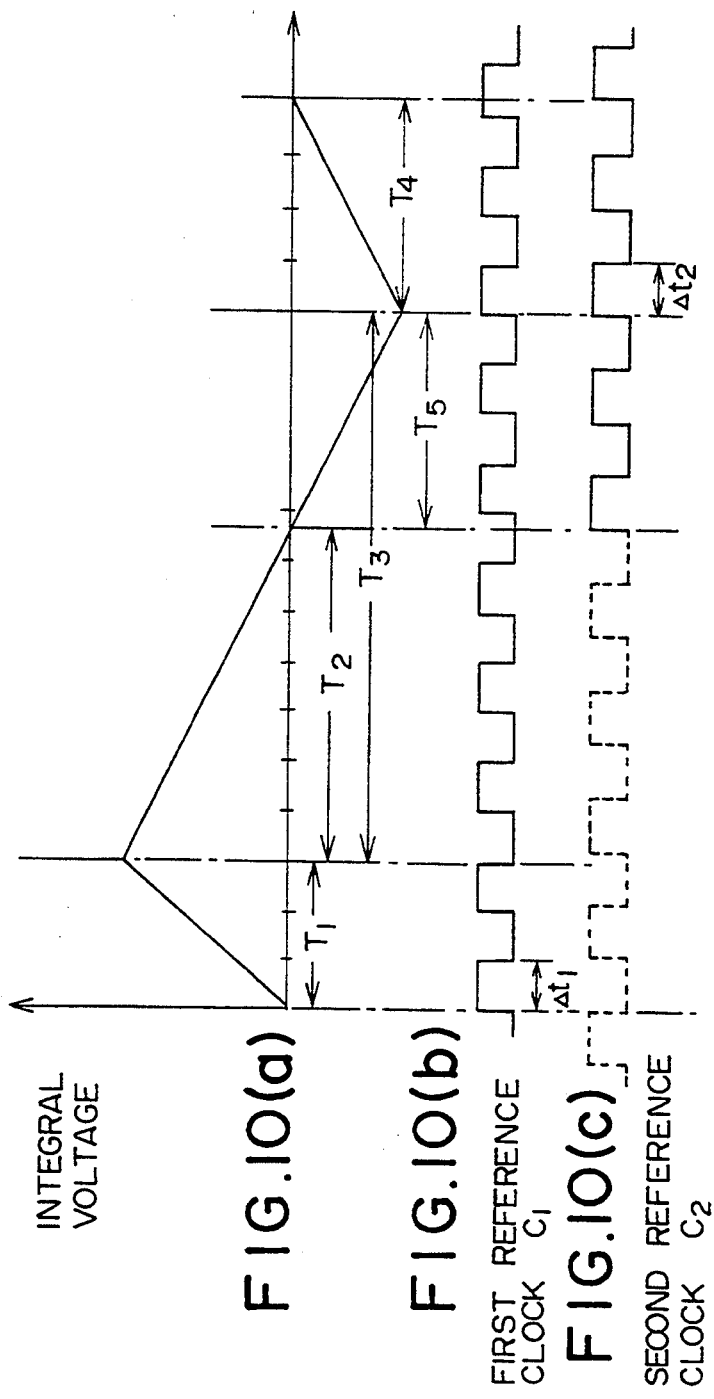
FIGS. 10(a), 10(b) and 10(c) are characteristic diagrams showing an integral voltage, a first clock signal, and a second clock signal of the A-D converter shown in FIG. 9.
Figure 12:
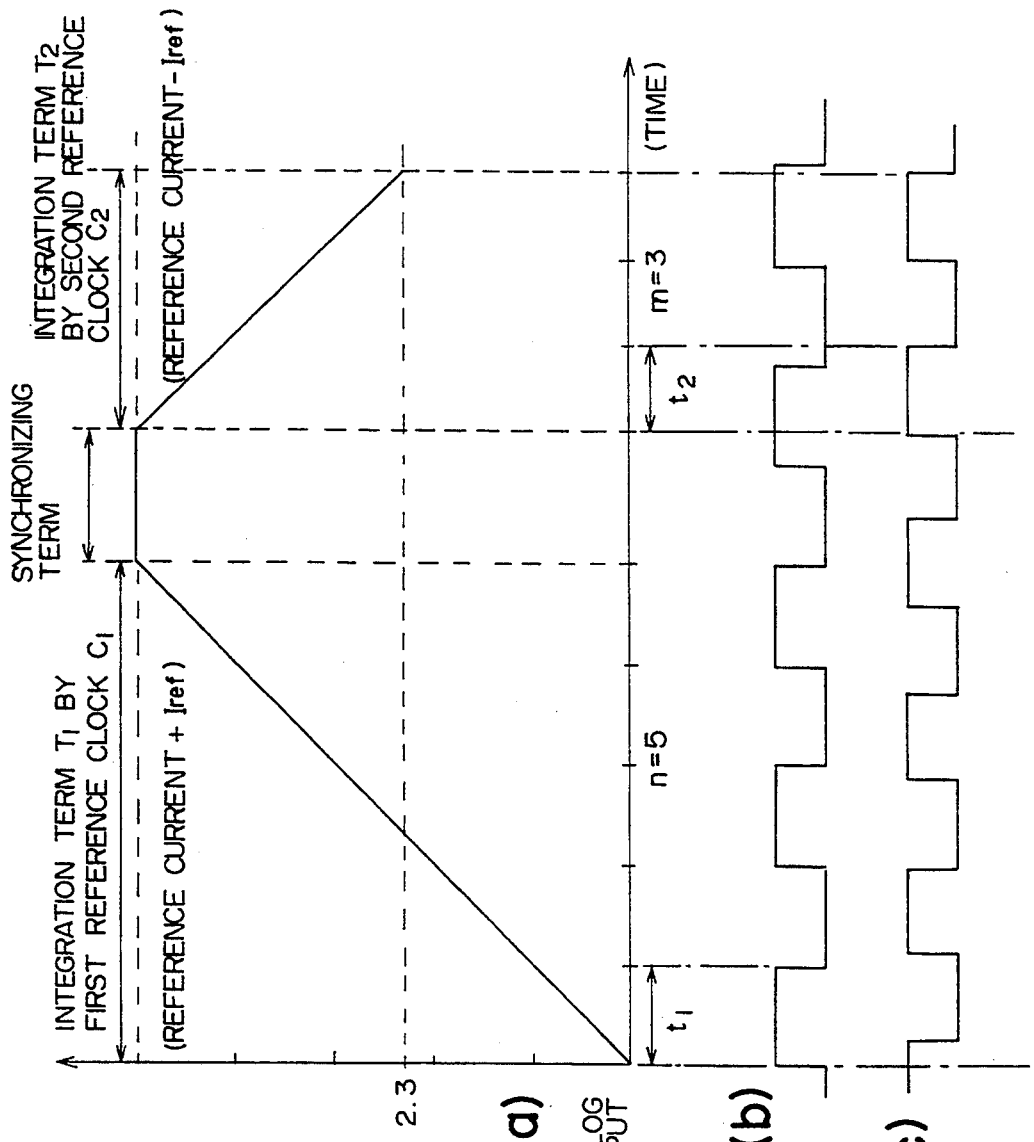
FIGS. 12(a), 12(b) and 12(c) are characteristic diagrams showing an integral voltage, a first reference clock and a second reference clock of the D-A converter according to the first embodiment, respectively.

The fundamental concept of the A-D converter according to this invention will now be described in detail by using FIGS. 9–10(c).

FIG. 9 is a block diagram showing the configuration of an A-D converter based on the fundamental concept. In the figure, the A-D converter comprises reference value generation means 8, control means 20, integration means 10, and reset means 15. Such configuration corresponds to the configuration of the D-A converter shown in FIG. 7. The different point is that there is provided comparison means 18 for comparing an integral value outputted from the integration means 10 with a comparison potential to feed the comparison result back to the control means 20. Further, in the case of the A-D converter, since an analog value is inputted and a digital value is outputted, the control means 20 is constructed in correspondence with such operation. Namely, an analog input 7 is delivered to connection means 30, at which switching between a reference value delivered from the reference value generation means 8 and the analog input 7 is carried out and a switched one is connected. Further, the comparison result of the comparison means 18 is delivered to time control means 21 or clock generation means 25A–25N. In addition, a plurality of reference clocks having different periods generated by the clock generation means 25A–25N are converted from analog values to digital values by the calculation means 40 including a counter and a decoder, etc., and are sent as a digital output 17.

The operation of the A-D converter based on the fundamental concept constructed as above will now be described.

Also in the A-D converter, two reference clocks $C_1$ and $C_2$ are used for convenience of explanation. When it is assumed that frequencies of these reference clocks $C_1$ and $C_2$ are respectively $f_1$ and $f_2$, the periods thereof are respectively $t_1$ and $t_2$, and arbitrary different integers are n and m, the integral time T of the integration means 10 can be calculated by the following formula (7):

$$T = n \times t_1 - m \times t_2 \tag{7}$$

By suitably selecting the above-mentioned n and m, it is possible to set the integral time T with the minimum value of "$|p \times t_1 - q \times t_2|$" being as a unit (p and q are an arbitrary integer). Similarly to the D-A converter, also in the A-D converter, there results the state equivalent to the case where a clock having a period of "$|p \times t_1 - q \times t_2|$" is used. At this time, the respective frequencies $f_1$ and $f_2$ of two reference clocks can be lower than the equivalent frequency "$1/|p \times t_1 - q \times t_2|$". Even if a plurality of reference values as in the case of the triple ramp type are not used, it is possible to carry out an integrating processing at a relatively higher speed, and there results in no possibility that any error, etc. based on the relative accuracy between reference values may take place.

In accordance with the above-described configuration, even if a reference clock having a frequency far lower than $1/\Delta t$ is used, it is possible to realize an A-D conversion similar to that using a reference clock of $1/\Delta t$. Accordingly, the frequency of a reference clock is reduced to much degree, and the operating frequency of the internal logic circuit can be also reduced to much degree. Since the power consumption of the logic circuit is lowered if the operation speed is lowered, it is possible to reduce the power consumption to much degree by the above-described configuration. In addition, since the operation speed of the A-D conversion thus featured can be lower than that of the conventional A-D conversion, the cost can be also reduced without using an expensive semiconductor device, etc.

As shown in FIG. 10(a), the A-D converter is equivalent to constituting a D-A converter having a reference value of the same current or voltage as the analog input 7. Accordingly, when it is assumed that the D-A converter is caused to be operative in FIG. 10(a), A-D conversion of the analog input 7 is carried out for a period of a time $T_2$ at that time. As apparent from the figure, since the time $T_2$ can be determined even with "$T_2 = T_3 - T_4$" or "$T_2 = T_3 - T_5$", two reference clocks $C_1$ and $C_2$ respectively having different periods $\Delta t_1$ and $\Delta t_2$ are used, thereby making it possible to relatively easily determine the integral time $T_2$ by making use of a period difference between clocks $C_1$ and $C_2$. Assumption is now made as follows. Namely, as seen from FIGS. 10(a) and 10(b), the time $T_1$ is a time required until an integral voltage is switched from the analog input 7 to a reference value such that the direction of the integral voltage is reversed in synchronism with fall of the second pulse of the reference clock $C_1$. At the time point when the integral voltage has been equal to "0", the reference clock $C_2$ is counted. Further, at the time point when the both reference clocks $C_1$ and $C_2$ have synchronously risen, the direction of the integral voltage is reversed for a second time. On this assumption, integral times $T_5$ and $T_4$ become easily apparent from the reference clock $C_2$. Further, since time $T_3$ is made clear from the reference clock $C_1$, it is possible to determine the integral time $T_2$ as a matter of course. By such a fundamental operating principle, also in the A-D converter, different two reference clocks are used, thereby making it possible to easily determine an integral voltage.

Further detailed embodiments of the D-A converter and the A-D converter featured by the above-mentioned fundamental concept will now be described. Namely, with respect to the D-A converter, explanation will be given by the first to twelfth embodiments.

With respect to the A-D converter, explanation will be given by the thirteenth to twenty second embodiments. It is to be noted that the repetitive description is saved to the utmost and only the different portions will be preponderantly described.

FIGS. 11–14 are views for explaining a D-A converter according to a first embodiment of this invention. FIG. 11 is a combinational diagram of blocks and circuits showing the configuration of the D-A converter. In this embodiment, reference value generation means 8 is comprised of reference current generation means 8A, and connection means 30 is comprised of a switch 31 for carrying out ON/OFF of supply to integration means 10 of a reference current generated by the reference current generation means 8A. The integration means 10 is composed of an operational amplifier 11 and a capacitor 12 similarly to the respective conventional D-A and A-D converters shown in FIGS. 1, 2, 4 and 5. In this embodiment, since a current value is used as a reference value, resistor 13 is not provided. Reset means 15 is comprised of a reset switch 19 for short-circuiting the both ends of the capacitor 12 in order to reset an integral output of the operational amplifier 11 functioning as an integrator. Further, time control means 21 is comprised of a timing controller 22 adapted to receive a digital input 6 to output a switching control signal to the switch 31. In addition, clock generation means 25A–25N for generating a plurality of clock signals to deliver them to the timing controller 22 are constituted with first and second clock generation circuits 25a and 25b for generating and outputting two clock signals having periods which are different from each other, and such that the time length relationship therebetween is permitted to be indicated by an integer ratio.

The operation of the D-A converter constructed as above shown in FIG. 11 will now be described by using FIGS. 12(a)–12(c).

First, when the reset switch 19 is closed, an integral value is reset. Then, the switch 31 is sequentially switched in such an order of an integration term $T_1$ as an integration time period, synchronizing term and integration term $T_2$ shown in FIG. 12(a) by a control signal from the timing controller 22. As reference current $I_{ref}$ outputted from reference current generation means 8A, various reference currents are conceivable in connection with both the current direction and the current value. In the second to fifth embodiments which will be described below, various current sources will be explained. Explanation will be given on the assumption that, as the fundamental operation of the D-A converter disclosed in the first embodiment, reference currents $+I_{ref}$ and $-I_{ref}$ having two positive and negative directions are outputted from the reference current generation means 8A. For a time period $T_1$ during which the switch 31 is closed and integration is carried out by the first reference clock $C_1$, reference current $+I_{ref}$ in the positive direction is delivered to the integration means 10. When the clock $C_1$ is counted a predetermined number of times, the switch 31 is opened. Further, when the switch 31 is closed for a second time in a manner caused to be synchronous with the reference clock $C_2$, negative reference current $-I_{ref}$ having a direction opposite to that of the reference current $+I_{ref}$ is outputted from the reference current generation means 8A. When the capacitance of the capacitor 12 is assumed to be C, an integral voltage value $V_0$ of the analog output 16 at this time is calculated by the following formula (8):

$$V_0 = \frac{I_{ref} \times T_1}{C} + \frac{(-I_{ref}) \times T_2}{C} \qquad (8)$$

As shown in FIGS. 12(b) and 12(c), the periods $t_1$ and $t_2$ of the reference clocks $C_1$ and $C_2$ have the relationship expressed as "$t_1:t_2=10:9$" in the first embodiment. Accordingly, a minimum value $\Delta t$ in this case is expressed as "$t=(1/9)\cdot t_2$" (p and q are equal to 1). Thus, it is possible to set an integral time T of "1/10" of $t_1$. It is seen from this that the conversion resolution equivalent to that of D-A converters of the conventional type using a reference clock of a period of $(1/10)\cdot t_1$ can be provided without use of reference clock having the period of "$(1/10)\cdot t_1$". At this time, arbitrary integers n and m to be substituted into the formulas (3) and (7) can be calculated by the following formula (9):

$$n = \text{int}\left(\frac{T}{t_1}\right) + \frac{T - \text{int}\left(\frac{T}{t_1}\right) \times t_1}{\Delta t} \\ m = \frac{T - \text{int}\left(\frac{T}{t_1}\right) \times t_1}{\Delta t} \qquad (9)$$

In the above formula, int $$\left(\frac{T}{t_1}\right)$$

means the integer portion of $T/t_1$

By employing integers n and m as indicated by the above-mentioned formula (9), it is possible to set T with $\Delta t$ being as a unit. At this time, in the case of attempting to obtain analog value 2.3, when $T=2.3$, $t_1=1.0$, $t_2=0.9$ and $\Delta t=t_1-t_2=0.1$ are substituted into the formula (9), n and m are equal to 5 and 3, respectively.

A change of an integral value in the case where integration is carried out by using n and m is shown in FIG. 12(a). Since the period of the first reference clock $C_1$ is $t_1$ and the period of the second reference clock $C_2$ is $t_2$, a current of $+I_{ref}$ outputted from the reference current source 8A shown in FIG. 11 is used to integrate the first reference clock $C_1$ by n=5 counts. Further, after synchronization for switching the reference clock is provided during the synchronizing term, a reference current $-I_{ref}$ in a direction opposite to the above is used to integrate the second reference clock $C_2$ by m=3 counts. As stated above, a plurality of reference clocks are combined to thereby control the integral time, thus making it possible to output analog value 2.3.

As stated above, the switch 31 constituting the connection means 30 is controlled by two clocks having different periods, thereby making it possible to set the resolution $\Delta T$ of the integral time T by the resolution of "$T_1-T_2$". Namely, by selecting n and m so that "$X \times \Delta t=T_1-T_2$" holds, it is possible to carry out D-A conversion with $\Delta t$ being as resolution. In addition, the frequencies $f_1$ and $f_2$ of the reference clocks can be a frequency far lower than a frequency determined by $1/\Delta t$.

When the above-mentioned X is decimal number and is written as $X=a\cdot b$, n is equal to $a+b$ and m is equal to b. Thus, n and m can be simply determined. Namely, when $\Delta t$ and $t_1$ are selected so that they are equal to the y-th power of 10 (y is an integer), it becomes very easy to determine n and m. Similarly, in the case where X is expressed by the binary number, if $\Delta t$ and $t_1$ are selected so that they are equal to the y-th power of 2 (y is an integer), it is possible to simply determine n and m.

Figure 13:
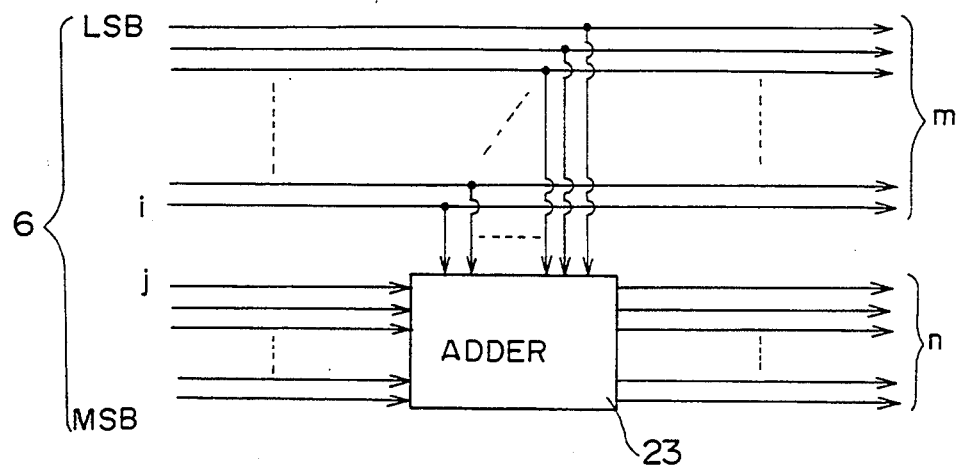
FIG. 13 is a conceptual view showing an example of the configuration of a timing controller in the D-A converter according to the first embodiment.

FIG. 13 shows, in a conceptual manner, an example of the configuration of the timing controller 22 for determining a plurality of reference clocks in the first embodiment. In this example, selection is made such that the relationship expressed as "$t_1/\Delta t = 2^i$" holds. Bits from the Most Significant Bit (MSB) to the Least Significant Bit (LSB) of the digital input 6 are shown in such a manner that they are arranged from the bottom to the top of FIG. 13 for convenience. In this case, it is sufficient that, as the number of counts m of the second reference clock, the lower order i bits (bit train from LSB up to the i-th bit) of the digital input 6 are used as binary representation as they are. Further, as the number of counts n of the first reference clock, it is sufficient to use the result obtained by binary-adding, by using an adder 23, the higher order bits except for the lower order i bits (bit train from the lower order j=(i+1)-th bit up to MSB) and the lower order i bits as binary representation as it is. As stated above, in the case where X is binary representation, it is possible to simply calculate the number of counts n and m of the reference clocks by using the digital input 6.

In the case where p and q are not equal to $\mp 1$", the following formula (10) is used:

$$\left. \begin{array}{l} n = \mathrm{int}\left(\dfrac{T}{t_1}\right) + \dfrac{T - \mathrm{int}\left(\dfrac{T}{t_1}\right) \times t_1}{\Delta t} \times p \\ \\ m = \dfrac{T - \mathrm{int}\left(\dfrac{T}{t_1}\right) \times t_1}{\Delta t} \times q \end{array} \right\} \quad (10)$$

If p and q are substituted into the formula (10) and n and m are selected, a target T can be obtained. There are a large number of combinations of n and m except for the above. If n and m are set so as to satisfy "$T = X/\Delta t$", the roles of $T_1$ and $T_2$ may be opposite to each other.

Figure 14:
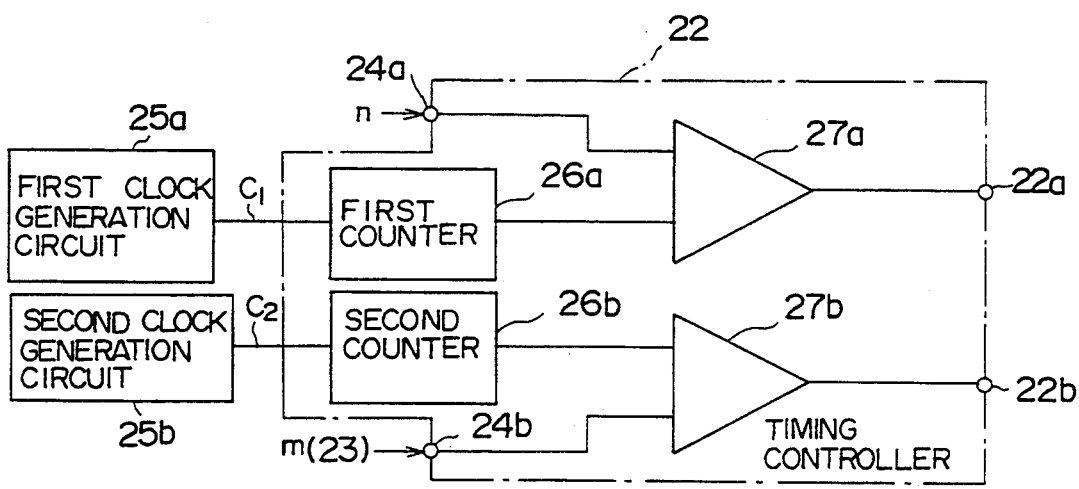
FIG. 14 is a block diagram showing an actual example of a timing controller in the D-A converter according to the first embodiment of this invention.

An actual configuration of the timing controller 22 in the D-A converter according to the first embodiment is shown in FIG. 14. In FIG. 14, the controller 22 comprises a first counter 26a supplied with reference clock $C_1$ having period $t_1$ from first clock generation circuit 25a; a second counter 26b supplied with reference clock $C_2$ having period $t_2$ from second clock generation circuit 25b; a terminal 24a supplied with an output of the adder 23; a terminal 24b supplied with digital data from the Least Significant Bit (LSB) to the i-th bit; a first comparator 27a having an integer n inputted through the terminal 24a as one input, and the number of counts of the reference clock $C_1$ that the first counter 26a has counted as the other input, and adapted for comparing two inputs to output, to the switch 31 through the terminal 22a, a control signal for delivering a reference current $+I_{ref}$ in a positive direction to the integration means 10 until they are in correspondence with each other; and a second comparator 27b having an integer m delivered through the terminal 24b as one input and the number of counts of the second reference clock $C_2$ that the second counter 26b has counted as the other input, and adapted for comparing two inputs to output, to the switch 31 through the terminal 22b, a control signal for delivering a reference current $-I_{ref}$ in a negative direction to the integration means 10 until they are in correspondence with each other. The control signals outputted from the first and second comparators 27a and 27b serve as timing signals for allowing respective reference currents to be passed by predetermined time periods $T_1$ and $T_2$ when the values n and m of integer inputted and the count values are in correspondence with each other, respectively.

A D-A converter according to the second embodiment of this invention will now be described by using FIGS. 15-16(c). The D-A converter of the second embodiment shows the detailed configuration of the reference current generation means 8A in the first embodiment, i.e., includes a current source 81 for generating a reference current $+I_{ref}$ in a positive direction, and a current source 82 for generating a reference current $-I_{ref}$ in a negative direction. Further, the connection means 30 includes a movable contact 32A, a fixed contact 32a for supply of reference current $+I_{ref}$ and a fixed contact 32b for supply of reference current $-I_{ref}$. Other components are the same as those of the D-A converter according to the first embodiment.

The operation of the D-A converter according to the second embodiment constructed as above will now be described by using FIGS. 16(a)-16(c).

First, the reset switch 19 is closed, so an output of the integration means 10 is initialized. After the reset switch 19 is opened, the movable contact 32A of the switch 32 of the connection means 30 is caused to be in contact with the fixed contact 32a by the first clock $C_1$ to carry out an integrating operation by the first reference current $+I_{ref}$ until a desired integral voltage (4.2 in the case of this embodiment) is provided. When the first clock $C_1$ is counted a predetermined number of times, the movable contact 32A is caused to be turned OFF in order to stop integration by the first reference current $+I_{ref}$. For a time period until the second clock $C_2$ rises, the movable contact 32A is in the state where it is not in contact with any contact, and the synchronizing term elapses. When the second clock $C_2$ rises, the movable contact 32A comes into contact with the fixed contact 32b to carry out integration in an opposite direction by the second reference current $-V_{ref}$. By repeatedly carrying out such an operation, an integrated output when the fixed contact 32a side is in an OFF state decreases in proportion to $(t_2 - t_1)$, and eventually converges into the level of output 4.2.

Assuming now that the first reference current is $I_{ref}$, the time during which the first reference current $I_{ref}$ is first integrated is $T_1$, and the number of times of repetitive integrating operations carried out in both positive and negative directions is M, an analog integral voltage $V_0$ can be calculated by the following formula (11):

$$V_0 = \frac{I_{ref} \times T_1}{C} - \frac{(t_2 - t_1) \times I_{ref} \times M}{C} \quad (11)$$

An integral voltage at this time is shown in FIG. 16(a), and a first clock $C_1$ and a second clock $C_2$ are respectively shown in FIGS. 16(b) and 16(c). Even if an approach is employed to control the switch 32 by using two reference clocks having different periods so as to carry out an integrating operation bit by bit in both positive and negative directions, an integration control similar to that of the first embodiment is carried out.

Figure 17:
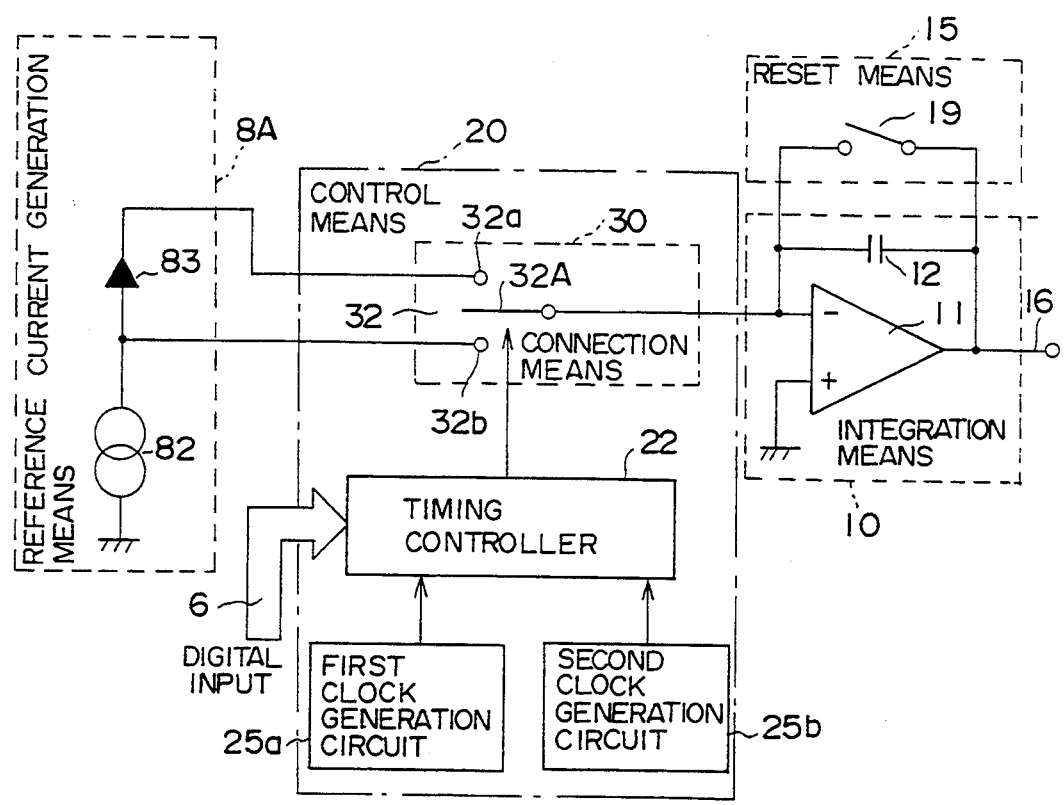
FIG. 17 is a block diagram showing the outline of the configuration of a D-A converter according to a third embodiment of this invention.

A D-A converter according to a third embodiment of this invention will now be described by using FIG. 17. The third embodiment differs from the second embodiment only in the configuration of the reference current generation means 8A. Namely, in the second embodiment, such a control was conducted to output reference currents in both positive and negative directions by current sources 81 and 82 to switch the integral direction. On the contrary, in the third embodiment, there is employed a configuration such that current source 82 outputs a reference current $-I_{ref}$ only in a negative direction to fixed contact 32b of switch 32 to output, to fixed contact 32a of switch 32, a reference current $+I_{ref}$ in a positive direction obtained by inverting the reference current $-I_{ref}$ by using an inverter 83 serving as an inverting element.

The operation of the D-A converter of the third embodiment can be applied both to the system of collectively carrying out integration every integration time periods $T_1$ and $T_2$ as in the first embodiment and to the system of carrying out integration in a positive direction until time period $T_1$ thereafter to carry out chopping repetitive integration in order of the synchronizing term, integration in negative direction, the synchronizing term and the integration in positive direction as in the second embodiment.

Figure 18:
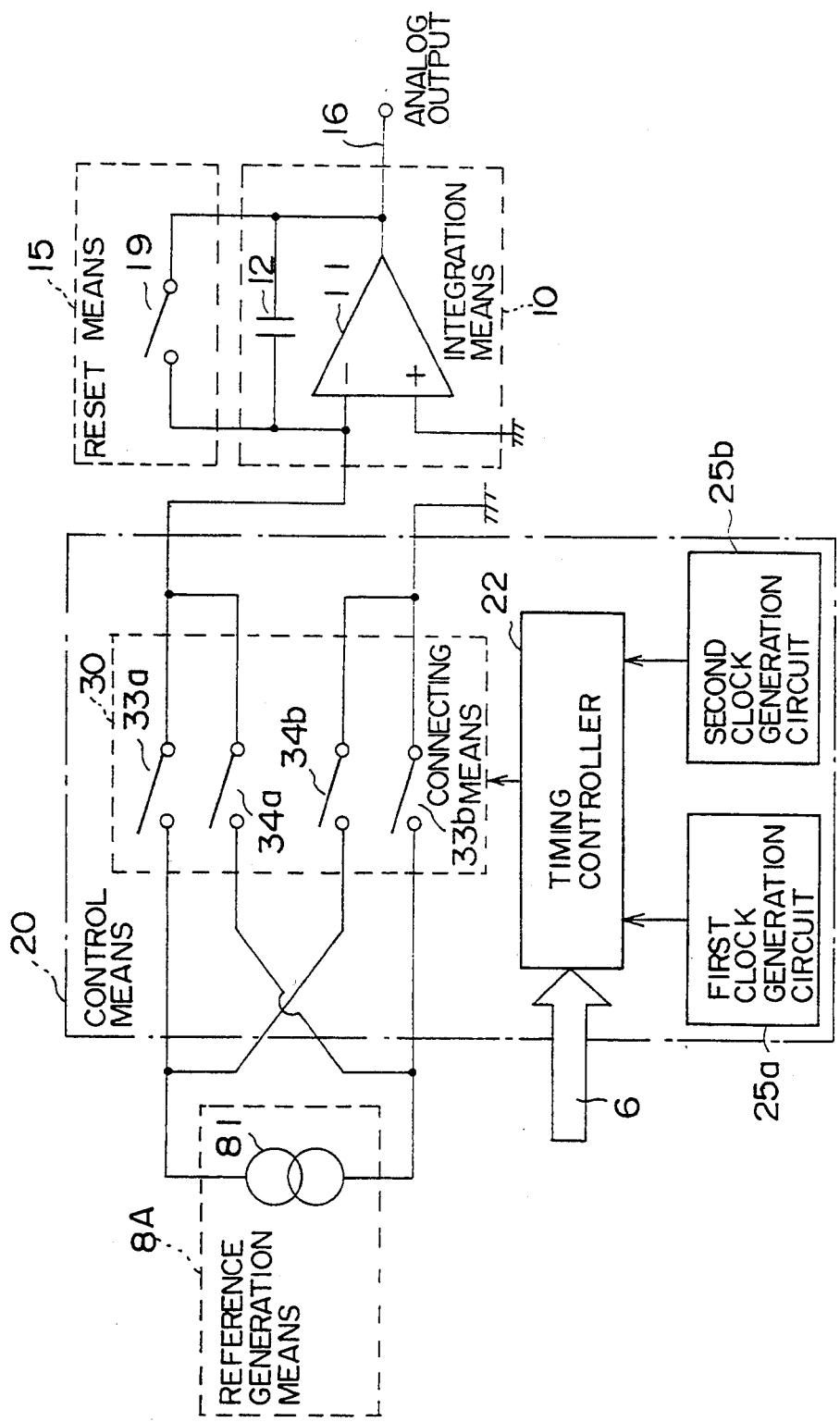
FIG. 18 is a block diagram showing the outline of the configuration of-a D-A converter according to a fourth embodiment of this invention.

A D-A converter according to a fourth embodiment of this invention will now be described by using FIG. 18. The D-A converter according to the fourth embodiment has the configuration that reference current generation means 8A serving as reference value generation means includes a single current source 81, and connection means 30 includes four switches 33a, 33b, 34a and 34b through wirings of the cross bar type. Particularly, this embodiment is characterized in that even if only a single current in a positive direction is outputted by the cross bar wirings and two pairs of switches for switching them, it is possible to deliver reference currents in both positive and negative directions to the integration means 10 every predetermined time. Other components are the same as those of the D-A converters according to the first to third embodiments.

The operation of the D-A converter of the fourth embodiment constructed as above will now be described. Also in the D-A converter according to the fourth embodiment, similarly to the D-A converters of the first and second embodiments, reference currents in both positive and negative directions are used to carry out switching control of switches 33a–34b of the connection means 30 by first and second reference clocks $C_1$ and $C_2$ by using reference currents in both positive and negative directions to carry out integration to provide an analog output 16. Accordingly, with respect to the switching timing of the integral times $T_1$ and $T_2$, as in the case of the integrating operation of the first embodiment which has been explained by using FIGS. 12(a)–12(c), such an operation can be conducted to control the integration term $T_1$ by the first clock $C_1$ having period $t_1$ by using the reference current $+I_{ref}$ in the positive direction to control the integration term $T_2$ by using the reference current $-I_{ref}$ in the negative direction by the second clock $C_2$ having period $t_2$ through the synchronizing term. Further, as in the case of the operation of the second embodiment which has been described by using FIGS. 16(a)–16(c), such a control may be conducted to carry out integration with respect to the reference current $+I_{ref}$ in positive direction with a time period during which a predetermined number of times are counted on the basis of the period $t_1$ of the first clock $C_1$ being as the integral time $T_1$ thereafter to carry out chopping repetitive integrating operation in such an order of the synchronizing term period, the integration term $T_2$, the synchronizing term, the integration term $T_1$ - - - .

While switching of the integral time may be carried out by any one of methods described above, synchronous switching of two pairs of switches 33a–34b will be conducted by the cross bar wiring as follows.

Assuming now that the switch for the reference current $+I_{ref}$ in the positive direction is designated at 33a and 33b, and the switch for the reference current $-I_{ref}$ in the negative direction is designated at 34a and 34b, the first clock $C_1$ used for the integration term $T_1$ is delivered to the integration means 10 by closing the switches 33a and 33b. Further, the switches 34a and 34b are closed by a control signal based on the second clock $C_2$ used for the integration term $T_2$, so a reference current $-I_{ref}$ in negative direction is delivered to the integration means 10. Since reference currents in both positive and negative directions are delivered every respective integration time periods in this way, either the integrating operation of FIGS. 12(a)–12(c) or that of FIGS. 16(a)–16(c) will be carried out.

A D-A converter according to a fifth embodiment of this invention will now be described by using FIG. 19. The D-A converter of the fifth embodiment differs from the first to fourth embodiments in that the integration means 10 is comprised of a full differential type operational amplifier. Accordingly, in FIG. 19, the integration means 10 comprises a full differential type operational amplifier 11A, a capacitor 12a provided at the bus line on the side of switches 33a and 34a, and a capacitor 12b provided at the bus line on the side of switches 33b and 34b. Because of the fact that the integration means 10 includes capacitors 12a and 12b, the reset means 15 also includes two reset switches 19a and 19b. The full differential type operation amplifier 11A has two integral outputs. Accordingly, in order to reset respective outputs, the reset switch 19a is closed to short-circuit the both ends of the capacitor 12a to clear one output of the amplifier 11A, and the reset switch 19b is closed to short-circuit the both ends of the capacitor 12b to clear the other output. Since other components are the same as those of the above-described embodiments, particularly the fourth embodiment, the repetitive explanation is omitted.

The D-A converter according to the fifth embodiment constructed as above is also permitted to carry out respective integrating operations by assignment of respective integral times (integration terms) as shown in FIGS. 12(a)–12(c) or FIGS. 16(a)–16(c). Switching of the integral time (integration term) at this time is carried out by closing two pairs of switches 33a and 33b, and 34a and 34b of the connection means 30 every respective pairs similarly to the fourth embodiment. Further, switching control of the connection means 30 is carried out by using clocks $C_1$ and $C_2$ respectively having periods $t_1$ and $t_2$ similarly to the fourth embodiment.

The integrating operation of the D-A converter including full differential type operational amplifier 11A according to the fifth embodiment shown in FIGS. 19 will now be described. Similarly to the fourth embodiment, switches 33a–34b of the connection means 30 are controlled by the timing controller 22 for outputting a control signal to switch the reference current in both positive and negative directions on the basis of first and second clocks $C_1$ and $C_2$. An analog output of the integration means 10 varies at a ratio of "$(I_{ref}/C)$" when the switches 33a and 33b are in an ON state, and varies at a ratio of "$-(I_{ref}/C)$" when the switches 34a and 34b are in an ON state. Accordingly, an integral value $V_0$ of the analog output 16 of the integration means 10 when the first set of switches 33a and 33b are turned ON for the integration term $T_1$ and the second set of switches 34a and 34b are turned ON for the integration term $T_2$ is as indicated by the following formula (12). D-A conversion is carried out in accordance with this formula:

$$V_0 = (I_{ref}/C) \times T_1 - (I_{ref}/C) \times T_2 \qquad (12)$$

A D-A converter according to a sixth embodiment of this invention will now be described by using FIGS. 20–23. Since the D-A converter according to the sixth embodiment uses a reference current as a reference value, but the current is caused to be unidirectional, the integral voltage (analog output 16) is also unidirectional as shown in FIG. 21.

Figure 19:
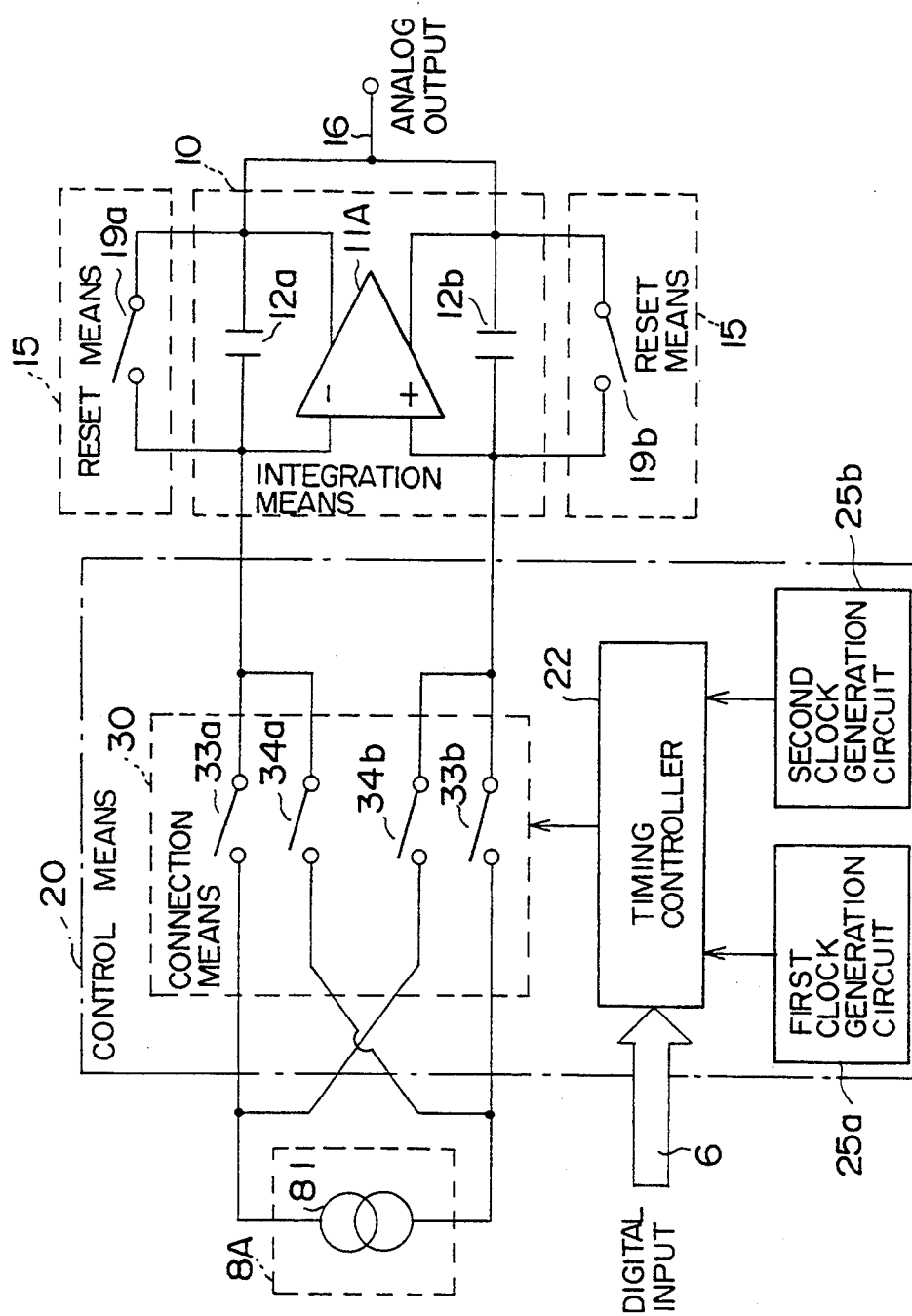
FIG. 19 is a block diagram showing the outline of the configuration of a D-A converter according to a fifth embodiment of this invention.
Figure 20:
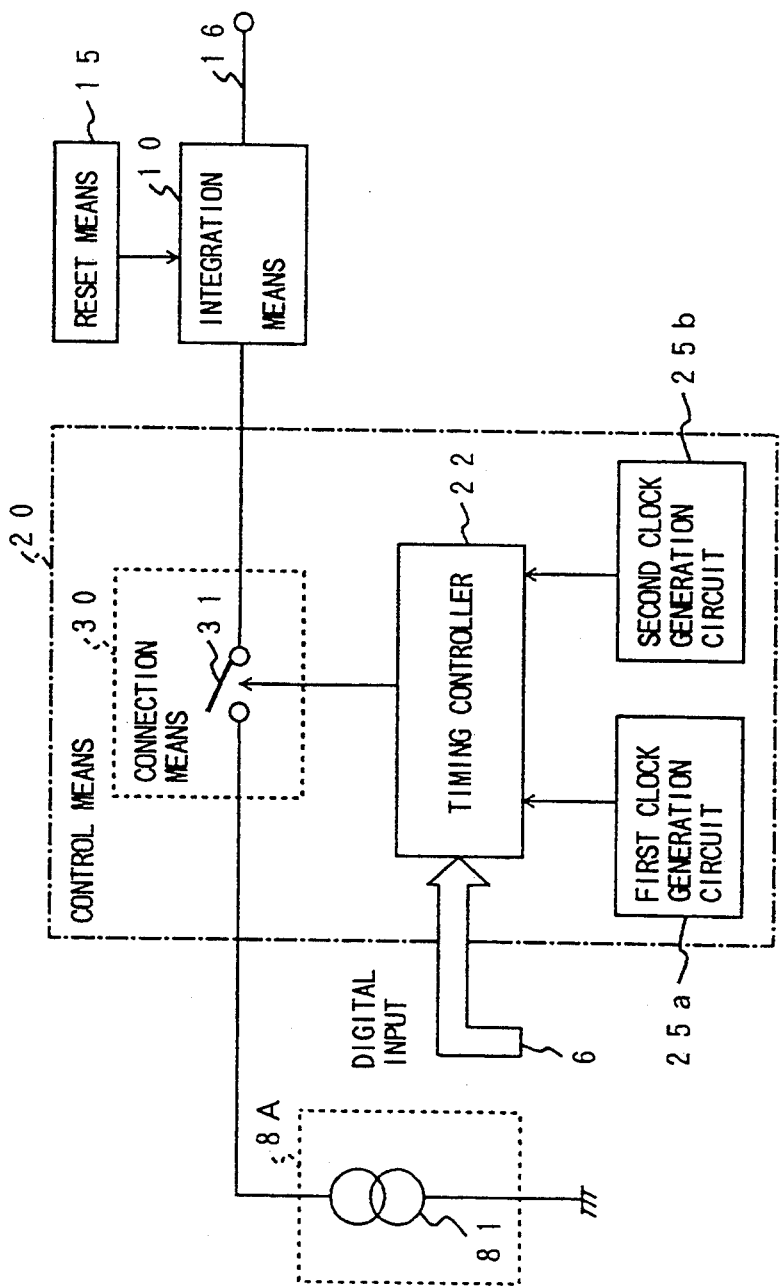
FIG. 20 is a block diagram showing the outline of the configuration of a D-A converter according to a sixth embodiment of this invention.
Figure 21:
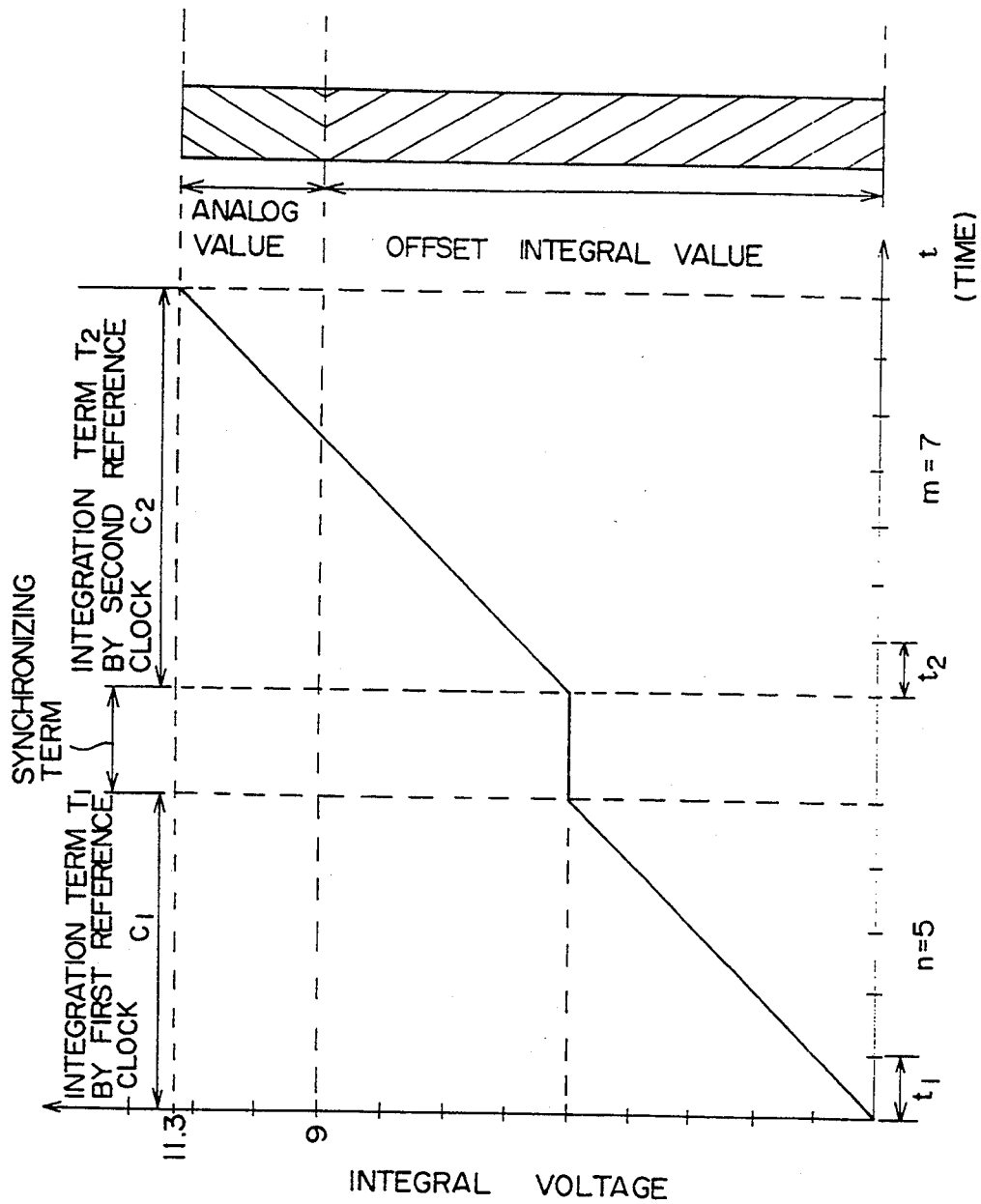
FIG. 21 is a characteristic diagram showing an integral voltage of the D-A converter according to the sixth embodiment.

The configuration of the D-A converter according to the sixth embodiment will be first described by using FIG. 20. The D-A converter of the sixth embodiment includes, as reference current generation means 8A, a single current source 81 adapted for outputting a reference current only in one direction. The connection means 30 includes a single switch 31 for carrying out switching between respective integration terms $T_1$ and $T_2$ through the synchronizing term located therebetween in point of time on the basis of first and second clocks $C_1$ and $C_2$. Although the detailed configuration of the integration means 10 is not shown in FIG. 20, it may be constituted with operational amplifier 11 and capacitor 12 as in the first embodiment shown in FIG. 11, or may be constituted with full differential type operational amplifier 11A and capacitors 12a and 12b as in the fifth embodiment shown in FIG. 19.

The operation of the D-A converter according to the sixth embodiment will now be described by using FIG. 21. Since an input to the integration means 10 is subjected to switching such that it is connected to reference current source 81 or is cut off therefrom by means of switch 31 of the connection means 30, the integration means 10 carries out respective operations in the integration mode and in the hold mode by means of the switch 31. On the assumption that frequencies and periods of first and second reference clocks $C_1$ and $C_2$ outputted from different first and second clock generation circuits 25a and 25b are respectively $f_1$, $f_2$ and $t_1$, $t_2$, and the minimum time resolution $\Delta t$ is set to a minimum value (p and q are an arbitrary integer) of "$|p \times t_1 - q \times t_2|$", the operation will now be described.

Before the integrating operation is carried out, an integral value of the integration means 10 is first cleared by the reset means 15. When the switch 31 is turned ON, integration is carried out only for time period $T_1$ expressed as "$T_1 = t_1 \times n$" by the first reference clock $C_1$, and the operation enters the synchronizing term when the switch 31 is turned OFF. When the switch 31 is turned ON for a second time after synchronization of the second clock $C_2$ is established, integration is carried out by an integral time $T_2$ during which the clock $C_2$ is counted a predetermined number of times m, i.e., "$T_2 = t_2 \times m$" (See FIG. 21).

By controlling the connection means 30 by using two reference clocks $C_1$ and $C_2$ of different periods and frequencies in this way, it is possible to set the total integral time T (i.e., "$T = T_1 + T_2$") with the resolution of $\Delta t$. Namely, by selecting arbitrary integers n and m so that "$X \times \Delta t = T_1 + T_2$" holds, it is possible to carry out D-A conversion with $\Delta t$ being as the resolution. In addition, similarly to the explanation which has been given until now, it is sufficient that frequencies $f_1$ and $f_2$ of the reference clocks $C_1$ and $C_2$ are frequencies far lower than a frequency determined by $1/\Delta t$.

The operation of the timing controller 22 will now be described. The timing controller 22 allows the switch 31 to be turned ON by using the period $t_1$ of the first reference clock $C_1$ to thereby generate (set) an integral time $t_1$, and similarly allows the switch 31 to be turned ON by using the period $t_2$ of the second reference clock $C_2$ to thereby generate (set) an integral time $T_2$. At this time, the following formula (13) is used to thereby determine arbitrary integers n and m, thus making it possible to set an integral time T which is sum of $T_1$ and $T_2$ determined by multiplicative operation of those integers and the periods with $\Delta t$ being as a unit.

$$\left. \begin{array}{l} n = \text{int}\left(\dfrac{T}{t_1}\right) + \dfrac{T - \text{int}\left(\dfrac{T}{t_1}\right) \times t_1}{\Delta t} \times p \\[2ex] m = \dfrac{t_p}{t_2} - \dfrac{T - \text{int}\left(\dfrac{T}{t_1}\right) \times t_1}{\Delta t} \times q \end{array} \right\} \qquad (13)$$

In the above formula, $t_p$ is a least common denominator of $t_1$ and $t_2$, and int [X] is the integer part of X.

Here, it should be noted that an output of the integration means 10 does not represent an analog output which has been subjected to D-A conversion as it is. In this case, there is provided a value in which an offset integral value corresponding to the least common denominator $t_p$ of the periods $t_1$ and $t_2$ of the reference clocks $C_1$ and $C_2$ is added to an integrator output. This offset integral value may be arbitrarily selected by multiplying a least common denominator of the reference clocks by constant, or the like.

While explanation will be given on the assumption that the periods of the reference clocks are expressed as "$t_1 = 1.0$, $t_2 = 0.9$" for the brevity of explanation, the periods $t_1$ and $t_2$ may take any other value except for the above. In this case, the minimum time resolution $\Delta t$ is equal to 0.1 when p and q are both "1". Thus, it is possible to set T which is a multiple of integer of 0.1. At this time, in order to output analog value "$T = 2.3$", when $T = 2.3$, $t_1 = 1.0$, $t_2 = 0.9$ and "$\Delta t = t_1 - t_2 = 0.1$" are substituted into the above-mentioned formula (13), n = 5 and m = 7 are provided. There exist combinations of n and m except for the above. It is sufficient to set n and m so that $T = X \times \Delta t$ holds. In addition, the roles of $T_1$ and $T_2$ may be opposite to each other.

A change of an output of the integration means 10 at this time is shown in FIG. 21. During the integral time (integration term) $T_1$ obtained by counting the first reference clock $C_1$ having period $t_1$ so that the number of counts "n = 5" is provided, the reference current $I_{ref}$ is integrated to allow the switch 31 to be turned OFF on completion of count to enter the synchronizing term. For this synchronizing term, in synchronism with the rise of the second reference clock $C_2$, the integral time (integration term) $T_2$ by the second reference clock $C_2$ begins. This integral time $T_2$ is a time determined by product of the period $t_2$ of the second reference clock $C_2$ and the number of counts "m=7". In the sixth embodiment, the reference current $I_{ref}$ takes a single direction, and an integral voltage in the same direction shown in FIG. 21 is outputted. As a result, an integral value outputted takes a value greater than an analog value to be converted. This is because the above-mentioned offset integral value is superimposed. Namely, an integral value of a time $t_3$ corresponding to the least common denominator of the periods $t_1$ and $t_2$ of the different reference clocks $C_1$ and $C_2$ is added. In this example, since $t_1$ is 1.0 and $t_2$ is 0.9, the time $t_3$ becomes equal to 9. Accordingly, in FIG. 21, by subtracting offset integral value 9 from integral value 11.3 integrated by the reference clocks $C_1$ and $C_2$, it is possible to output analog value 2.3.

Similarly to the case of the first to fifth embodiments which has been described on the premise that the reference current has both directions, it is possible to easily determine X of "T=X×Δt". In the case where X is decimal number and is expressed as "X=a·b, n and m are respectively expressed as "n=a+b" and "m=10−b". Thus, it is possible to simply determine them. Namely, if Δt and $t_1$ are selected so that they are y-th power (y is an integer) of 10, it extremely becomes easy to determine n and m. Similarly, in the case where X is expressed by binary notation, if Δt and $t_1$ are selected so that they are equal to $2^y$, it is possible to simply determine n and m.

The detailed configuration of the timing controller 22 in the D-A converter of the sixth embodiment is shown in FIGS. 22 and 23. Since FIGS. 22 and 23 respectively correspond to FIGS. 13 and 14 showing the detailed configuration of the timing controller in the first embodiment, explanation will be given with the same reference numerals being respectively used for the same or corresponding components. When "$t_1/\Delta t = 2^p$" is assumed to hold similarly to the first embodiment, in the case where bits from the Most Significant Bit (MSB) to the Least Significant Bit (LSB) of the digital input 6 are shown in such a manner that they are arranged from the bottom to the top of FIG. 22 for convenience similarly to the description of FIG. 13, it is sufficient for the number of counts n which is an arbitrary integer to use the result obtained by binary-adding, by using an adder 23, the number of bits of the bit train from LSB to the i-th bit and the bit train from (i+1)=j-th bit to MSB as the binary representation as it is. In FIG. 13, the number of bits from LSB to the i-th bit was used as the number of counts m. On the contrary, in FIG. 22 showing the sixth embodiment, it is sufficient to use, as the binary representation, the result obtained by subtracting the lower order i bits (from LSB to the i-th bit) from the bit train of the i-th power of 2 ($2^i$) by using a subtracter 23a. As stated above, in the case where X is binary representation, it is possible to simply calculate the number of counts n and m of the reference clocks by using a portion of the digital input 16.

Since the timing controller 22 used in the D-A converter of the sixth embodiment shown in FIG. 23 has a configuration similar to that of the controller 22 of the first embodiment shown in FIG. 14, the same reference numerals are attached to the same components and the repetitive explanation is omitted. In FIG. 23, first and second reference clocks $C_1$ and $C_2$ outputted from the first and second clock generation circuits 25a and 25b are counted by first and second counters 26a and 26b, respectively. Respective count values of the counters 26a and 26b are respectively compared with count set values n and m determined by the principle of FIG. 22 at first and second comparators 27a and 27b. Thus, respective comparison results are outputted to a logical sum circuit 28. The logical sum circuit 28 inputs respective comparison results of the comparators 27a and 27b to perform logical sum operation to output the operation result as a timing signal from output terminal 29. By this timing signal, integral times $T_1$ and $T_2$ are determined.

In the sixth embodiment, the numbers of reference currents and switches for controlling integration means which are used are both one. Accordingly, there is the merit that any error in the D-A conversion resulting from a relative error between current sources and between switches does not take place as compared to the configuration using a plurality of reference currents and a plurality of switches. Further, since the direction of the integral voltage can be realized by only one direction, the number of circuit elements can be reduced, and occurrence of an error in the D-A conversion due to imperfection, etc. of elements can be prevented.

The seventh to twelfth embodiments in which the reference value generation means 8 of FIG. 7 is constituted with reference voltage generation means will now be described by using FIGS. 24–29.

Figure 24:
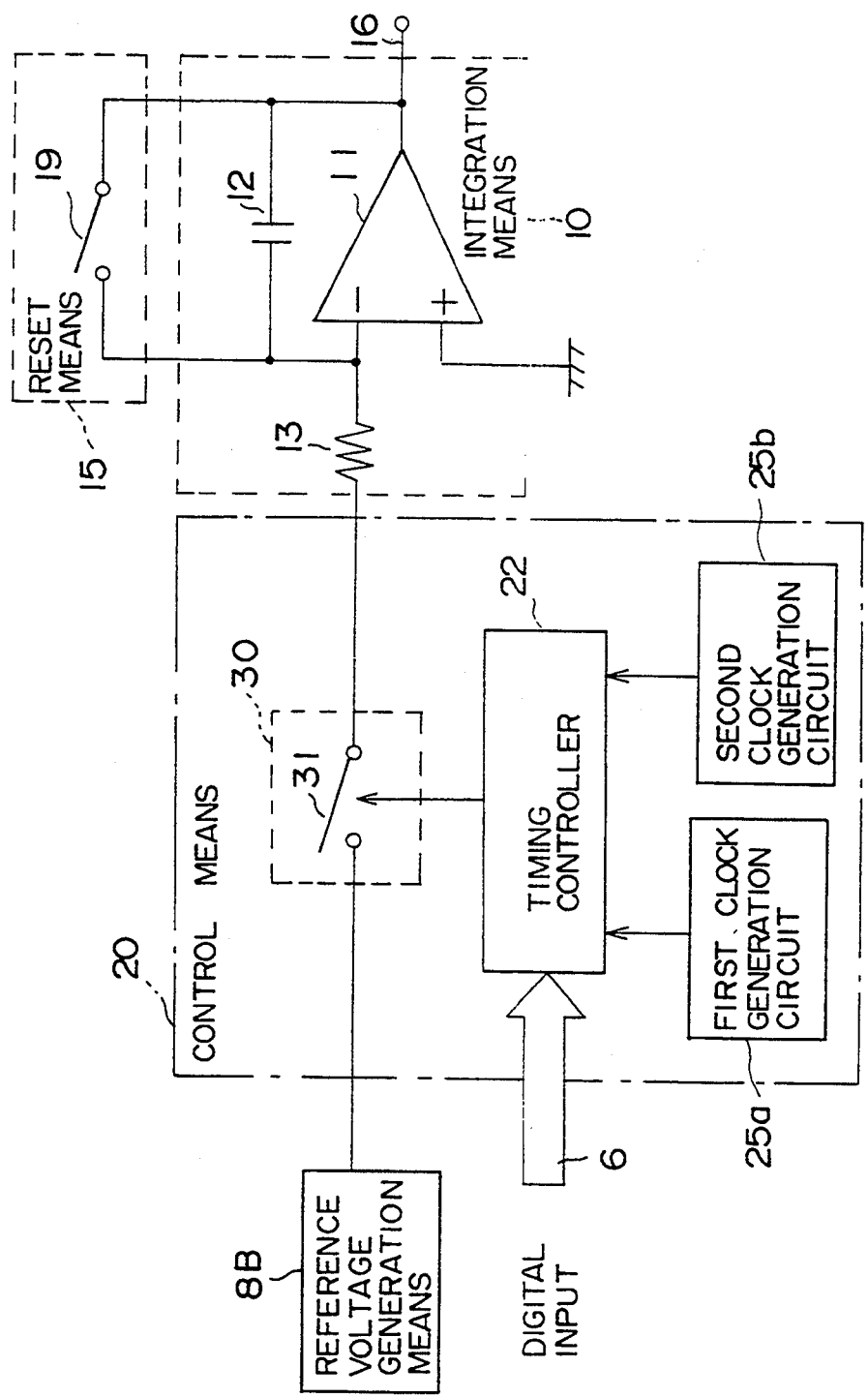
FIG. 24 is a block diagram showing the outline of the configuration of a D-A converter according to a seventh embodiment of this invention.

FIG. 24 shows the outline of the configuration of the seventh embodiment as the fundamental embodiment for generating a reference value by the voltage source. In FIG. 24, the reference value generation means is comprised of reference voltage generation means 8B. The control means 20 comprises a timing controller 22 supplied with a digital input 6, first and second clock generation circuits 25a and 25b for delivering first and second reference clocks $C_1$ and $C_2$ having different periods to the timing controller 22, a switch 31 for carrying out ON/OFF of supply of a reference voltage from the reference voltage generation means 8B to the integration means 10 by a timing signal that the timing controller 22 outputs on the basis of the digital input 6, and the first and second reference clocks $C_1$ and $C_2$ in accordance with the procedure as described above. Accordingly, in the seventh embodiment, the connection means 30 is comprised of the switch 31, and switching between integral times $T_1$ and $T_2$ is carried out by this switch 31.

The configuration of the integration means 10 and the reset means 15 will now be described. In the seventh embodiment where the reference value is a reference voltage, the integration means 10 comprises an operational amplifier 11, a capacitor 12, and a resistor 13. Further, reset means 15 is comprised of a reset switch 19 similarly to the first to fifth embodiments which have been already described.

The operation of the D-A converter of the seventh embodiment constructed as above will now be described. With respect to respective periods $t_1$ and $t_2$ of the first and second reference clocks $C_1$ and $C_2$, even if the ratio therebetween is set to 10:9 in the same manner as in the first embodiment, or is set to 4:1 as in FIGS. 8(b) and 8(c) which have been described in connection with the fundamental concept, the fundamental operation of the D-A converter according to this invention can be carried out. Further, the direction of the reference voltage may be either positive and negative directions or any one of positive and negative directions. It is to be noted that the integrating operation carried out in the integration means 10 is carried out as follows. Namely, since the integration means 10 includes resistor 13, an integral voltage $V_0$ can be calculated with the value of the resistor 13 being designated at R by the following formula (14) in place of the above-mentioned formula (8):

$$V_0 = \frac{\frac{V_{ref}}{R} \times T_1}{C} - \frac{\frac{V_{ref}}{R} \times T_2}{C} \quad (14)$$

Since other operations are the same as in the case where the reference value is obtained from the current source, the repetitive explanation is omitted.

Figure 25:
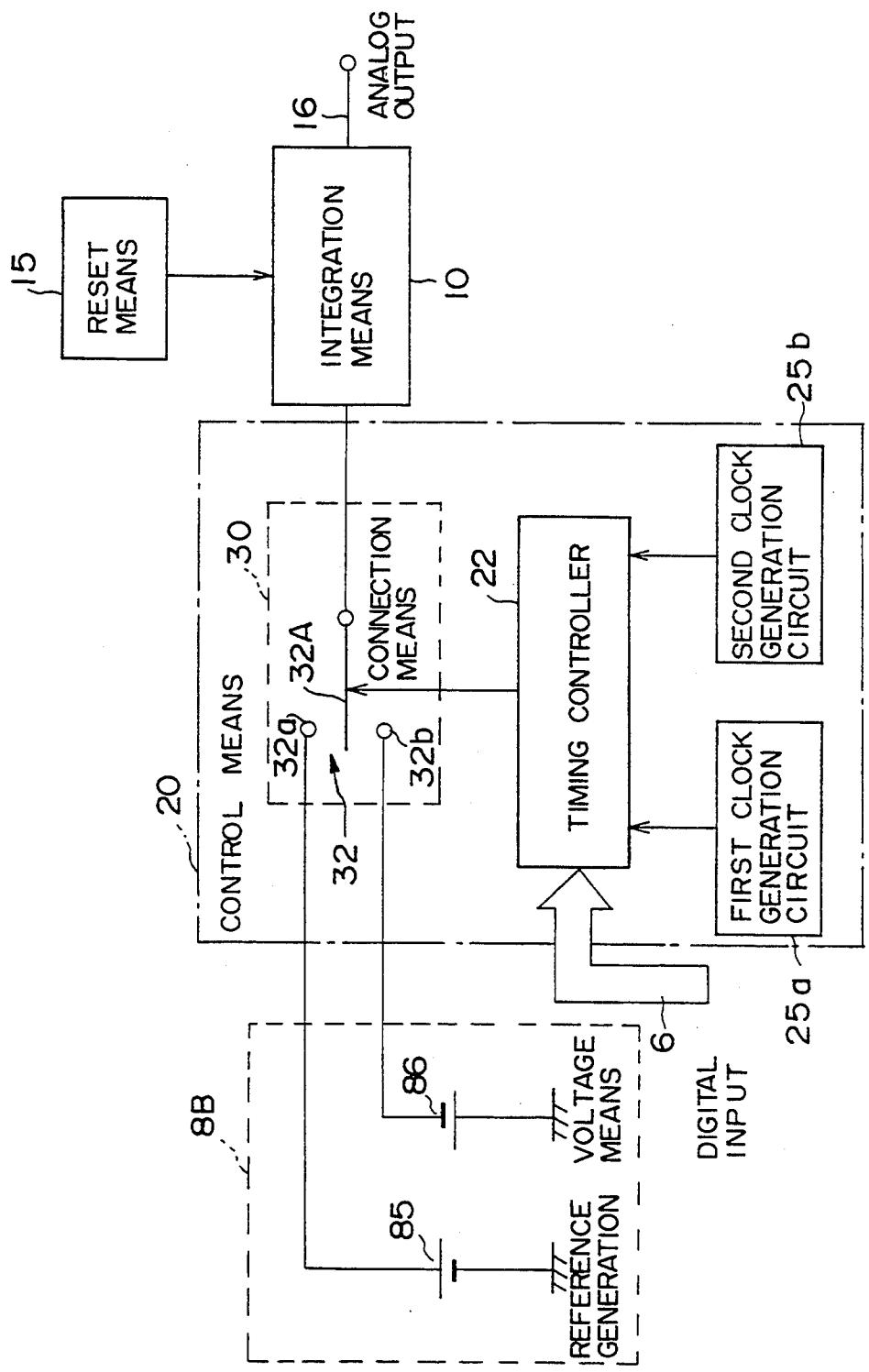
FIG. 25 is a block diagram showing the outline of the configuration of a D-A converter according to an eighth embodiment of this invention.

A D-A converter according to the eighth embodiment of this invention will now be described by using FIG. 25. In the eighth embodiment, the reference voltage generation means 8B in the D-A converter of the seventh embodiment is constituted with a positive direction voltage source 85 and a negative direction voltage source 86 for respectively generating voltages in both positive and negative directions. The D-A converter according to the eighth embodiment includes configuration similar to the integration means 10 and the reset means 15 that the D-A converter of the seventh embodiment shown in FIG. 24 has, i.e., operational amplifier 11, capacitor 12, resistor 13 and reset switch 19.

The operation of the eighth embodiment carried out on the basis of the above-mentioned configuration may be the same as the operation of the D-A converter of the first embodiment shown in FIGS. 12(a), 12(b) and 12(c), or may be the same as the operation of the D-A converter of the second embodiment shown in FIGS. 16(a), 16(b) and 16(c). Respective operations of the D-A converters of the first and second embodiments vary in dependency upon setting of respective periods $t_1$ and $t_2$ of the first and second reference clocks $C_1$ and $C_2$ and setting of the switching timing of the switch 32 constituting the connection means 30. While reference current is used as reference value in the first and second embodiments, the eighth embodiment differs therefrom in that the reference voltage is used as the reference value. Since the integration means 10 is a circuit having linear characteristic, the Ohm's Row can be applied thereto. Accordingly, by carrying out replacement of "I=V/R", the same operation is carried out as the integrating operation irrespective of current or voltage. It is to be noted that the integration means may be of the full differential type.

A D-A converter according to a ninth embodiment of this invention will now be described by using FIG. 26. The D-A converter of the ninth embodiment has the configuration of a power supply corresponding to the D-A converter according to the third embodiment shown in FIG. 17. Namely, in FIG. 26, reference voltage generation means 8B comprises a negative direction voltage supply 86 for generating a voltage in a negative direction, and an inverter 87 serving as an inverting element for inverting the direction of the reference voltage in the negative direction outputted from the voltage source 86 to output a voltage in a positive direction. Moreover, connection means 30 is comprised of a switch 32 including a movable contact 32A, a fixed contact 32a for the positive direction reference voltage, and a fixed contact 32b for the negative direction reference voltage. The timing controller 22 controls the movable contact 32A of the switch 32 by an output of the timing signal in such a manner that it is switched to any one of the both fixed contacts 32a and 32b (integration terms $T_1$ and $T_2$), or it does not come into contact with any contact (synchronizing term).

With respect to the integration terms $T_1$ and $T_2$ set by count values of the first and second reference clocks $C_1$ and $C_2$ and whether such switching is carried out collectively or bit by bit, it is possible to set in advance the operation of the ninth embodiment so as to carry out both operations of the system of FIGS. 12(a), 12(b) and 12(c) and the system of FIGS. 16(a), 16(b) and 16(c).

It is to be noted that the detailed configuration of the integration means 10 and the reset means 15 may have the same configuration as that of the D-A converter of the seventh embodiment shown in FIG. 24, or may be comprised of a full differential type operational amplifier as in the D-A converter according to the fifth embodiment shown in FIG. 19. In this case, the integration means 10 includes resistors between the capacitor 12a and the connection means 30 and between the capacitor 12b and the connection means 30.

Figure 27:
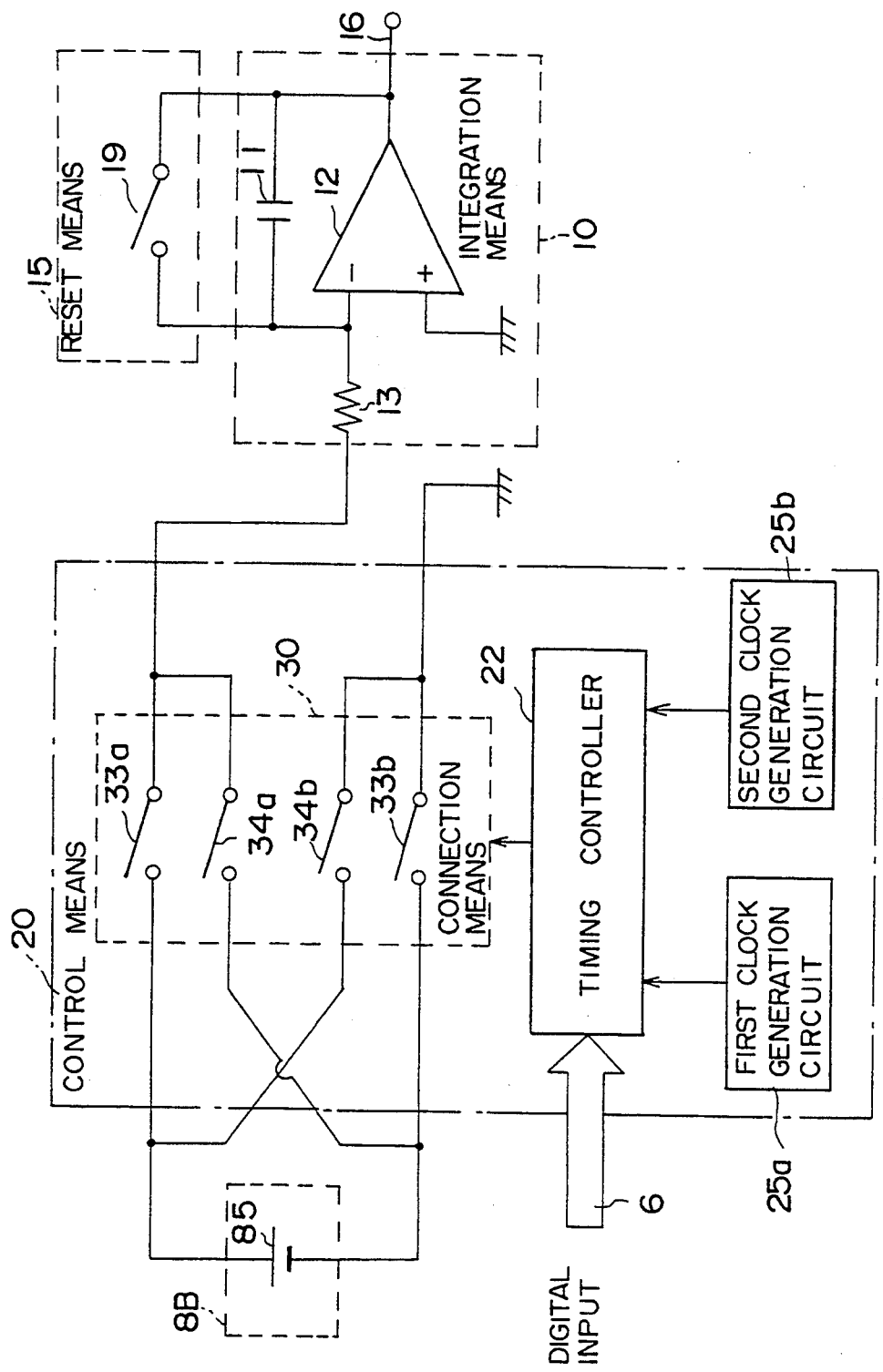
FIG. 27 is a block diagram showing the outline of the configuration of a D-A converter according to a tenth embodiment of this invention.

A D-A converter according to a tenth embodiment of this invention will now be described by using FIG. 27. The D-A converter of the tenth embodiment corresponds to the D-A converter provided with a single current source and cross bar type wiring according to the fourth embodiment shown in FIG. 18, and comprises, as shown in FIG. 27, a single voltage source 85 as the reference voltage generation means 8B and connection means 30 including two sets of switches 33a, 33b; 34a, 34b provided at the cross bar type wiring.

Since the operation of the D-A converter according to the tenth embodiment is the same as, or corresponds to the operation of the eighth and ninth embodiments in which the reference voltage is switched in both positive and negative directions in dependency upon the integral times $T_1$ and $T_2$, the repetitive explanation is omitted.

Figure 28:
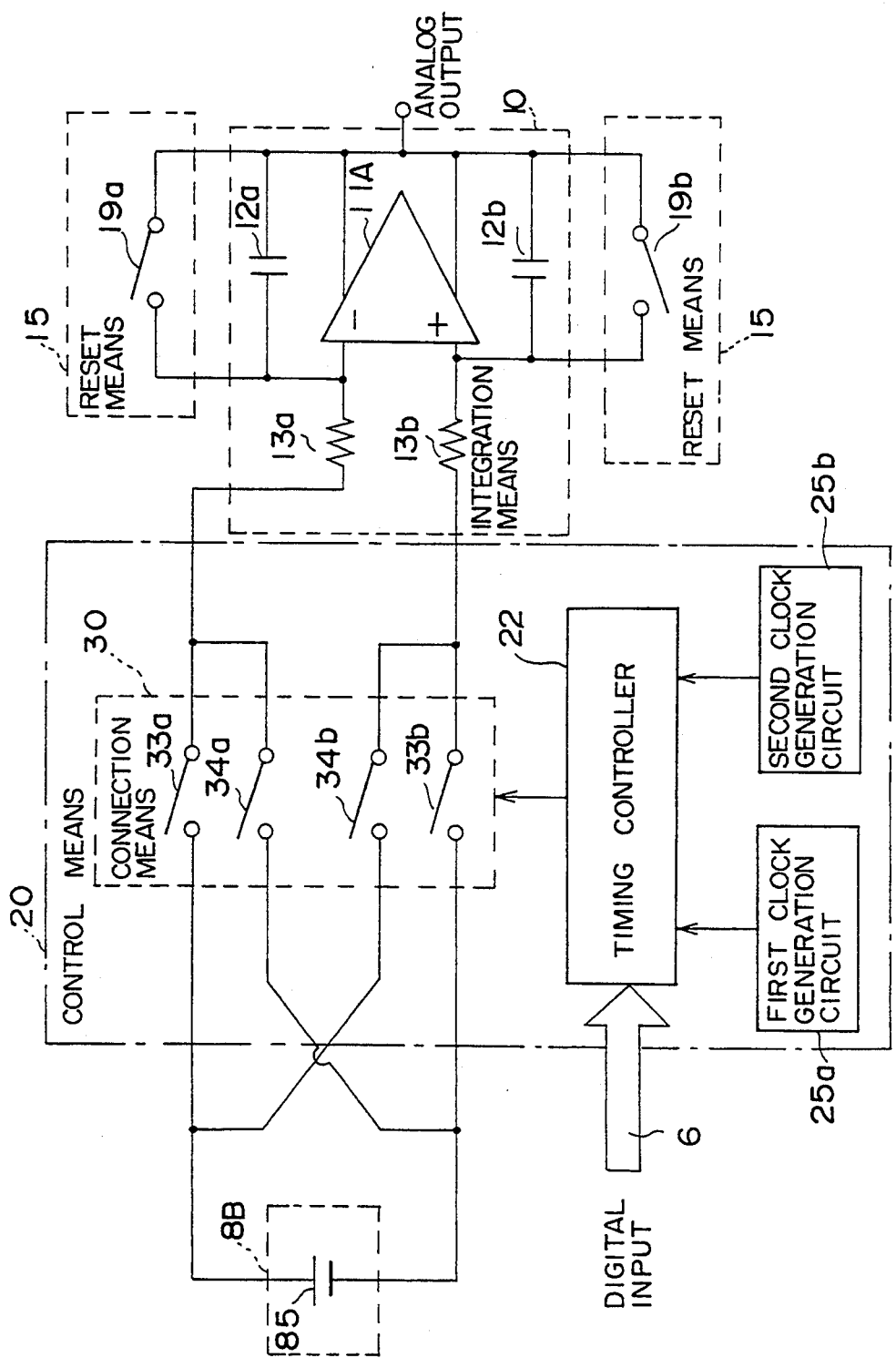
FIG. 28 is a block diagram showing the outline of the configuration of a D-A converter according to an eleventh embodiment of this invention.

A D-A converter according to an eleventh embodiment of this invention will now be described in accordance with FIG. 28. The D-A converter according to the eleventh embodiment is characterized in that the integration means 10 of the D-A converter of the tenth embodiment is replaced by a full differential type operational amplifier. Accordingly, the integration means 10 in the eleventh embodiment comprises a full differential type operational amplifier 11A, a capacitor 12a and a resistor 13a provided at the minus (−) side input/output of the amplifier 11A, and a capacitor 12b and a resistor 13b provided at the plus (+) side input/output of the amplifier 11A. As described above, the difference between FIG. 28 and FIG. 19 is whether the reference value generation source is the voltage source or the current source, and in the eleventh embodiment of FIG. 28 using voltage source, the integration means 10 includes the resistors 13a and 13b in relation to the above. Further, the D-A converter according to this embodiment comprises reference voltage generation means 8B including single positive direction voltage source 85, and two sets of switches 33a, 33b; 34a, 34b provided at the cross bar type wiring connecting the voltage source 85 and the integration means 10 and adapted to switch positive and negative directions of the reference voltage and the connection time.

Similarly to the D-A converter of the eighth embodiment, the D-A converter according to the eleventh embodiment thus constructed controls switching between the integration terms $T_1$ and $T_2$ and switching of the direction of the reference voltage by a timing signal generated on the basis of two reference clocks $C_1$ and $C_2$ having different periods. Accordingly, an integrating operation in both directions may be collectively controlled by carrying out switching between the integration terms $T_1$ and $T_2$ through a synchronizing term as shown in FIGS. 12(a), 12(b) and 12(c), or an integrating operation may be controlled so as to raise an integral output up to a predetermined integral voltage by using a portion of the integration term $T_1$ thereafter to carry out a chopping integrating operation.

Figure 29:
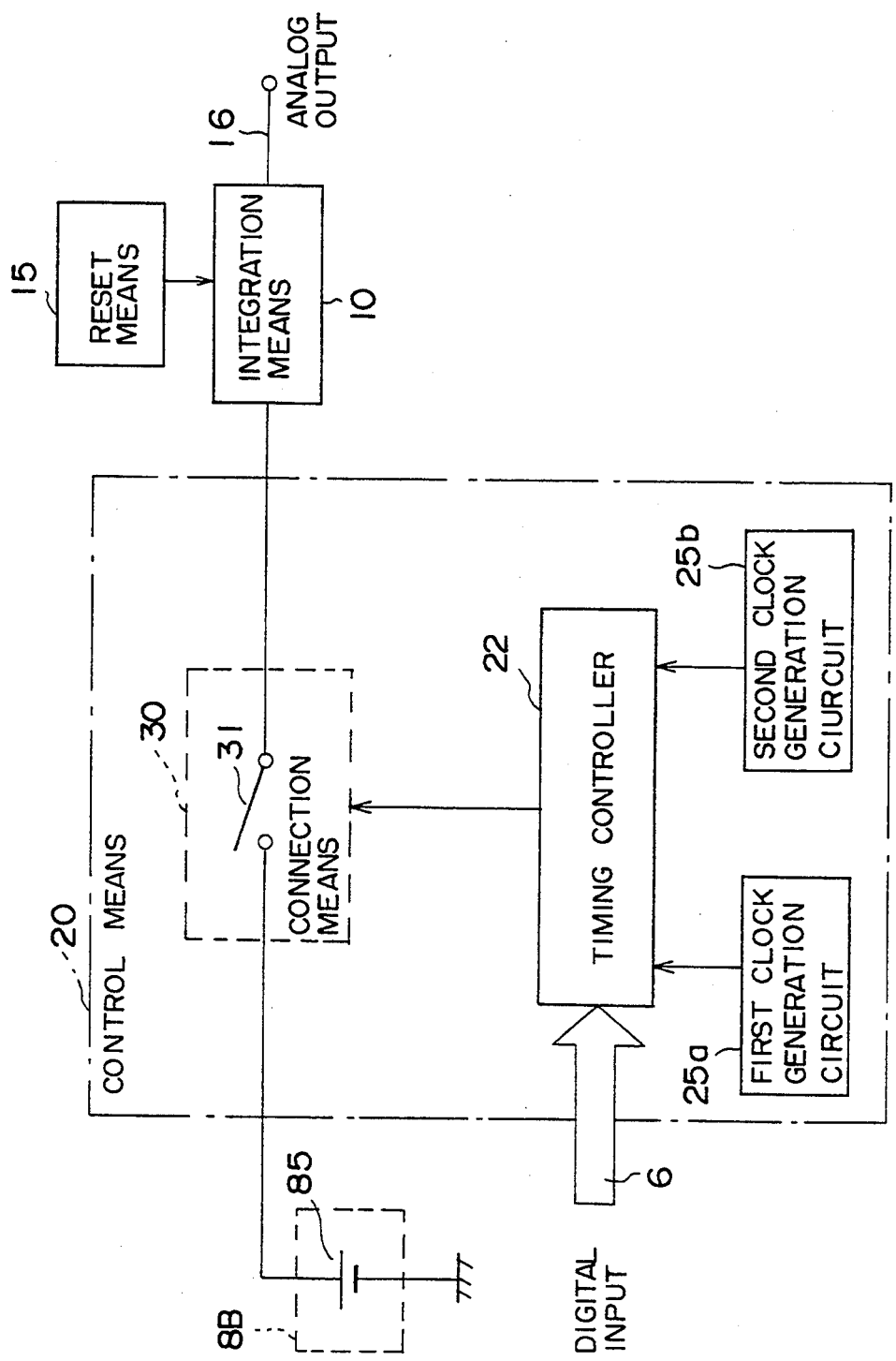
FIG. 29 is a block diagram showing the outline of the configuration of a D-A converter according to a twelfth embodiment of this invention.

As the final example of the D-A converter, a twelfth embodiment is shown in FIG. 29. The D-A converter according to the twelfth embodiment outputs an integral voltage in the same direction by a single voltage source and a single switch, which corresponds to the D-A converter according to the sixth embodiment which has been described by using FIGS. 20–23. While the D-A converter of the sixth embodiment shown in FIG. 20 is such that the reference current generation means 8A is comprised of single current source 81, the D-A converter of the twelfth embodiment shown in FIG. 29 is such that reference voltage generation means 8B is comprised of a single positive direction voltage source 85. Accordingly, the connection means 30 is comprised of a simple switch 31. Further, although the detailed configurations of the integration means 10 and the reset means 15 are not shown in FIG. 29, ordinary operational amplifier 11 shown in FIG. 27 may be used, or full differential type operational amplifier shown in FIG. 28 may be used.

Since the operation of the D-A converter according to the twelfth embodiment thus constructed is the same as the operation of the sixth embodiment which has been described by using FIGS. 21–23, the repetitive explanation is omitted. It is to be noted that, in the formula (12) for calculating the integral voltage $V_0$, $I_{ref}$ is replaced by $$\text{``}\frac{V_{ref}}{R}\text{''}.$$

Integrating type A-D converters according to the thirteenth to twenty second embodiments of this invention will now be described by using FIGS. 30–41. Also with respect to the A-D converter, there are two systems of the thirteenth to seventeenth embodiments shown in FIGS. 30–36 using reference current generation means 8A as the reference value generation means 8 and the eighteenth to twenty second embodiments shown in FIGS. 37–41 using reference voltage generation means 8B as the reference value generation means 8.

Figure 30:
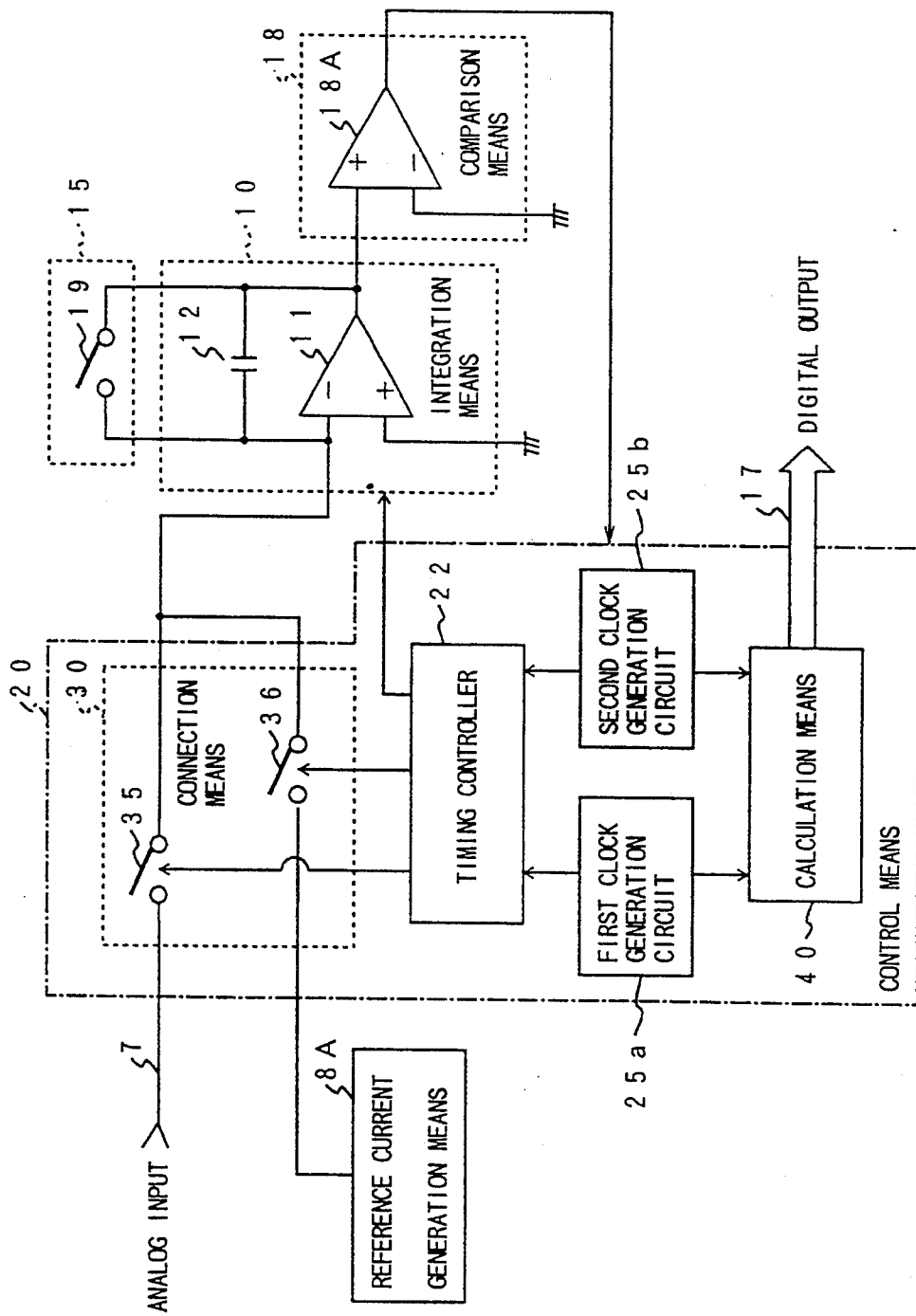
FIG. 30 is a block diagram showing the outline of the configuration of an A-D converter according to a thirteenth embodiment of this invention.
Figure 31:
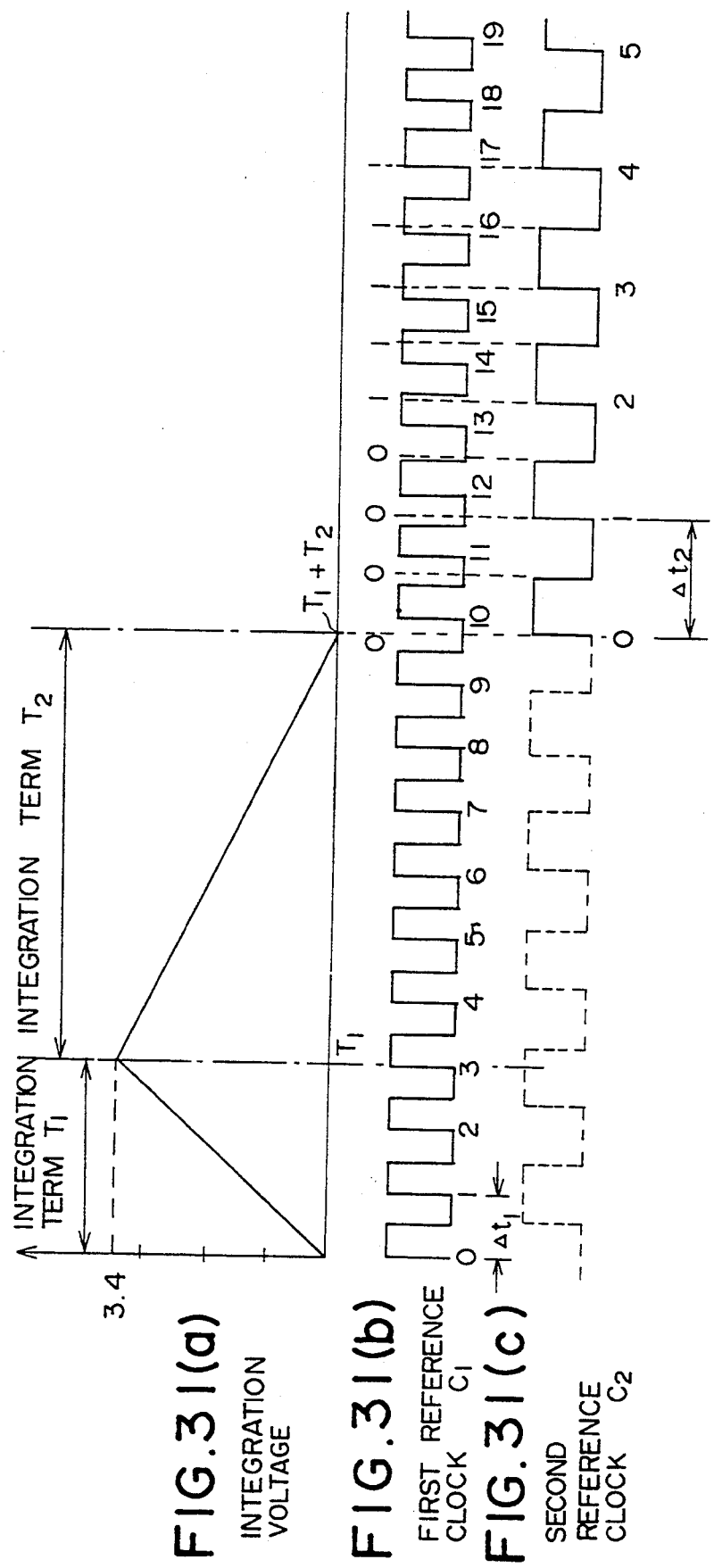
FIGS. 31(a), 31(b) and 31(c) are characteristic diagrams showing an integral voltage, a first clock signal, and a second clock signal of the A-D converter according to the thirteenth embodiment shown in FIG. 30, respectively.

The A-D converter according to the thirteenth embodiment of this invention will now be described by using FIGS. 30–31(c). FIG. 30 shows the fundamental configuration of the A-D converter according to the thirteenth embodiment, and is characterized, when compared to the fundamental concept of the A-D converter shown in FIG. 9, in that the reference value generation means 8 is comprised of reference current generation means 8A, and that the integration means 10, the reset means 15, the comparison means 18, and the connection means 30 are constructed as an actual circuit. Namely, the connection means 30 includes two switches 35 and 36 which are subjected to ON/OFF control by a timing signal outputted from the timing controller 22 on the basis of first and second reference clocks $C_1$ and $C_2$ (see FIGS. 31(b) and 31(c)) delivered from the first and second clock generation circuits 25a and 25b. The switch 35 is provided at a supply path for supplying, to the integration means 10, an analog input 7 to be subjected to A-D conversion. When this switch 35 is closed, the analog input 7 is delivered to the operational amplifier 11 constituting the integration means 10. Further, the switch 36 is provided between the reference current generation means 8A and the operational amplifier 11. When this switch 36 is closed, a reference current is delivered to the operational amplifier 11.

The actual configuration of the integration means 10 is the same as that used in the D-A converter, i.e., includes operational amplifier 11 and capacitor 12 connected in parallel with the operational amplifier 11. In this thirteenth embodiment, since reference current is used as reference value, no resistor is provided on the differential input side of the operational amplifier 11. In addition, the reset means 15 is comprised of a reset switch 19 connected in parallel with the capacitor 12.

Comparison means 18 for comparing an analog integral voltage of the integration means 10 is comprised of a comparator 18A having the integral voltage as one input and a comparison potential as the other input. An output of the comparator 18A is delivered to a second clock generation circuit 25b of the control means 20.

Similarly to the configuration based on the fundamental concept of the A-D converter of FIG. 9, the control means 20 includes calculation means 40 for converting an analog current outputted from the comparator 18A to the second clock generation circuit 25b to a digital output 17 on the basis of first and second reference clocks $C_1$ and $C_2$ delivered from the first and second clock generation circuits 25a and 25b.

The operation of the A-D converter of the thirteenth embodiment based on the above-mentioned configuration will now be described in detail by using FIGS. 31(a)–31(c).

First, before the integration means 10 starts the integrating operation, the reset switch 19 of the reset means 15 is closed, so the both ends of the capacitor 12 are short-circuited. Thus, an integral voltage of the operational amplifier 11 is cleared. In the thirteenth embodiment, when the switch 35 is closed (turned ON) by a timing signal from the timing controller 22, an analog input 7 is delivered to the operational amplifier 11 for time period $T_1$, and is integrated thereat. When the switch 35 is turned OFF and the switch 36 is turned ON, a reference current $I_{ref}$ is delivered to the integration means 10, and is integrated thereat. An output voltage of the integration means 10 at this time is shown in FIG. 31(a). As shown in the figure, an integral voltage in a positive direction corresponding to the analog input 7 is outputted for the integration term $T_1$, and an integral voltage in a negative direction corresponding to the reference current is outputted for an integration term $T_2$. This integral voltage becomes equal to "0" for a second time. At this time, the second reference clock $C_2$ is reset. Thus, the first and second reference clocks $C_1$ and $C_2$ are caused to have a time difference therebetween dependent upon an input voltage (current). At this time, the analog input current $I_{in}$ is caused to be relevant to the reference current $I_{ref}$ by the following formula (15):

$$I_{in} = I_{ref} \times (T_2 - T_1)/T_1 \qquad (15)$$

Assuming now that the period of the first reference clock $C_1$ is $t_1$, and the period of the second reference clock $C_2$ is $t_2$, the relational expression corresponding to the above-described formula (7), which is expressed as "$T_2-T_1=t_1 \times n - t_2 \times m$" (n and m an arbitrary integer), holds.

In the thirteenth embodiment, when, for example, input current=3.4 [mA] corresponding to analog input 3.4, capacitance C=30 [μF], reference current $I_{ref}$=1.5 [mA], period $t_1$ of first reference clock=10 [ms], period $t_2$ of second reference clock=18 [ms], n=(17−3)=14 and m=4 obtained from the previously described formula (10) are substituted into the formula (8), the following relationship is provided:

$$V_0 = \frac{I_{ref}}{C}(T_1 - T_2) = \frac{1.5 \times 10^{-3}}{30 \times 10^{-6}}(10 \times 14 - 18 \times 4)$$
$$= 3.4 \times 10^{-3}$$

Thus, the integral voltage $V_0$ can be equal to 3.4 mV. This integral voltage $V_0$ is delivered to the control means 20 through the comparison means 18. By carrying out the above-mentioned calculation at the counter and the decoder of the calculation means 40, it is possible to carry out A-D conversion.

On the other hand, in the conventional method of carrying out calculation only by a single reference clock for comparison, $I_{in}$ is calculated by the following formula:

$$I_{in} = I_{ref} \times (T_2 - T_1)$$
$$= (\tfrac{1}{2}) \times (10 - 3) \times 10/10 = 3.5$$

Namely, in the above-described thirteenth embodiment, the integral time can be measured with a minimum value being as a unit by the following formula (16):

$$T_2 - T_1 = |p \times t_1 - q \times t_2| \qquad (16)$$

In the above formula, p and q are an arbitrary integer. On the contrary, with the conventional method, measurement can be only conducted with $t_1$ being as a unit, i.e., "$t_1=10$" being as a unit. In this connection, when respective values are substituted into the formula (16), "$|2 \times 10 - 1 \times 18| = 2$" holds in the case of the thirteenth embodiment. Thus, it is possible to measure the integral time by a narrower time unit which is the order of one fifth of that of the prior art.

In the above-described thirteenth embodiment, consideration is made in connection with the case of "$t_1=10, t_2=18$" as an actual numeric example. However, even if numeric values except for the above are selected, the fundamental principle of this invention can be realized. As a manner of selecting $t_1$ and $t_2$, if $t_1$ and $t_2$ are set to slightly different values although there hardly difference therebetween, it is possible to dramatically improve the resolution while the clock frequency is held down to a lower value.

While it has been described that the point at which rising edges of both the first reference clock $C_1$ and the second reference clock $C_2$ coincide with each other is used to measure an integral time, both the rising edge and the falling edge are used, thereby making it possible to further improve reduction of the conversion time and improvement in the resolution. In this case, the relationship expressed as "$t_1=5, t_2=9$" results, so the minimum value of "$|p \times t_1 - q \times t_2|$" becomes equal to "1".

It is necessary to judge the point at which edges of the first and second reference clocks $C_1$ and $C_2$ coincide with each other. Such a coincident point can be easily judged by detecting the relationship between respective phases of the first and second reference clocks $C_1$ and $C_2$. By using FIGS. 31(b) and 31(c), an example of judgment of the coincident point of both clocks $C_1$ and $C_2$ will now be described. When attention is drawn to the phase of the first reference clock $C_1$ at the time points of the rising edge and the falling edge of the second reference clock $C_2$ after the integration term $T_2$ is completed, it is seen that inversion is conducted in order of 0, 0, 0, 0, 1, 1, 1 . . . as shown in FIG. 31(b). The fifth edge of the inverted second reference clock $C_2$ is the point of judgment. As stated above, if the relationship between the repetition of phases of the first and second reference clocks $C_1$ and $C_2$ and their edges is observed, the switching point of the integral time can be easily discriminated.

Figure 15:
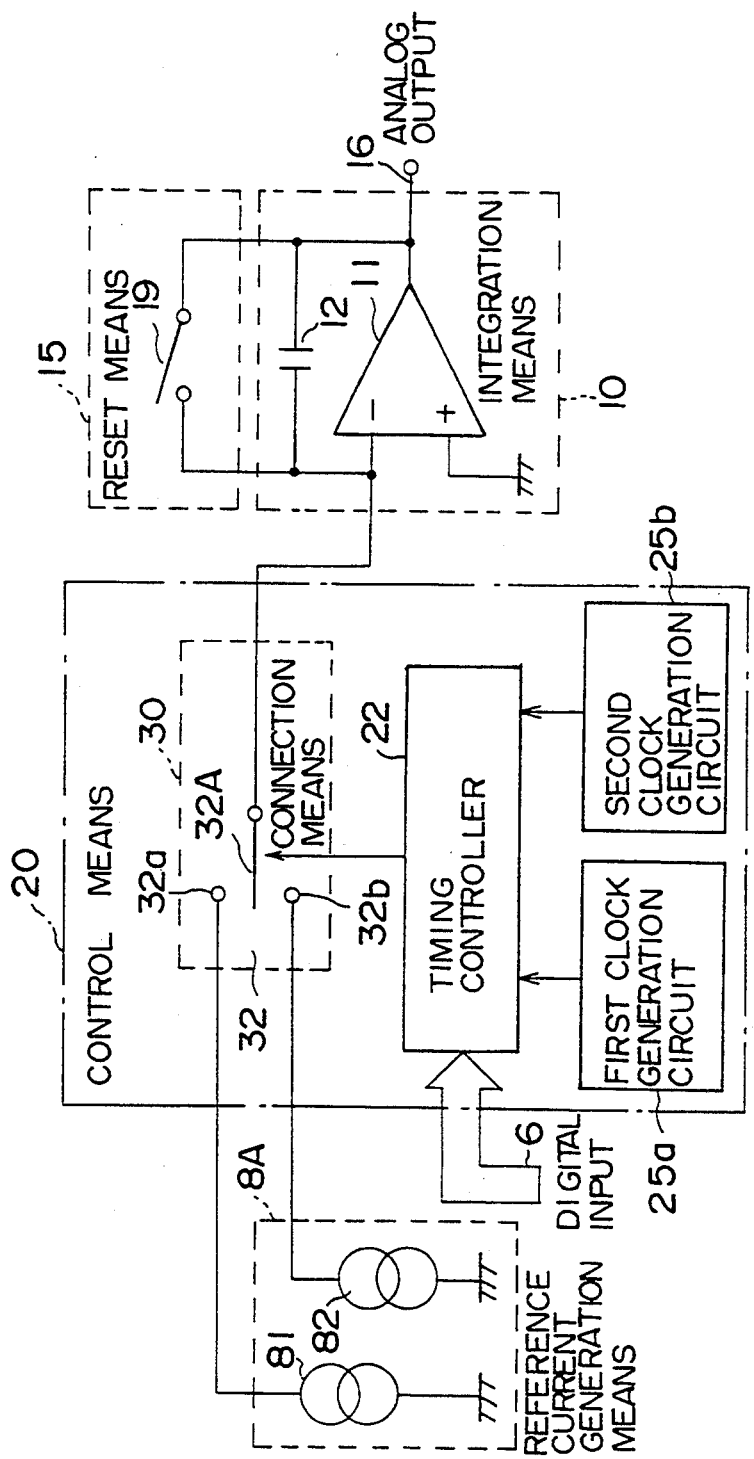
FIG. 15 is a block diagram showing the outline of the configuration of a D-A converter according to a second embodiment of this invention.
Figure 16:
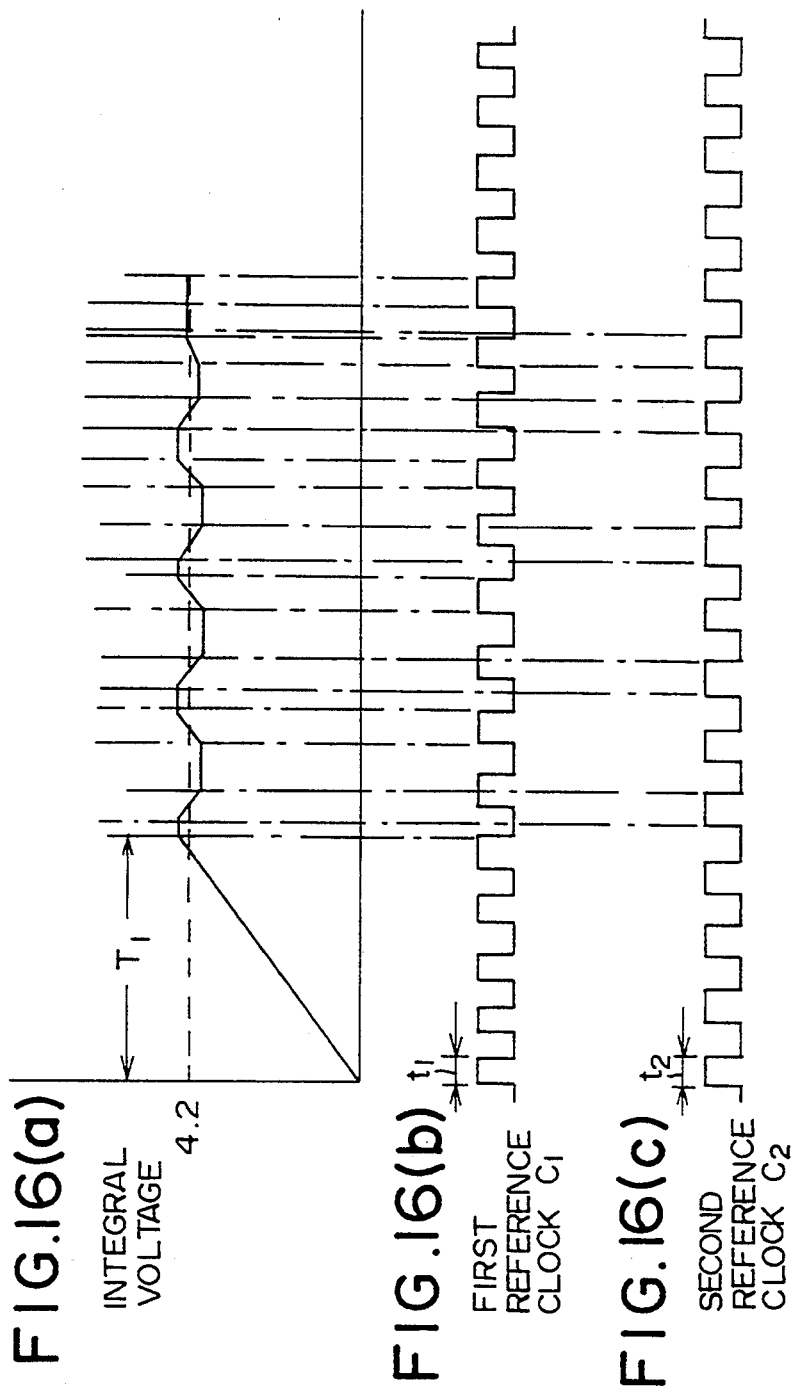
FIGS. 16(a), 16(b) and 16(c) are characteristic diagrams showing an integral voltage, a first reference clock and a second reference clock of the D-A converter of the second embodiment, respectively.

It is to be noted that while the A-D converter according to the thirteenth embodiment includes connection means 30 comprised of two switches 35 and 36, the connection means 30 may be comprised of a switch 32 having a single movable contact 32A and two fixed contacts 32a and 32b similarly to the second embodiment shown in FIG. 15. In this case, an analog input 7 is delivered to the fixed contact 32a, and a reference current is delivered to the fixed contact 32b.

Figure 33:
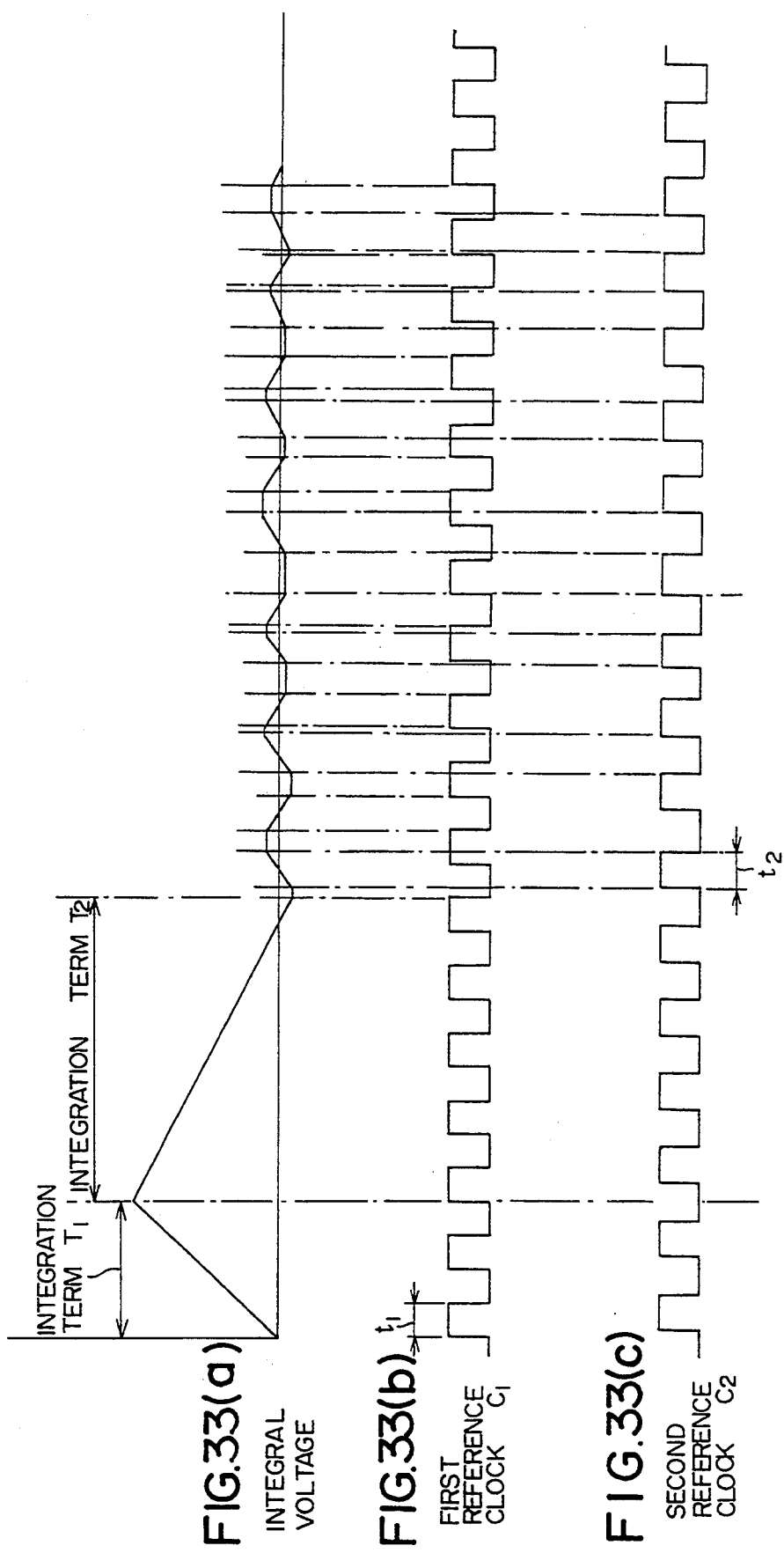
FIGS. 33(a), 33(b) and 33(c) are characteristic diagrams showing an integral voltage, a first reference clock, and a second reference clock of the A-D converter according to the fourteenth embodiment shown in FIG. 32, respectively.

An A-D converter according to a fourteenth embodiment of this invention will now be described by using FIGS. 32-33(c). The A-D converter according to the fourteenth embodiment includes, as shown in FIG. 32, reference current generation means 8A comprised of two reference current sources 81 and 82 for delivering reference currents in both positive and negative directions. The control means 20 includes, similarly to the thirteenth embodiment, timing controller 22, first and second clock generation circuits 25a and 25b, connection means 30 and calculation means 40. The connection means 30 includes a switch 35 for carrying out ON/OFF of supply of an analog input 7, and a switch 32 for carrying out ON/OFF of supply of reference currents in both directions. The switch 32 includes a movable contact 32A, a fixed contact 32a connected to the current source 81 for delivering a reference current in a positive direction, and a fixed contact 32b connected to the current source 82 for delivering a reference current in a negative direction. The calculation circuit 40 includes first and second counters 41a and 41b respectively supplied with first and second reference clocks $C_1$ and $C_2$ from the first and second clock generation circuits, and a decoder 42 for outputting a digital output 17 on the basis of count values of the first and second counters 41a and 41b.

Integration means 10, reset means 15 and comparison means 18 may be constructed so as to have the same detailed configuration as that of FIG. 30 used in the thirteenth embodiment. In addition, there may be employed a configuration such that operational amplifier 11A of the full differential type applied to the integration means 10 in the fifth embodiment shown in FIG. 19 is used. It is to be noted that the operational amplifier 11A of the full differential type will be described in detail in the seventeenth embodiment by using FIG. 36.

The operation of the A-D converter according to the fourteenth embodiment constructed as above will now be described by using FIGS. 33(a)-33(c). In the fourteenth embodiment, the A-D converter uses reference currents in both directions and uses first and second reference clocks $C_1$ and $C_2$ so as to switch the integral time bit by bit to conduct the integrating operation similarly to the D-A converter according to the second embodiment. Accordingly, the integral voltage is as shown in FIG. 33(a). Namely, an analog input 7 is integrated for integration term $T_1$ set on the basis of the period $t_1$ of the first reference clock $C_1$, and integration is then carried out by using a reference current in a direction opposite to that of the analog input 7 for integration term $T_2$ set similarly on the basis of the period $t_1$. Thereafter, integration is carried out by using a reference current in the same direction as that of the analog input 7 through the synchronizing term up to the next rising or falling edge (the rising edge in the example of FIGS. 33(a) and 33(c)) of the second reference clock $C_2$. At times subsequent thereto, a chopping integrating operation is repeated in such an order of the synchronizing term, the integration term in the negative direction, the synchronizing term, and the integration term in the positive direction by using the rising or falling edge of the first and second reference clocks $C_1$ and $C_2$ as shown. When such an inverting operation is repeatedly carried out, there results the state where output is not inverted at the n-th inverting operation. By using this number of times, it is possible to convert analog input 7 to digital output 17. Since there is a time difference of "$t_2 - t_1$" between periods $t_1$ and $t_2$, when respective one integrations are carried out at the periods $t_1$ and $t_2$, the integral value varies by a value corresponding to "$t_2 - t_1$" with respect to the output. Assuming now that the reference current value is $I_{ref}$, the current value of the analog input 7 is $I_{in}$, the integral time of the input 7 is $T_1$, the time during which the reference current $I_{ref}$ in the negative direction is first integrated in an opposite direction is $T_2$, and the number of integrating operations repeatedly carried out is n, the current value $I_{in}$ is provided from the following relationship as follows:

$$I_{in} \times T_1 = I_{ref} \times T_2 - I_{ref} \times (t_2 - t_1) \times n \quad (17)$$

$$I_{in} = \frac{I_{ref} \times T_2 - I_{ref} \times (t_2 - t_1) \times n}{T_1}$$

Accordingly, by suitably switching the connection means 30 to allow the decoder 42 to perform the calculation of the formula (17), a digital output 17 can be provided.

Although apparent from the foregoing description, the operation will now be described in relation to the configuration of FIG. 32. First, e.g., a reset switch of the reset means 15 is turned ON so that an integral voltage of the integration means 10 is cleared. Then, a timing signal generated in the timing controller 22 on the basis of the period $t_1$ of the first reference clock $C_1$ is outputted to the switch 35 of the connection means 30, so an analog input 7 is delivered to the integration means 10 only for the integration term $T_1$. Thus, the analog input is integrated in the beginning. Then, at the integration term $T_1$, the switch 35 is turned OFF at a predetermined period ($t_1 \times 4$ in the case of FIG. 33(b)) of the first reference clock $C_1$, and the movable contact 32A of the switch 32 is connected to the fixed contact 32b on the side of the current source 82 for delivering a reference current in a direction opposite to that of the analog input 7. Thus, the integration term $T_2$ begins. The switch 32 is turned OFF at a predetermined period ($t_1 \times 9$ in the case of FIG. 33(b)) of the first reference clock $C_1$. Thus, the integration term $T_2$ is completed. Thereafter, the movable contact 32A is connected to the fixed contact 32a on the side of the reference current in the positive direction in response to the next rise of the second reference clock $C_2$. Thus, an integration is carried out for a time period corresponding to the period $t_2$. At times subsequent thereto., only the switch 32 is used. Thus, a chopping integrating operation is carried out as shown in FIGS. 33(a)–33(c).

An A-D converter according to a fifteenth embodiment of this invention will now be described by using FIG. 34. The A-D converter according to the fifteenth embodiment is the same as the configuration of FIG. 32 except that the configuration of the reference current generation means 8A differs from that of the fourteenth embodiment. The relationship between the second embodiment (FIG. 15) and the third embodiment (FIG. 17) in the D-A converter corresponds to the relationship between the fourteenth embodiment (FIG. 32) and the fifteenth embodiment (FIG. 34) in the A-D converter. Namely, in FIG. 34, the reference current generation means 8A comprises a current source 82 for generating a reference current in a negative direction, and an inverter 83 serving as an inverting element for inverting the reference current in the negative direction outputted from the current source to generate a reference current in a positive direction. The reference current in the negative direction is delivered to the fixed contact 32b of the switch 32. and the reference current in the positive direction is delivered to the fixed contact 32a of the switch 32.

Since the integrating operation based on the above-mentioned configuration is the same as the operation of the fourteenth embodiment shown in FIGS. 33(a)–33(c), the repetitive explanation is omitted.

An A-D converter according to a sixteenth embodiment of this invention will now be described by using FIG. 35. The A-D converter according to the sixteenth embodiment differs from those of the fourteenth and fifteenth embodiments in that the reference current generation means 8A is comprised of a single reference current source 81 in one direction, and that the connection means 30 is composed of a switch 35 for carrying out connection and interruption of an input of the analog input 7, and a switch 31 for controlling supply of a reference current from the reference current source 81. Since the configurations of integration means 10, reset means 15, comparison means 18, timing controller 22, first and second clock generation circuits 25a and 25b, and calculation means 40, etc. are respectively the same as those of the fourteenth and fifteenth embodiments shown in FIGS. 32 and 34, the repetitive explanation is omitted.

The operation of the A-D converter according to the sixteenth embodiment corresponds to the operation of the D-A converter according to the sixth embodiment shown in FIG. 20. In the case of the A-D converter, since an integration based on a reference current is carried out after integration of the analog input 7, there is no possibility that all integral voltages may be in correspondence with one direction. Namely, an integral voltage is changed from the positive direction to the negative direction at the time point when switching between the integration terms $T_1$ and $T_2$ is carried out. Thereafter, an integral voltage is outputted in one direction which is the negative direction.

An A-D converter according to a seventeenth embodiment of this invention will now be described by using FIG. 36. The A-D converter according to the seventeenth embodiment is characterized in that the integration means 10 includes full differential type operational amplifier 11A similarly to the integration means of the D-A converter according to the fifth embodiment shown in FIG. 19 or the eleventh embodiment shown in FIG. 28, that the reference current source serves to deliver a single reference current in one direction, and that the connection between the reference current source and the full differential type operational amplifier 11A is caused to be of the cross bar type as in the eleventh embodiment of FIG. 28. It is to be noted that since it is necessary to integrate an analog input in the beginning in the A-D converter, the A-D converter according to the seventeenth embodiment includes an analog current source 80 as well as shown in FIG. 36.

Figure 36:
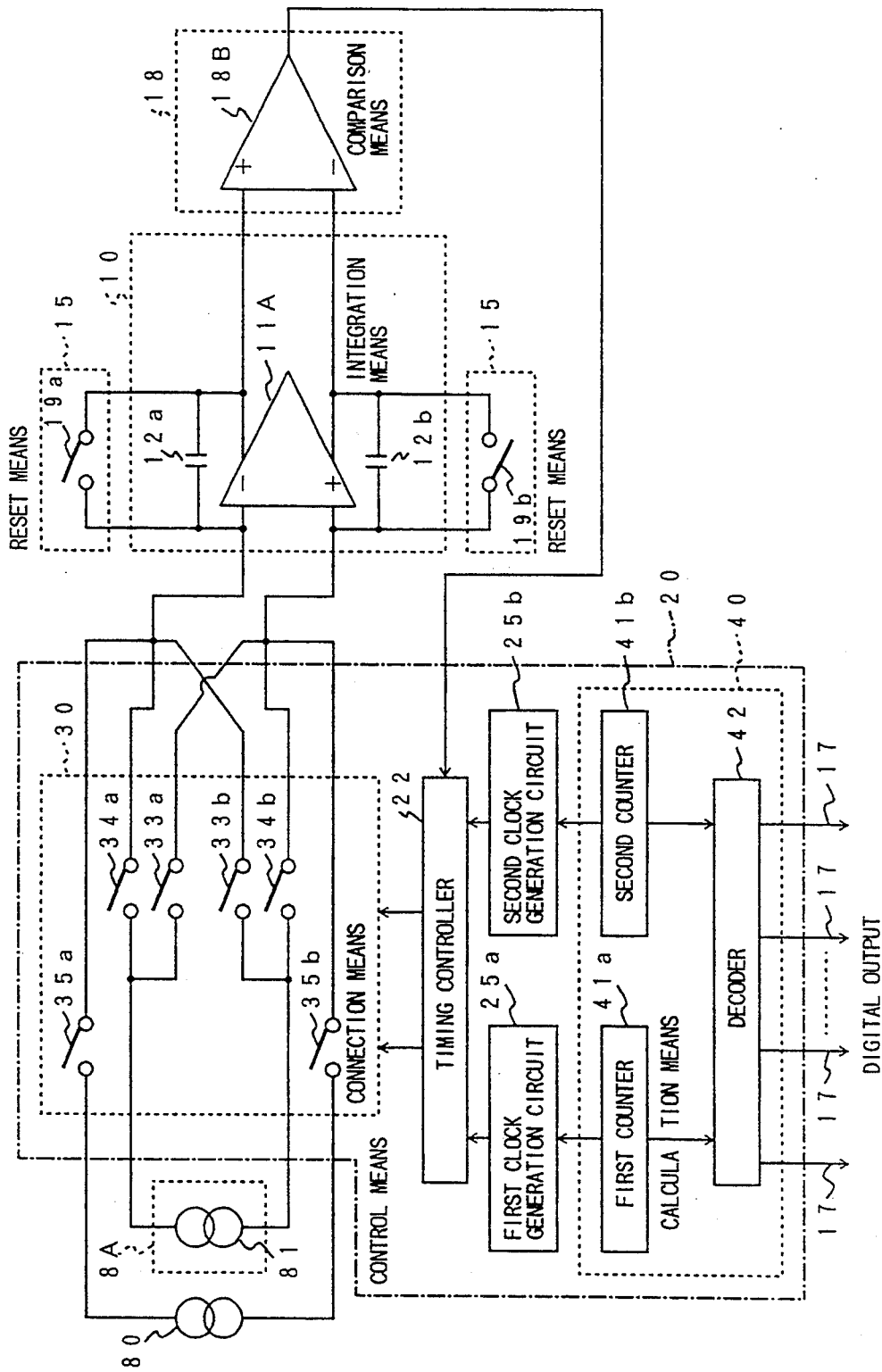
FIG. 36 is a block diagram showing the outline of the configuration of an A-D converter according to a seventeenth embodiment of this invention.

In FIG. 36, the integration means 10 is composed of full differential type operational amplifier 11A, and first and second capacitors 12a and 12b. The reset means 15 is comprised of reset switches 19a and 19b for allowing the both ends of the capacitors 12a and 12b to be short-circuited to thereby clear respective two outputs of the amplifier 11A. Since this operational amplifier 11A has two outputs, comparison means 18 includes a comparator 18B of a structure to have outputs of the amplifier 11A as respective inputs as they are as shown even if a comparison (or ground) potential is inputted as in the thirteenth to sixteenth embodiments. It is to be noted that an output of the comparator 18B in the A-D converter according to the seventeenth embodiment is not delivered to second clock generation circuit 25b as in the thirteenth embodiment, but is delivered to timing controller 22.

The detailed configuration will now be described. Between analog current source 80 for an analog input and operational amplifier 11A, there are provided switches 35a and 35b for carrying out interruption and connection of supply of an analog input outputted from the analog current source 80. This analog current source serves to output a single current in one direction, and the direction of the integral voltage is assumed to be positive. The reference current generation means 8A also includes a reference current source 81 for generating a reference current in a positive direction similarly to the analog current source. Since the reference current from the reference current source 81 serves to output an integral voltage which takes a negative direction at the time point when switching between integration terms $T_1$ and $T_2$ is carried out, switches 33a, 33b, 34a and 34b of the connection means 30 are arranged as shown. Since other components are the same as those of the fourteenth to sixteenth embodiments, the repetitive explanation is omitted.

Since the operation of the A-D converter according to the seventeenth embodiment constructed as above is substantially the same as that of the fourteenth embodiment, the description relating to outputting, etc. of a timing signal is omitted. Since only the switching operation of switches 33a–35b constituting the connection means 30 is described, please confer to action of the integral voltage and the first and second reference clocks $C_1$ and $C_2$ shown in FIGS. 33(a)–33(c).

First, in order to clear the integral voltage of the operational amplifier 11A, reset switches 19a and 19b constituting the reset means 15 are closed to short-circuit respective both ends of the capacitors 12a and 12b. Then, in order to deliver an analog input to the operational amplifier 11A, a timing signal outputted on the basis of counts of the first reference clock $C_1$ is outputted from the timing controller 22 to switches 35a and 35b so as to close the switches 35a and 35b. At the timing when the integration term $T_1$ is completed by the first reference clock $C_1$ and is switched to the integration term $T_2$, the switches 35a and 35b are opened. In order to deliver a reference current in a negative direction to the operational amplifier 11A, switches 33a and 33b are closed. At time subsequent thereto, when all the switches 33a–34b are opened by an output of the timing signal, there results a synchronizing term. Further, when the switches 33a and 33b are closed and the switches 34a and 34b are opened, a reference current in a negative direction to generate an integral voltage of which direction is opposite to that of an integral voltage of an analog current is delivered. In contrast, when the switches 33a and 33b are opened and the switches 34a and 34b are closed, a reference current in a positive direction which is the same as that of the integral voltage of the analog current is delivered.

In a manner stated above, also in the A-D converter of the seventeenth embodiment, a rapid integrating operation similar to those of other embodiments can be carried out.

It is to be noted that while the example where the integration means 10 is constituted with full differential type operational amplifier 11A is shown in FIG. 36, even if the integration means 10 is constituted with an ordinary operational amplifier 11 similarly to other embodiments, and only the configuration relating to the current source and the cross bar wiring is caused to be as shown in FIG. 36, effects/advantages similar to the above can be provided.

Eighteenth to twenty second embodiments of this invention will now be described in accordance with FIGS. 37–41. The A-D converters according to these eighteenth to twenty second embodiments correspond to the A-D converters of the type using the reference current according to the thirteenth to seventeenth embodiments, respectively. As a reference value used, a reference voltage is applied. The configurations of FIGS. 37–41 are substantially the same as the configurations of FIGS. 30, 32, 34–36 except that a reference voltage source 8B is used as the reference value generation means 8 and the individual voltage sources respectively correspond to the above-described current sources. It is to be noted that, on the basis of the differences with respect to the configurations of the current and voltage sources in the D-A converter, the A-D converter differs from the D-A converter in that the integration means 10 include resistor 13 and resistors 13a and 13b respectively in FIGS. 37 and 41.

Initially, the eighteenth embodiment of this invention will now be described with reference to FIG. 37. The A-D converter according to the eighteenth embodiment is mainly different in that reference current generation means 8A in the A-D converter according to the thirteenth embodiment shown in FIG. 30 is replaced by reference voltage generation means 8B. Because a reference value delivered is caused to be a reference voltage from the voltage source, integration means 10 includes resistor 13 in addition to operational amplifier 11 and capacitor 12. Further, an output of comparator 18A constituting comparison means 18 is delivered to second clock generation circuit 25b.

Figure 37:
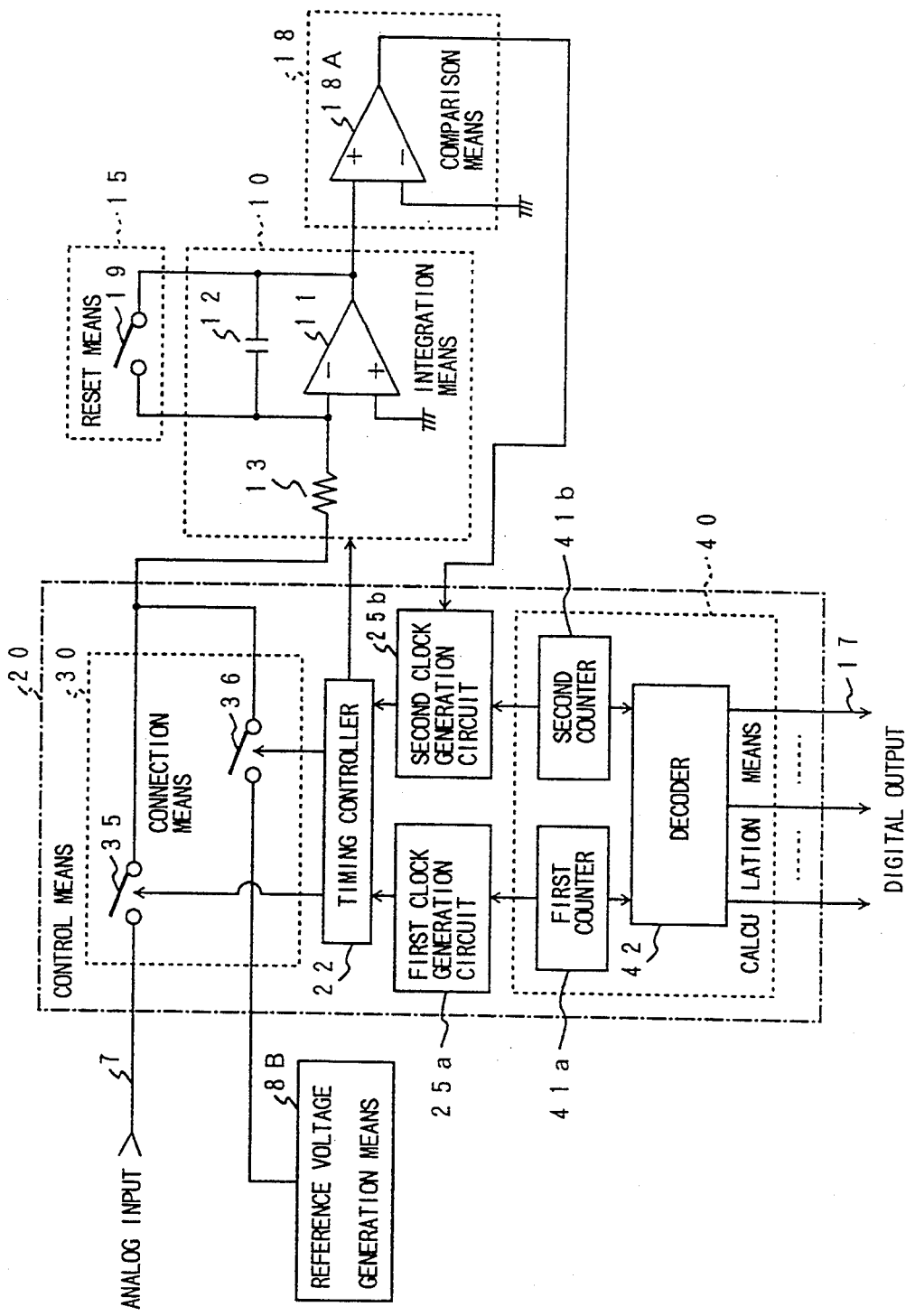
FIG. 37 is a block diagram showing the outline of the configuration of an A-D converter according to an eighteenth embodiment of this invention.

The A-D converter according to the eighteenth embodiment shown in FIG. 37 has essentially the same operation as that of the thirteenth embodiment shown in FIGS. 31(a)–31(c). It is to be noted that since the A-D converter according to the eighteenth embodiment uses a reference voltage value to carry out an integrating operation, handling is made such that $I_{ref}$ in the formula (15), etc. is replaced by "$V_{ref}/R$".

Figure 38:
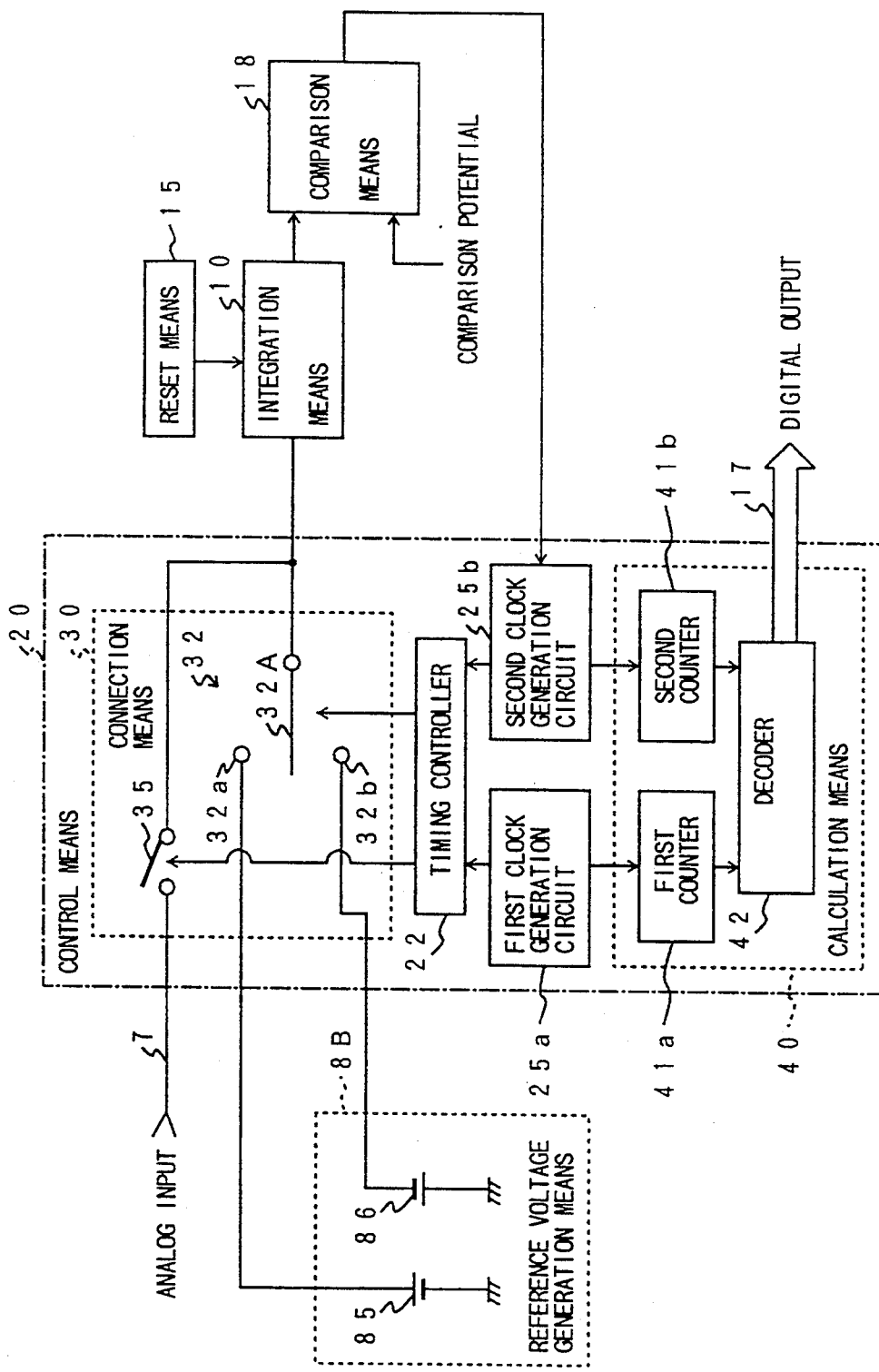
FIG. 38 is a block diagram showing the outline of the configuration of an A-D converter according to a nineteenth embodiment of this invention.

An A-D converter according to the nineteenth embodiment of this invention will now be described by using FIG. 38. The A-D converter according to the nineteenth embodiment includes reference voltage sources 85 and 86 in both positive and negative directions as the reference voltage generation means 8B. Irrespective of whether the integrating operation is collectively carried or is carried out bit by bit, the switch 32 of the connection means 30 serves to switch the integral time and the direction of the integral voltage by a timing signal. In order to deliver a reference voltage in a negative direction to the integration means 10, the movable contact 32A of the switch 32 first comes into contact with the fixed contact 32b, and is then switched to the fixed contact 32a side through the synchronizing term.

Since the relationship of the integral voltage and first and second reference clocks $C_1$ and $C_2$ of the nineteenth embodiment is the same as the relationship of the A-D converter operation of the fourteenth embodiment shown in FIGS. 33(a)–33(c), the repetitive explanation is omitted.

Figure 39:
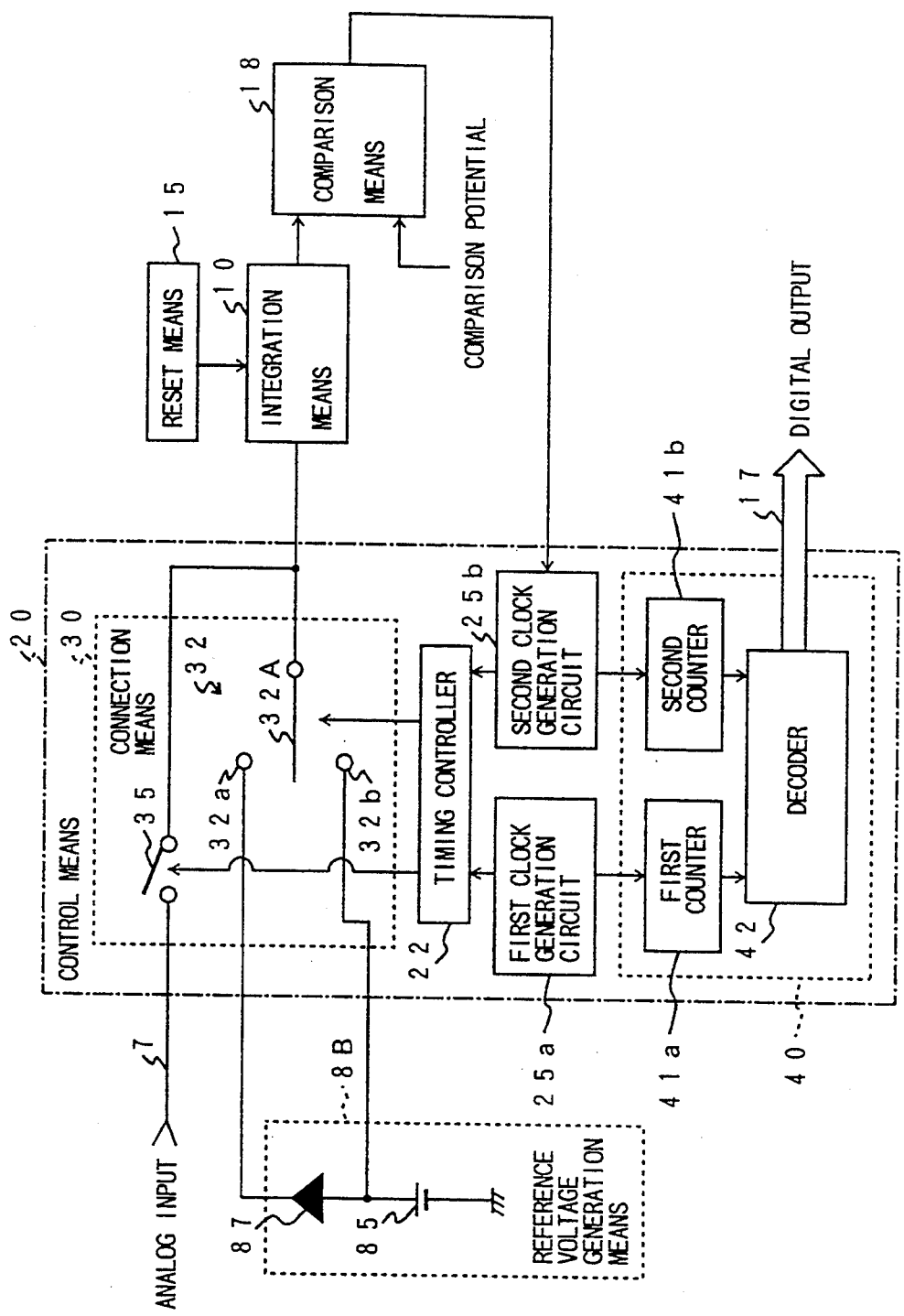
FIG. 39 is a block diagram showing the outline of the configuration of an A-D converter according to a twentieth embodiment of this invention.

An A-D converter according to the twentieth embodiment of this invention will now be described in accordance with FIG. 39. Also in the A-D converter according to the twentieth embodiment, reference current generation means 8A of the fifteenth embodiment shown in FIG. 34 for delivering, to the integration means 10, reference currents in both directions obtained by inverting a current from the single current source is replaced by reference voltage generation means 8B. In FIG. 39, the reference voltage generation means 8B includes a voltage source 85 for outputting a reference voltage in a positive direction and an inverter 87 as an inverting element for inverting the reference voltage in the positive direction from the voltage source 85 to deliver a reference voltage in a negative direction to the integration means 10 side. Since the switches 35 and 32 have the same configurations as those of the nineteenth embodiment and also are the same in the switching operation, the repetitive explanation is omitted.

Since the A-D converter according to the twentieth embodiment shown in FIG. 39 also carries out an operation similar to that of the A-D converter according to the fifteenth embodiment shown in FIG. 34, the repetitive explanation is omitted. As described in the explanation of the operations of the eighteenth and nineteenth embodiments, a calculation is carried out with $I_{ref}$ of the formula (15), etc. being replaced by "$V_{ref}/R$".

Figure 40:
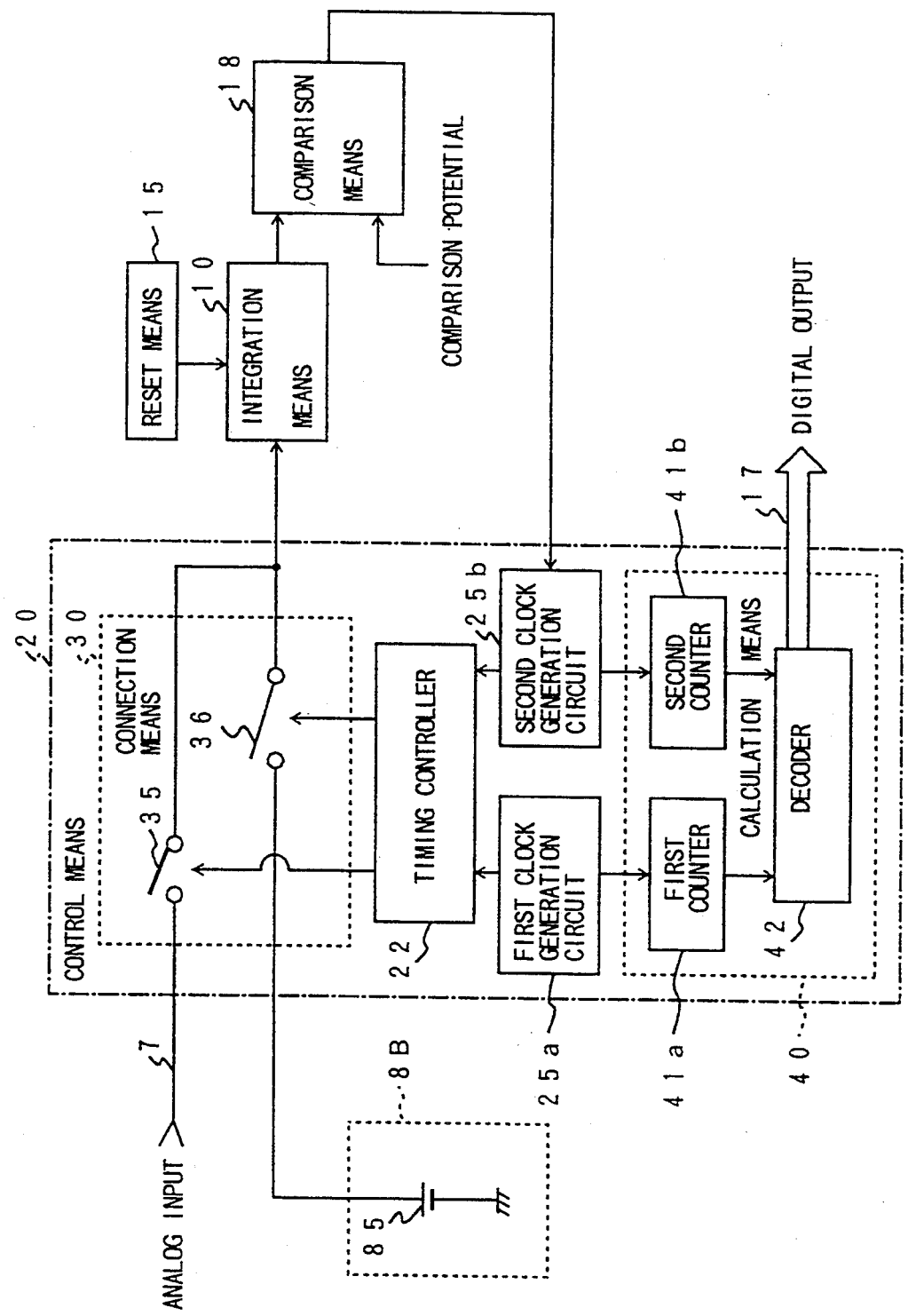
FIG. 40 is a block diagram showing the outline of the configuration of an A-D converter according to a twenty first embodiment of this invention.

An A-D converter according to the twenty first embodiment of this invention will now be described by using FIG. 40. The A-D converter according to the twenty first embodiment corresponds to the A-D converter according to the sixteenth embodiment shown in FIG. 35. In FIG. 40, reference voltage generation means 8B as the reference value generation means is comprised of a single voltage source in one direction. Further, connection means 30 of control means 20 includes a switch 35 for carrying out ON/OFF of supply of an analog input 7, and a switch 36 for carrying out ON/OFF of supply of a reference voltage. Since other components are the same as those in the previously described A-D converters, the repetitive explanation is omitted.

Since the operation of the A-D converter according to the twenty first embodiment is the same as the operation of the sixteenth embodiment shown in FIG. 35 except that the reference current is replaced by the reference voltage, the repetitive explanation is omitted.

Figure 41:
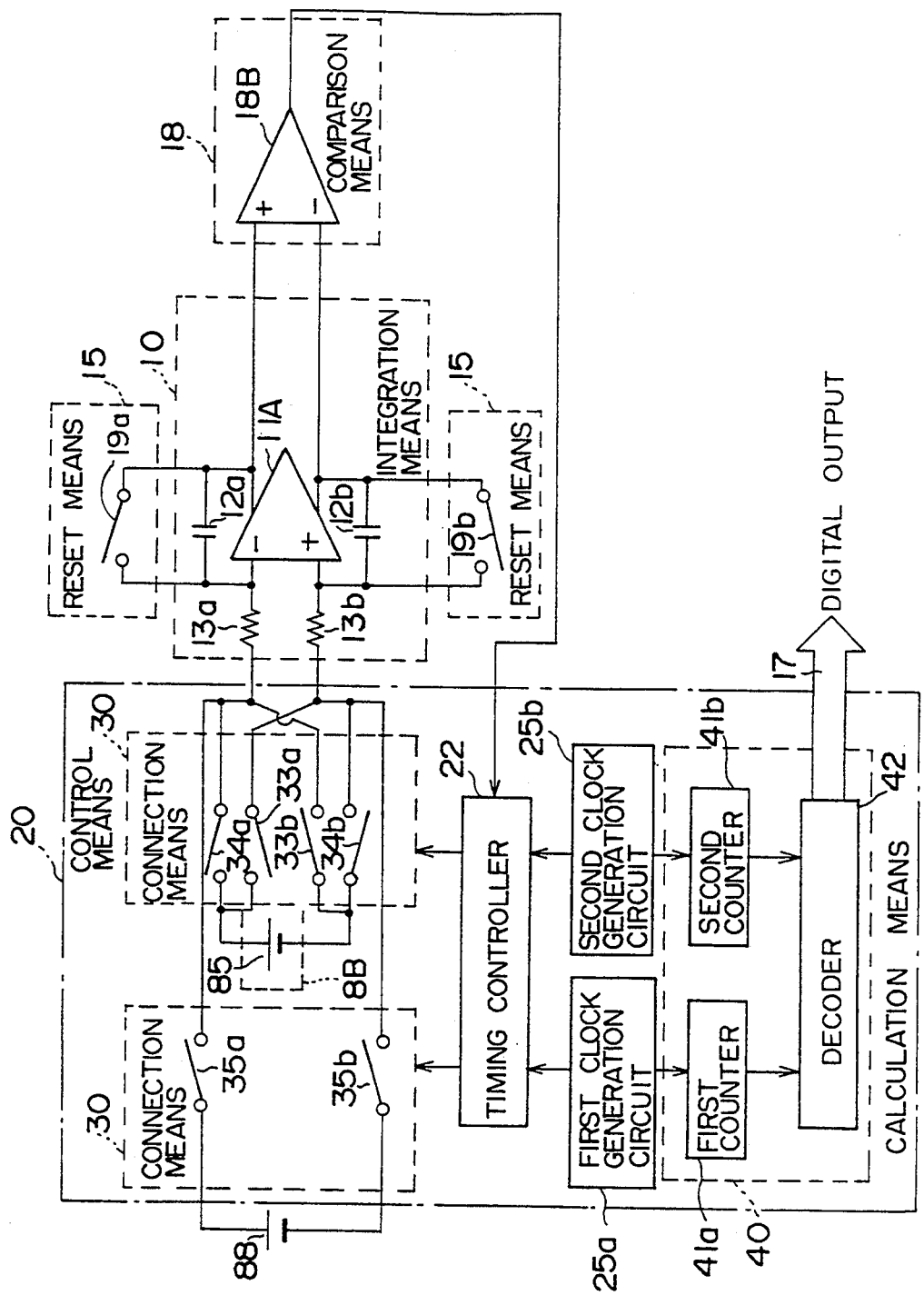
FIG. 41 is a block diagram showing the outline of the configuration of an A-D converter according to a twenty second embodiment of this invention.

Finally, an A-D converter according to the twenty second embodiment of this invention will now be described by using FIG. 41. The A-D converter according to the twenty second embodiment corresponds to the A-D converter according to the seventeenth embodiment shown in FIG. 36. Namely, in FIG. 41, the integration means 10 includes, similarly to FIG. 36, a full differential type operational amplifier 11A, and capacitors 12a and 12b. The A-D converter according to the twenty second differs from that of FIG. 36 as follows. Namely, since the A-D converter according to the twenty second embodiment uses a reference voltage as a reference value, it is required to take resistance into consideration as previously described. For this reason, resistors 13a and 13b are provided on the side of both inputs of the amplifier 11A. Voltage source 88 of analog input 7 and reference voltage source 85 of reference voltage generation means 8B, etc. respectively correspond to current sources of the seventeenth embodiment. Similarly to the seventeenth embodiment, this embodiment includes switches 35a, 35b; 33a, 33b; and 34a, 34b, etc. as the connection means 30.

Since the operation of the A-D converter of the twenty second embodiment based on the above-described configuration is the same as the operation of the seventeenth embodiment shown in FIG. 36 except that current is replaced by voltage, the repetitive explanation is omitted.

What is claimed is:

1. An integrating type D-A/A-D converter including reference value generation means for generating at least one reference value relating to voltage or current, control means for carrying out, every predetermined time, switching between a digital or analog input delivered from the external and the reference value generated by said reference value generation means to connect a switched one to thereby control an integral time, and integration means for integrating an analog value corresponding to the digital or analog input and the reference value switched in sequence every predetermined time and delivered through said control means, thus to output an integral value for obtaining a digital output or an analog output, said control means at least including:

connection means for arbitrarily carrying out switching between the at least one reference value delivered from said reference value generation means and an analog value corresponding to the digital input or the analog input to deliver a switched one to said integration means;

a plurality of clock supply means for respectively generating and outputting a plurality of clock signals having periods per unit time which are different from each other and are such that the time length relationship therebetween is indicated by an arbitrary integer ratio; and time control means for controlling respective times of said connection means so that an integral value of said integration means, having said analog value corresponding to said digital input or said analog input and said reference value as an input, becomes equal to a value varying with a minimum value being as a unit, in dependency upon times corresponding to the periods of said plurality of clock signals delivered from said clock supply means.

2. The D-A/A-D converter as set forth in claim 1,
a D-A converter including: said reference value generation means for generating said reference value, said connection means, control means including said plurality of clock supply means and said time control means, and said integration means for outputting an analog voltage for an integration time period controlled by said time control means in dependency upon said plurality of reference clocks delivered from said clock supply means and a digital input delivered from the external,
said time control means provided in said control means having a configuration to generate a timing signal for setting a plurality of interation time periods respectively having different time lengths by using respective period differences of said plurality of reference clocks to carry out, by said timing signal, ON/OFF control of said connection means inserted between said reference value generation means and said integration means, whereby said integration means carries out predetermined integrating operations for said respective plurality of integration time periods.

3. The D-A converter as set forth in claim 2, wherein said reference value generation means is comprised of reference current generation means for delivering a reference current to be integrated to said integration means through said connection means controlled by said timing signal outputted from said time control means on the basis of said plurality of reference clocks having different periods.

4. The D-A converter as set forth in claim 3, wherein a reference current that said reference current generation means generates has both positive and negative directions, said connection means being operative to switch the direction of said reference current every said plural integration time periods by said timing signal outputted from said time control means on the basis of combination of said plurality of reference clocks.

5. The D-A converter as set forth in claim 4, wherein said reference current generation means includes a plurality of reference current sources for generating the reference current in the positive direction and the reference current in the negative direction, respectively.

6. The D-A converter as set forth in claim 4, wherein said reference current generation means is comprised of a single current source for generating any one of said reference current in the positive direction and said reference current in the negative direction, said connection means including a plurality of switches for switching said plurality of integration time periods and for switching the direction of said reference current.

7. The D-A converter as set forth in claim 3, wherein a reference current that said reference current generation means generates has only any one of a positive direction and a negative direction, said integration means being operative to output an integral voltage only in the positive direction, said connection means being operative to switch only said plurality of integration time periods in the integral voltage only in the positive direction.

8. The D-A converter as set forth in claim 2. wherein said reference value generation means is comprised of reference voltage generation means for delivering a reference voltage to be integrated to said integration means through said connection means controlled by said timing signal outputted from said time control means on the basis of said plurality of reference clocks having different periods.

9. The D-A converter as set forth in claim 8, wherein a reference voltage that said reference voltage generation means generates has both positive and negative directions, said connection means being operative to switch the direction of said reference voltage every said plurality of integration time periods by said timing signal outputted from said time control means on the basis of combination of said plurality of reference clocks.

10. The D-A converter as set forth in claim 9, wherein said reference voltage generation means includes a plurality of reference voltage sources for generating the reference voltage in the positive direction and the reference voltage in the negative direction, respectively.

11. The D-A converter as set forth in claim 9, wherein said reference voltage generation means is comprised of a single voltage source for generating any one of the reference voltage in the positive direction and the reference voltage in the negative direction, said connection means including a plurality of switches for switching said plurality of integration time periods and for switching the direction of said reference current.

12. The D-A converter as set forth in claim 8, wherein a reference voltage that said reference voltage generation means generates has only any one of a positive direction and a negative direction, said integration means being operative to output an integral voltage only in the positive direction, said connection means being operative to switch only said plurality of integration time periods in the integral voltage only in the positive direction.

13. The D-A/A-D converter as set forth in claim 1,
an A-D converter including said reference value generation means for generating said reference value, said connection means, control means including said plurality of clock supply means and said time control means, said integration means for outputting an analog voltage for an integration time period controlled by said time control means on the basis of said plurality of reference clocks delivered from said clock supply means and an analog input delivered to said connection means, comparison means for comparing the integrated analog voltage with a comparison potential, and calculation means for allowing a comparison output delivered from said comparison means to be synchronous with said reference clock to count edges of that clock to thereby provide a digital output,
said time control means provided in said control means having a configuration to generate a timing signal for setting a plurality of integration time periods respectively having different time lengths by using respective period differences of said plurality of reference clocks to carry out, by using said timing signal, ON/OFF control of said connection means inserted between said reference value generation means and said analog input and said integration means, whereby said integration means is permitted to carry out predetermined integrating operations for said respective plurality of integration time periods.

14. The A-D converter as set forth in claim 13, wherein said reference value generation means is comprised of reference current generation means for delivering a reference current to be integrated to said integration means through said connection means controlled by said timing signal outputted from said time control means on the basis of said plurality of reference clocks having different periods.

15. The A-D converter as set forth in claim 14, wherein a reference current that said reference current generation means generates has both positive and negative directions, said connection means being operative to switch the direction of said reference current every said plurality of integration time periods by said timing signal outputted from said time control means on the basis of combination of said plurality of reference clocks.

16. The A-D converter as set forth in claim 14, wherein a reference current that said reference current generation means generates has only any one of positive and negative directions, said integration means being operative to output an integral voltage only in the positive direction, said connection means being operative to switch only said plurality of integration time periods in the integral voltage only in the positive direction.

17. The A-D converter as set forth in claim 13, wherein said reference value generation means is comprised of reference voltage generation means for delivering a reference voltage to be integrated to said integration means through said connection means controlled by said timing signal outputted from said time control means on the basis of said plurality of reference clocks having different periods.

18. The A-D converter as set forth in claim 17, wherein a reference voltage that said reference voltage generation means generates has both positive and negative directions, said connection means being operative to switch the direction of said reference voltage every said plurality of integration time periods by said timing signal outputted from said time control means on the basis of combination of said plurality of reference clocks.

19. The A-D converter as set forth in claim 17, wherein a reference voltage that said reference voltage generation means generates has only any one of positive and negative directions, said integration means being operative to output an integral voltage only in the positive direction, said connection means being operative to switch only said plurality of integral time periods in the integral voltage only in the positive direction.

20. The D-A/A-D converter as set forth in claim 1, wherein said integration means includes a full differential type operational amplifier adapted to receive, as plus and minus differential inputs, the reference value and an analog value corresponding to the digital or analog input switched and delivered by said connection means to perform an integral operation to output them as two differential outputs.

* * * * *